US012628546B2

(12) United States Patent
Kim et al.

(10) Patent No.: US 12,628,546 B2
(45) **Date of Patent: *May 12, 2026**

(54) POLYMER AND ORGANIC LIGHT-EMITTING DIODE USING SAME

(71) Applicant: LG Chem, Ltd., Seoul (KR)

(72) Inventors: Ji Hoon Kim, Daejeon (KR); Jaesoon Bae, Daejeon (KR); Jaechol Lee, Daejeon (KR); Juhwan Kim, Daejeon (KR); Dongyoon Khim, Daejeon (KR); Min Suk Jung, Daejeon (KR)

(73) Assignee: LG Chem, Ltd., Seoul (KR)

( * ) Notice: Subject to any disclaimer, the term of this patent is extended or adjusted under 35 U.S.C. 154(b) by 972 days.

This patent is subject to a terminal disclaimer.

(21) Appl. No.: 17/788,978

(22) PCT Filed: Jan. 12, 2021

(86) PCT No.: PCT/KR2021/000378

§ 371 (c)(1),
(2) Date: Jun. 24, 2022

(87) PCT Pub. No.: WO2021/145639

PCT Pub. Date: Jul. 22, 2021

(65) Prior Publication Data

US 2023/0087796 A1 Mar. 23, 2023

(30) Foreign Application Priority Data

Jan. 13, 2020 (KR) ........................ 10-2020-0003988

(51) Int. Cl.
*H01L 51/00* (2006.01)
*C08G 61/12* (2006.01)
(Continued)

(52) U.S. Cl.
CPC ............ *H10K 85/111* (2023.02); *C08G 61/12* (2013.01); *C09K 11/06* (2013.01); *H10K 85/151* (2023.02);
(Continued)

(58) Field of Classification Search
None
See application file for complete search history.

(56) References Cited

U.S. PATENT DOCUMENTS 5,814,244 A 9/1998 Kreuder et al.
7,351,358 B2 4/2008 Hsu et al.
(Continued)

FOREIGN PATENT DOCUMENTS

CN 108884042 A 11/2018
CN 110121493 A 8/2019
(Continued)

OTHER PUBLICATIONS

Supplementary European Search Report from EESR for Application No. 21741799 dated Dec. 14, 2022. 3 pgs.
(Continued)

*Primary Examiner* — Tae H Yoon
(74) *Attorney, Agent, or Firm* — Lerner David LLP

(57) ABSTRACT

The present specification relates to a polymer and an organic light emitting device using the same, wherein the polymer is represented by the following Chemical Formula 1:

$$E1\text{-}[A]_a\text{—}[B]_b\text{—}[C]_c\text{-}E2 \quad \text{[Chemical Formula 1]}$$

Wherein A, B, C, E1, E2, a, b and c are described herein.

15 Claims, 3 Drawing Sheets

(51) Int. Cl.

| | |
|---|---|
| ***C09K 11/06*** | (2006.01) |
| ***H10K 85/10*** | (2023.01) |
| *H10K 50/115* | (2023.01) |
| *H10K 50/15* | (2023.01) |
| *H10K 50/17* | (2023.01) |

(52) U.S. Cl.

CPC .................. *C08G 2261/124* (2013.01); *C08G 2261/1412* (2013.01); *C08G 2261/146* (2013.01); *C08G 2261/148* (2013.01); *C08G 2261/18* (2013.01); *C08G 2261/228* (2013.01); *C08G 2261/312* (2013.01); *C08G 2261/316* (2013.01); *C08G 2261/3162* (2013.01); *C08G 2261/95* (2013.01); *C09K 2211/1416* (2013.01); *C09K 2211/1425* (2013.01); *C09K 2211/1433* (2013.01); *H10K 50/115* (2023.02); *H10K 50/15* (2023.02); *H10K 50/17* (2023.02)

(56) References Cited

U.S. PATENT DOCUMENTS

| | | | | |
|---|---|---|---|---|
| 8,465,848 | B2 | 6/2013 | Smith | |
| 10,749,111 | B2 * | 8/2020 | Radu ...................... | C08G 61/12 |
| 2003/0068527 | A1 | 4/2003 | Noguchi et al. | |
| 2004/0067387 | A1 | 4/2004 | Kim et al. | |
| 2008/0014464 | A1 | 1/2008 | Kawamura et al. | |
| 2015/0011795 | A1 | 1/2015 | Zoellner et al. | |
| 2016/0329497 | A1 | 11/2016 | Radu et al. | |
| 2018/0076394 | A1 | 3/2018 | Kawakami et al. | |
| 2019/0027689 | A1 | 1/2019 | Funyuu et al. | |
| 2019/0127327 | A1 | 5/2019 | Bae et al. | |
| 2019/0214566 | A1 * | 7/2019 | Takahiro ................ | C09K 11/02 |
| 2019/0338140 | A1 | 11/2019 | Shin et al. | |
| 2020/0239610 | A1 | 7/2020 | Seo et al. | |
| 2020/0280001 | A1 | 9/2020 | Kang et al. | |

FOREIGN PATENT DOCUMENTS

| | | | |
|---|---|---|---|
| CN | 110520407 | A | 11/2019 |
| CN | 111164116 | A | 5/2020 |
| CN | 111225930 | A | 6/2020 |
| EP | 3680260 | A1 | 7/2020 |
| EP | 3680261 | A1 | 7/2020 |
| KR | 19990044367 | A | 6/1999 |
| KR | 20040028954 | A | 4/2004 |
| KR | 100924239 | B1 | 10/2009 |
| KR | 20140136503 | A | 11/2014 |
| KR | 20160131947 | A | 11/2016 |
| KR | 20180090363 | A | 8/2018 |
| WO | 2010068205 | A1 | 6/2010 |
| WO | 2011028216 | A1 | 3/2011 |
| WO | 2019168365 | A1 | 9/2019 |
| WO | 2019168366 | A1 | 9/2019 |

OTHER PUBLICATIONS

Search report from International Application No. PCT/KR2021/000378, mailed Apr. 20, 2021.

* cited by examiner

[FIG. 1]
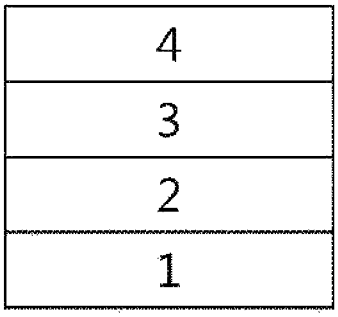
[FIG. 2]
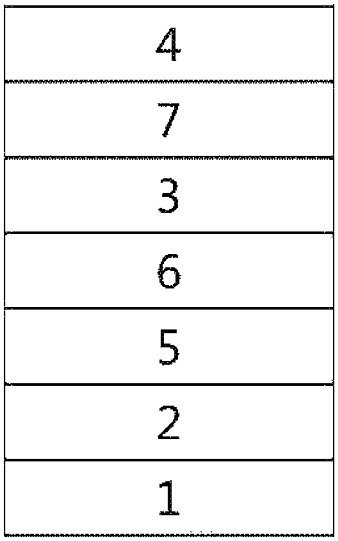
[FIG. 3]
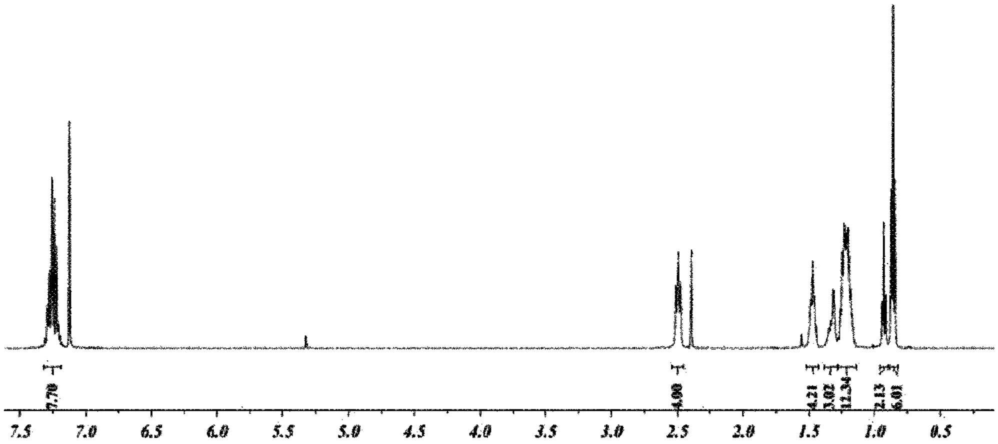

[FIG. 4]
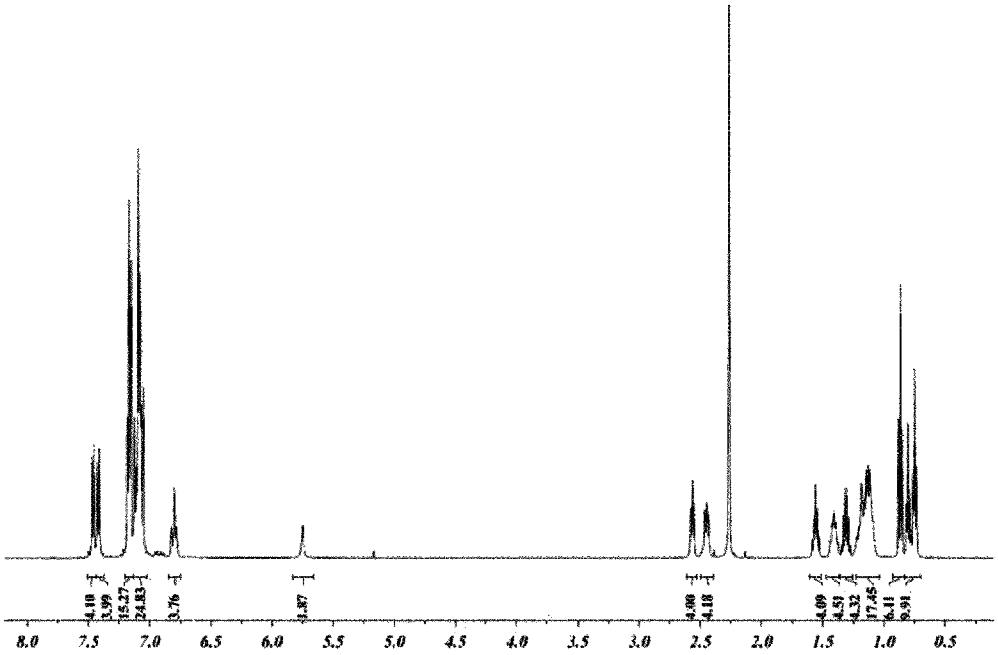
[FIG. 5]
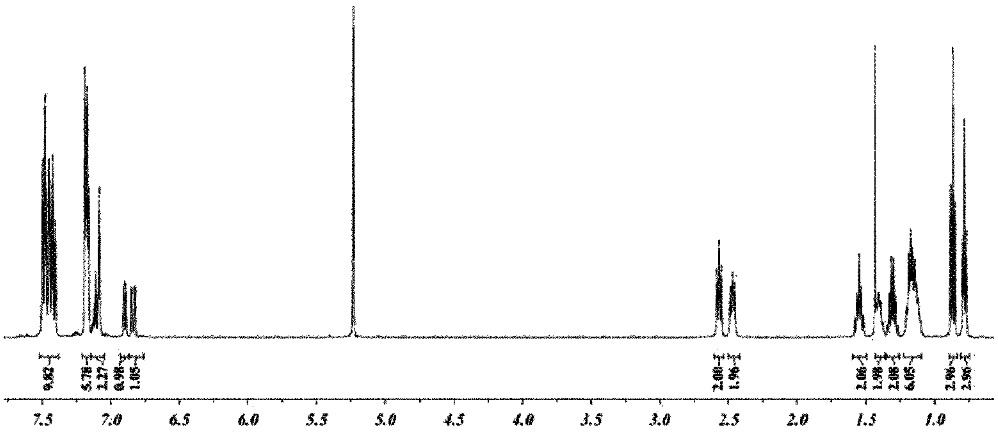

[FIG. 6]
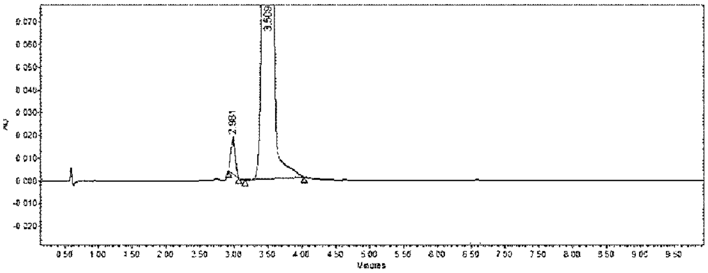
| Retention Time | Area (μV*sec) | %Area | Height (μV) |
|---|---|---|---|
| 2.981 | 68685 | 0.91 | 14874 |
| 3.509 | 7473812 | 99.09 | 1214155 |
[FIG. 7]
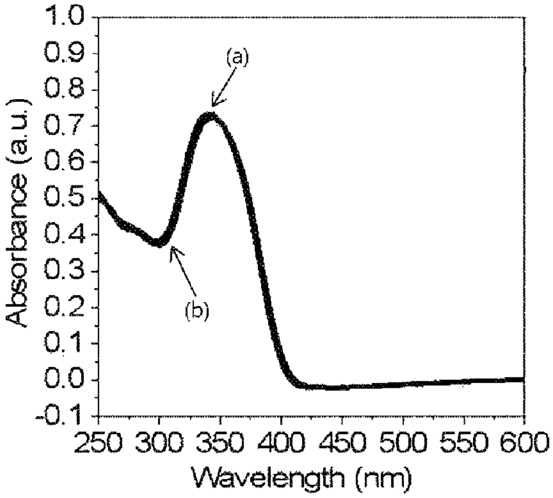
[FIG. 8]
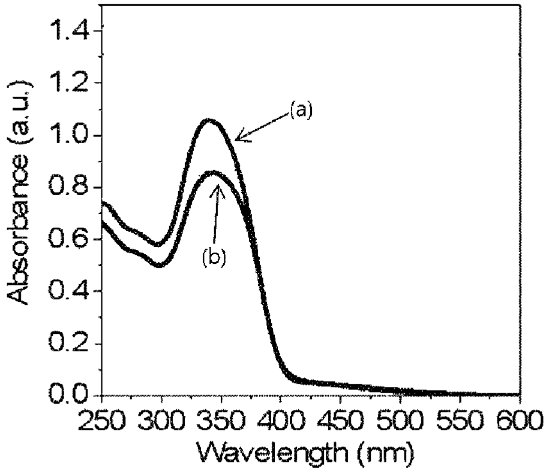

POLYMER AND ORGANIC LIGHT-EMITTING DIODE USING SAME

CROSS-REFERENCE TO RELATED APPLICATION(S)

The present application is a national stage entry under 35 U.S.C. § 371 of International Application No. PCT/KR2021/000378 filed on Jan. 12, 2021, which claims priority from Korean Patent Application No. 10-2020-0003988 filed on Jan. 13, 2020, all the disclosures of which are incorporated herein by reference.

TECHNICAL FIELD

The present specification relates to a polymer and an organic light emitting device formed by using the same.

BACKGROUND ART

An organic light emission phenomenon is one of the examples in which an electric current is converted into visible rays through an internal process of a specific organic molecule. The principle of the organic light emission phenomenon is as follows. When an organic material layer is disposed between a positive electrode and a negative electrode, if current is applied between the two electrodes, electrons and holes are injected from the negative electrode and the positive electrode, respectively, into the organic material layer. The electrons and the holes which are injected into the organic material layer are recombined to form an exciton, and the exciton falls down again to the ground state to emit light. An organic electroluminescent device using this principle may be generally composed of a negative electrode, a positive electrode, and an organic material layer disposed therebetween, for example, an organic material layer including a hole injection layer, a hole transport layer, a light emitting layer, an electron transport layer, and an electron injection layer.

A material used in the organic light emitting device is mostly a pure organic material or a complex compound where an organic material and metal form a complex, and may be classified into a hole injection material, a hole transport material, a light emitting material, an electron transport material, an electron injection material, and the like according to the use thereof. Herein, an organic material having a p-type property, that is, an organic material, which is easily oxidized and has an electrochemically stable state during oxidation, is usually used as the hole injection material or the hole transport material. Meanwhile, an organic material having a n-type property, that is, an organic material, which is easily reduced and has an electrochemically stable state during reduction, is usually used as the electron injection material or the electron transport material. As the light emitting material, a material having both p-type and n-type properties, that is, a material having a stable form in both oxidation and reduction states is preferred, and a material having high light emitting efficiency for converting an exciton into light when the exciton is formed is preferred.

In addition to those mentioned above, it is preferred that the material used in the organic light emitting device additionally has the following properties.

First, it is preferred that the material used in the organic light emitting device has excellent thermal stability. This is because joule heating occurs due to the movement of electric charges in the organic light emitting device. Currently, since N,N'-di(1-naphthyl)-N,N'-diphenyl-(1,1'-biphenyl)-4,4'-diamine (NPB) typically used as a hole transport material has a glass transition temperature value of 100° C. or less, there is a problem in that it is difficult to use the material in an organic light emitting device requiring a high electric current.

Second, in order to obtain a high-efficiency organic light emitting device which is capable of being driven at low voltage, holes or electrons injected into the organic light emitting device need to be smoothly transferred to a light emitting layer, and simultaneously, the injected holes and electrons need to be prevented from being released out of the light emitting layer. For this purpose, a material used in the organic light emitting device needs to have an appropriate band gap and an appropriate highest occupied molecular orbital (HOMO) or lowest unoccupied molecular orbital (LUMO) energy level. Since poly(3,4-ethylenedioxythiophene) doped:poly(styrenesulfonic acid) (PEDOT:PSS) currently used as a hole transport material in an organic light emitting device to be manufactured by a solution application method has a lower LUMO energy level than the LUMO energy level of an organic material used as a light emitting layer material, it is difficult to manufacture an organic light emitting device having high efficiency and a long service life.

In addition, the material used in the organic light emitting device needs to have excellent chemical stability, excellent charge mobility, excellent interface characteristics with electrodes or adjacent layers, and the like. That is, the material used in the organic light emitting device needs to be minimally deformed by moisture or oxygen. Further, the material used in the organic light emitting device needs to have appropriate hole or electron mobility so as to make a balance between densities of holes and electrons in a light emitting layer of the organic light emitting device, thereby maximally forming excitons. Moreover, the material used in the organic light emitting device needs to improve the interface with an electrode including a metal or a metal oxide for the stability of the device.

In addition to those mentioned above, a material used in an organic light emitting device for a solution process needs to additionally have the following properties.

First, the material used in the organic light emitting device needs to form a storable homogenous solution. Since a commercialized material for a deposition process has good crystallinity so that the material is not dissolved well in a solution or the crystals thereof are easily formed even though the material forms a solution, it is highly likely that according to the storage period, the concentration gradient of the solution varies or a defective device is formed.

Second, layers where the solution process is performed need to have solvent and material resistance to other layers. For this purpose, a material capable of forming a polymer self-cross-linked on a substrate through a heat treatment or ultraviolet (UV) irradiation after a curing group is introduced and a solution is applied, like N4,N4'-di(naphthalen-1-yl)-N4,N4'-bis(4-vinylphenyl)biphenyl-4,4'-diamine (VNPB), or capable of forming a polymer having sufficient resistance in the next process is preferred, and a material capable of having solvent resistance itself, like hexaazatriphenylenehexacarbonitrile (HATCN), is also preferred.

Therefore, there is a need for developing an organic material having the aforementioned requirements in the art.

DETAILED DESCRIPTION OF THE INVENTION

Technical Problem

The present specification has been made in an effort to provide a polymer and an organic light emitting device formed by using the same.

Technical Solution

An exemplary embodiment of the present specification provides a polymer represented by the following Chemical Formula 1.

$$E1\text{-}[A]_a\text{—}[B]_b\text{—}[C]_c\text{-}E2$$ [Chemical Formula 1]

In Chemical Formula 1,

A is represented by the following Chemical Formula 2,

B is represented by the following Chemical Formula 3,

C is a substituted or unsubstituted arylene group; or a substituted or unsubstituted divalent heterocyclic group, E1 and E2 are the same as or different from each other, and are each independently hydrogen; deuterium; a substituted or unsubstituted alkyl group; a substituted or unsubstituted silyl group; a substituted or unsubstituted aryl group; a substituted or unsubstituted arylamine group; a substituted or unsubstituted siloxane group; a cross-linkable group; or a combination thereof, a, b, and c are each a mole fraction, a is a real number of $0<a\leq 1$, b is a real number of $0\leq b<1$, c is a real number of $0\leq c<1$, $a+b+c=1$,

[Chemical Formula 2]

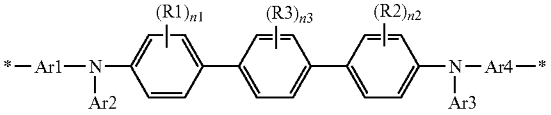

In Chemical Formula 2,

Ar2 and Ar3 are the same as or different from each other, and are each independently a substituted or unsubstituted aryl group, Ar1 and Ar4 are the same as or different from each other, and are each independently a substituted or unsubstituted arylene group, R1 and R2 are the same as or different from each other, and are each independently a halogen group, R3 is hydrogen; deuterium; a substituted or unsubstituted alkyl group; a substituted or unsubstituted silyl group; a substituted or unsubstituted aryl group; a substituted or unsubstituted arylamine group; or a substituted or unsubstituted siloxane group, n1 to n3 are each an integer from 1 to 4, when n1 to n3 are each 2 or higher, each occurrence of R1, R2 and R3 is the same as or different from each other, respectively

* is an attachment point in the polymer,

[Chemical Formula 3]

$$Z\text{+}Y\text{—}*]_m$$

In Chemical Formula 3, m is an integer of 3 or 4, when m is 3, Z is CRa; SiRa; N; or a substituted or unsubstituted trivalent aryl group, when m is 4, Z is C; Si; or a substituted or unsubstituted tetravalent aryl group, Ra is hydrogen; a substituted or unsubstituted alkyl group; or a substituted or unsubstituted aryl group, Y is a direct bond; a substituted or unsubstituted alkylene group; or a substituted or unsubstituted arylene group, when Y is a direct bond; or a substituted or unsubstituted alkylene group, Z is a substituted or unsubstituted trivalent or tetravalent aryl group, and

* is an attachment point in the polymer.

Another exemplary embodiment of the present specification provides a polymer including a unit represented by the following Chemical Formula 2 and an end group represented by the following Chemical Formula 5.

[Chemical Formula 2]

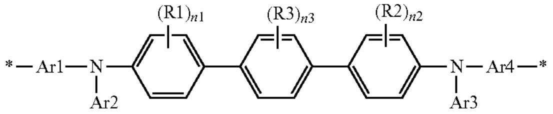

[Chemical Formula 5]

*—[E]

In Chemical Formulae 2 and 5,

Ar2 and Ar3 are the same as or different from each other, and are each independently a substituted or unsubstituted aryl group, Ar1 and Ar4 are the same as or different from each other, and are each independently a substituted or unsubstituted arylene group, R1 and R2 are the same as or different from each other, and are each independently a halogen group, R3 is hydrogen; deuterium; a substituted or unsubstituted alkyl group; a substituted or unsubstituted silyl group; a substituted or unsubstituted aryl group; a substituted or unsubstituted arylamine group; or a substituted or unsubstituted siloxane group, n1 to n3 are each an integer from 1 to 4, when n1 to n3 are each 2 or higher, each occurrence of R1, R2 and R3 is the same as or different from each other, respectively E is hydrogen; deuterium; a substituted or unsubstituted alkyl group; a substituted or unsubstituted silyl group; a substituted or unsubstituted aryl group; a substituted or unsubstituted arylamine group; a substituted or unsubstituted siloxane group; a cross-linkable group; or a combination thereof, and

* is an attachment point in the polymer.

Another exemplary embodiment of the present specification provides an organic light emitting device including: a first electrode;

a second electrode provided to face the first electrode; and an organic material layer having one or more layers, which includes a light emitting layer provided between the first electrode and the second electrode, in which one or more layers of the organic material layer include the polymer.

Advantageous Effects

In the polymer according to an exemplary embodiment of the present specification, Chemical Formula 2 includes a halogen group. Accordingly, the polymer exhibits low HOMO energy levels and relatively large dipole moments, and thus facilitates the transport of holes.

Further, the polymer according to an exemplary embodiment of the present specification can be applied to a hole transport layer of an organic light emitting device, and thus can improve the performance and life characteristics of the device.

BRIEF DESCRIPTION OF DRAWINGS

FIGS. 1 to 2 are views exemplifying the structure of an organic light emitting device according to an exemplary embodiment of the present specification.

FIG. 3 is a view illustrating NMR measurement results of Compound a-1.

FIG. 4 is a view illustrating NMR measurement results of Compound a-2.

FIG. 5 is a view illustrating NMR measurement results of Monomer A.

FIG. 6 is a view illustrating HPLC measurement results of Monomer A.

FIG. 7 is a view illustrating the film retention experimental results of a thin film formed of Coating Composition 1 prepared in Experimental Example 1.

FIG. 8 is a view illustrating the film retention experimental results of a thin film formed of Coating Composition 2 prepared in Experimental Example 1.

1: Substrate

2: Positive electrode

3: Light emitting layer

4: Negative electrode

5: Hole injection layer

6: Hole transport layer

7: Electron injection and transport layer

BEST MODE

Hereinafter, the present specification will be described in more detail.

The present specification provides a polymer represented by the following Chemical Formula 1.

$$E1\text{-}[A]_a\text{—}[B]_b\text{—}[C]_c\text{-}E2$$ [Chemical Formula 1]

In Chemical Formula 1,

A is represented by the following Chemical Formula 2,

B is represented by the following Chemical Formula 3,

C is a substituted or unsubstituted arylene group; or a substituted or unsubstituted divalent heterocyclic group, E1 and E2 are the same as or different from each other, and are each independently hydrogen; deuterium; a substituted or unsubstituted alkyl group; a substituted or unsubstituted silyl group; a substituted or unsubstituted aryl group; a substituted or unsubstituted arylamine group; a substituted or unsubstituted siloxane group; a cross-linkable group; or a combination thereof, a, b, and c are each a mole fraction, a is a real number of $0<a\leq1$, b is a real number of $0\leq b<1$, c is a real number of $0\leq c<1$, $a+b+c=1$,

[Chemical Formula 2]

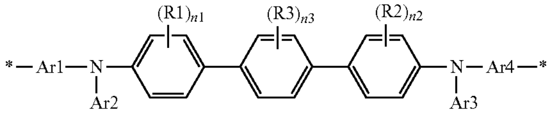

In Chemical Formula 2,

Ar2 and Ar3 are the same as or different from each other, and are each independently a substituted or unsubstituted aryl group, Ar1 and Ar4 are the same as or different from each other, and are each independently a substituted or unsubstituted arylene group, R1 and R2 are the same as or different from each other, and are each independently a halogen group, R3 is hydrogen; deuterium; a substituted or unsubstituted alkyl group; a substituted or unsubstituted silyl group; a substituted or unsubstituted aryl group; a substituted or unsubstituted arylamine group; or a substituted or unsubstituted siloxane group, n1 to n3 are each an integer from 1 to 4, when n1 to n3 are each 2 or higher, each occurrence of R1, R2 and R3 is the same as or different from each other, respectively

* is an attachment point in the polymer,

[Chemical Formula 3]

$$Z\text{—}[Y\text{—}*]_m$$

In Chemical Formula 3, m is an integer of 3 or 4, when m is 3, Z is CRa; SiRa; N; or a substituted or unsubstituted trivalent aryl group, when m is 4, Z is C; Si; or a substituted or unsubstituted tetravalent aryl group, Ra is hydrogen; a substituted or unsubstituted alkyl group; or a substituted or unsubstituted aryl group, Y is a direct bond; a substituted or unsubstituted alkylene group; or a substituted or unsubstituted arylene group, when Y is a direct bond; or a substituted or unsubstituted alkylene group, Z is a substituted or unsubstituted trivalent or tetravalent aryl group, and

* is an attachment point in the polymer.

In the polymer, Chemical Formula 2 includes a halogen group (R1 and R2). Therefore, the polymer including Chemical Formula 2 exhibits low HOMO energy levels and relatively large dipole moments, and thus facilitates the transport of holes.

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent may be substituted, and when two or more are substituted, the two or more substituents may be the same as or different from each other.

In the present specification, the term "substituted or unsubstituted" means being substituted with one or two or more substituents selected from the group consisting of deuterium; a halogen group; an alkyl group; a cycloalkyl group; an alkoxy group; an aryloxy group; an amine group; an aryl group; and a heterocyclic group, being substituted with a substituent to which two or more substituents among the exemplified substituents are linked, or having no substituent. For example, "the substituent to which two or more substituents are linked" may be a biphenyl group. That is, the biphenyl group may also be an aryl group, and may be interpreted as a substituent to which two phenyl groups are linked.

Examples of the substituents will be described below, but are not limited thereto.

In the present specification, examples of a halogen group include fluorine (F), chlorine (Cl), bromine (Br) or iodine (I).

In the present specification, an alkyl group may be straight-chained or branched, and the number of carbon atoms thereof is not particularly limited, but is preferably 1 to 60. According to an exemplary embodiment, the number of carbon atoms of the alkyl group is 1 to 30. Specific examples of the alkyl group include a methyl group, an ethyl group, a propyl group, an isopropyl group, a butyl group, an isobutyl group, a tert-butyl group, a pentyl group, a hexyl group, a heptyl group, an octyl group, and the like, but are not limited thereto.

In the present specification, the number of carbon atoms of the cycloalkyl group is not particularly limited, but is preferably 3 to 60. According to an exemplary embodiment, the number of carbon atoms of the cycloalkyl group is 3 to 30. Specific examples of the cycloalkyl group include a cyclopropyl group, a cyclobutyl group, a cyclopentyl group, a cyclohexyl group, a cycloheptyl group, a cyclooctyl group, and the like, but are not limited thereto.

In the present specification, an alkoxy group may be straight-chained, branched, or cyclic. The number of carbon atoms of the alkoxy group is not particularly limited, but is preferably 1 to 30. Specific examples of the alkoxy group include methoxy, ethoxy, n-propoxy, isopropoxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, and the like, but are not limited thereto.

In the present specification, an amine group may be selected from the group consisting of $-NH_2$; an alkylamine group; an arylalkylamine group; an arylamine group; an arylheteroarylamine group; an alkylheteroarylamine group; and a heteroarylamine group, and is not limited thereto. The number of carbon atoms of the amine group is not particularly limited, but is preferably 1 to 60.

In the present specification, the number of carbon atoms of the aryl group is not particularly limited, but is preferably 6 to 60. According to an exemplary embodiment, the number of carbon atoms of the aryl group is 6 to 30. In an exemplary embodiment of the present specification, the aryl group may be a monocyclic aryl group or a polycyclic aryl group. Specific examples of the monocyclic aryl group include a phenyl group, a biphenyl group, a terphenyl group, and the like, but are not limited thereto. Examples of the polycyclic aryl group include a naphthyl group, an anthracenyl group, a phenanthrenyl group, a pyrenyl group, a perylenyl group, a triphenylene group, a chrysenyl group, a fluorenyl group, and the like, but are not limited thereto.

In the present specification, the aryl group in the arylamine group may be selected from the above-described examples of the aryl group.

In the present specification, an arylene group means a group having two bonding positions in an aryl group, that is, a divalent group. The above-described description on the aryl group may be applied to the arylene group, except that the arylene groups are each a divalent group.

In the present specification, a heterocyclic group includes one or more atoms other than carbon, that is, one or more heteroatoms, and specifically, the heteroatom may include one or more atoms selected from the group consisting of O, N, Se, S, and the like. The number of carbon atoms of the heterocyclic group is not particularly limited, but is preferably 2 to 30. In an exemplary embodiment of the present specification, the heterocyclic group may be monocyclic or polycyclic. Examples of the heterocyclic group include a thiophene group, a furan group, a pyrrole group, an imidazole group, a thiazole group, an oxazole group, an oxadiazole group, a pyridine group, a bipyridine group, a pyrimidine group, a triazine group, a triazole group, an acridine group, a pyridazine group, a pyrazine group, a quinoline group, a quinazoline group, a quinoxaline group, a phthalazine group, a pyridopyrimidine group, a pyridopyrazine group, a pyrazinopyrazine group, an isoquinoline group, an indole group, a carbazole group, a benzoxazole group, a benzimidazole group, a benzothiazole group, a benzocarbazole group, a benzothiophene group, a dibenzothiophene group, a benzofuran group, a phenanthridine group, a phenanthroline group, an isoxazole group, a thiadiazole group, a phenothiazine group, a dibenzofuran group, and the like, but are not limited thereto.

In the present specification, the divalent heterocycle may be monocyclic or polycyclic, and means that there are two bonding positions in the heterocyclic group. For example, examples of the divalent heterocyclc group may be a divalent thiophene group; a divalent carbazole group; a divalent dibenzofuran group; a divalent dibenzothiophene group, and the like, but are not limited thereto.

In the present specification, the aryloxy group is a group represented by $-OR_{200}$, and $R_{200}$ is an aryl group. The aryl group in the aryloxy group is the same as the above-described examples of the aryl group. Specific examples of the aryloxy group include a phenoxy group, benzyloxy, p-methylbenzyloxy, a p-tolyloxy group, an m-tolyloxy group, a 3,5-dimethyl-phenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, but are not limited thereto.

In the present specification, a silyl group is a group represented by $SiR_{201}R_{202}R_{203}$, and $R_{201}$, $R_{202}$, and $R_{203}$ are the same as or different from each other, and are each independently hydrogen; deuterium; a substituted or unsubstituted alkyl group; or a substituted or unsubstituted aryl group. Examples of the silyl group include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, and the like, but are not limited thereto.

In the present specification, a siloxane group is a group represented by $-Si(R_{204})_2OSi(R_{205})_3$, and $R_{204}$ and $R_{205}$ are the same as or different from each other, and are each independently hydrogen; deuterium; a substituted or unsubstituted alkyl group; or a substituted or unsubstituted aryl group.

In the present specification, a cross-linkable group may mean a reactive substituent which cross-links compounds by being exposed to heat, light, and/or radiation. A cross-linkage may be produced while radicals produced by decomposing carbon-carbon multiple bonds and cyclic structures by means of a heat treatment, light irradiation, and/or radiation irradiation are linked to each other.

In an exemplary embodiment of the present specification, the cross-linkable group is any one of the following structures.

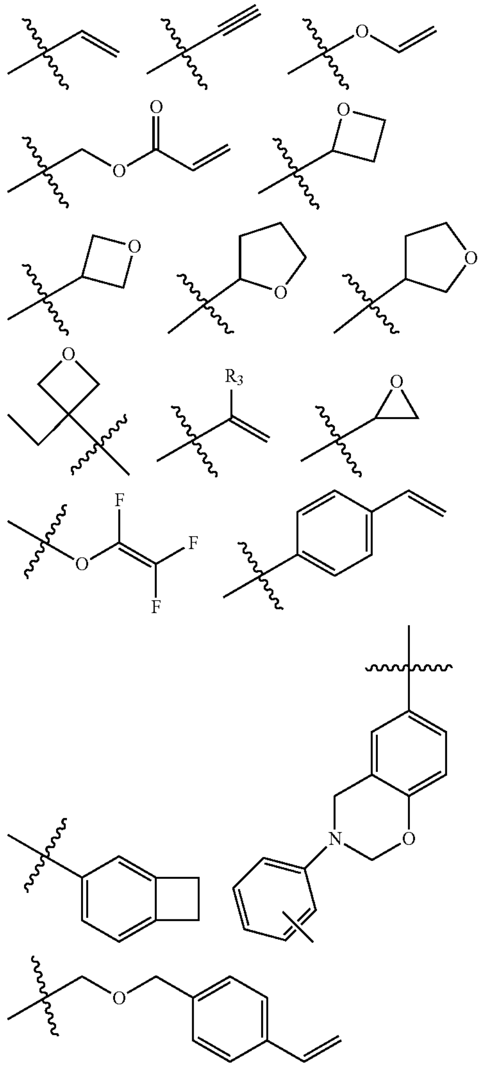

-continued

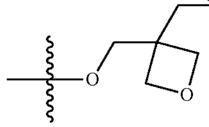

In the structure,

means a moiety bonded to another substituent or a bonding portion.

In the present specification, the "adjacent" group may mean a substituent substituted with an atom directly linked to an atom in which the corresponding substituent is substituted, a substituent disposed to be sterically closest to the corresponding substituent, or another substituent substituted with an atom in which the corresponding substituent is substituted. For example, two substituents substituted at the ortho position in a benzene ring and two substituents substituted with the same carbon in an aliphatic ring may be interpreted as groups which are "adjacent" to each other.

In the present specification, in a ring formed by bonding adjacent groups, the "ring" means a substituted or unsubstituted hydrocarbon ring; or a substituted or unsubstituted hetero ring.

In the present specification, the "mole fraction" means a ratio of the mole number of a given component to the total mole number of all the components.

In an exemplary embodiment of the present specification, Chemical Formula 2 is represented by the following Chemical Formula 2-1.

[Chemcial Formula 2-1]

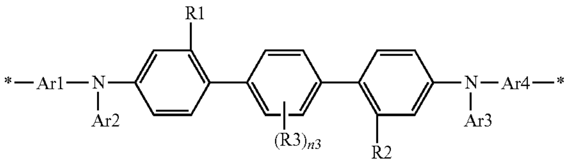

In Chemical Formula 2-1,

R1 to R3, Ar1 to Ar4, and n3 are the same as those defined in Chemical Formula 2, and

* is an attachment point in the polymer.

In an exemplary embodiment of the present specification, Chemical Formula 2 is represented by the following Chemical Formula 2-2.

[Chemical Formula 2-2]

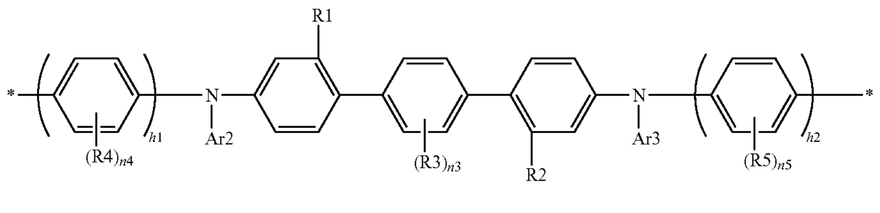

In Chemical Formula 2-2,

R1 to R3, Ar2, Ar3, and n3 are the same as those defined in Chemical Formula 2,

R4 and R5 are the same as or different from each other, and are each independently hydrogen; deuterium; a substituted or unsubstituted alkyl group; a substituted or unsubstituted silyl group; a substituted or unsubstituted aryl group; a substituted or unsubstituted arylamine group; a substituted or unsubstituted siloxane group; or a cross-linkable group, n4 and n5 are each an integer from 1 to 4, h1 and h2 are each an integer from 1 to 3, when n4 is 2 or higher, two or more R4's are the same as or different from each other, when n5 is 2 or higher, two or more R5's are the same as or different from each other, when h1 is 2 or higher, structures in the parenthesis are the same as or different from each other, when h2 is 2 or higher, structures in the parenthesis are the same as or different from each other, and

* is an attachment point in the polymer.

In an exemplary embodiment of the present specification, n3 is 2, and R3 is a hexyl group.

In an exemplary embodiment of the present specification, h1 and h2 are each 2.

In an exemplary embodiment of the present specification, R4 and R5 are each hydrogen.

In an exemplary embodiment of the present specification, Ar2 and Ar3 are the same as or different from each other, and are each independently a substituted or unsubstituted aryl group having 6 to 30 carbon atoms.

In an exemplary embodiment of the present specification, Ar2 and Ar3 are the same as or different from each other, and are each independently a substituted or unsubstituted biphenyl group.

In an exemplary embodiment of the present specification, Ar2 and Ar3 are the same as or different from each other, and are each independently a biphenyl group substituted with an alkyl group.

In an exemplary embodiment of the present specification, Ar2 and Ar3 are the same as or different from each other, and are each independently a biphenyl group substituted with an alkyl group having 1 to 10 carbon atoms.

In an exemplary embodiment of the present specification, Chemical Formula 2 has the following structure.

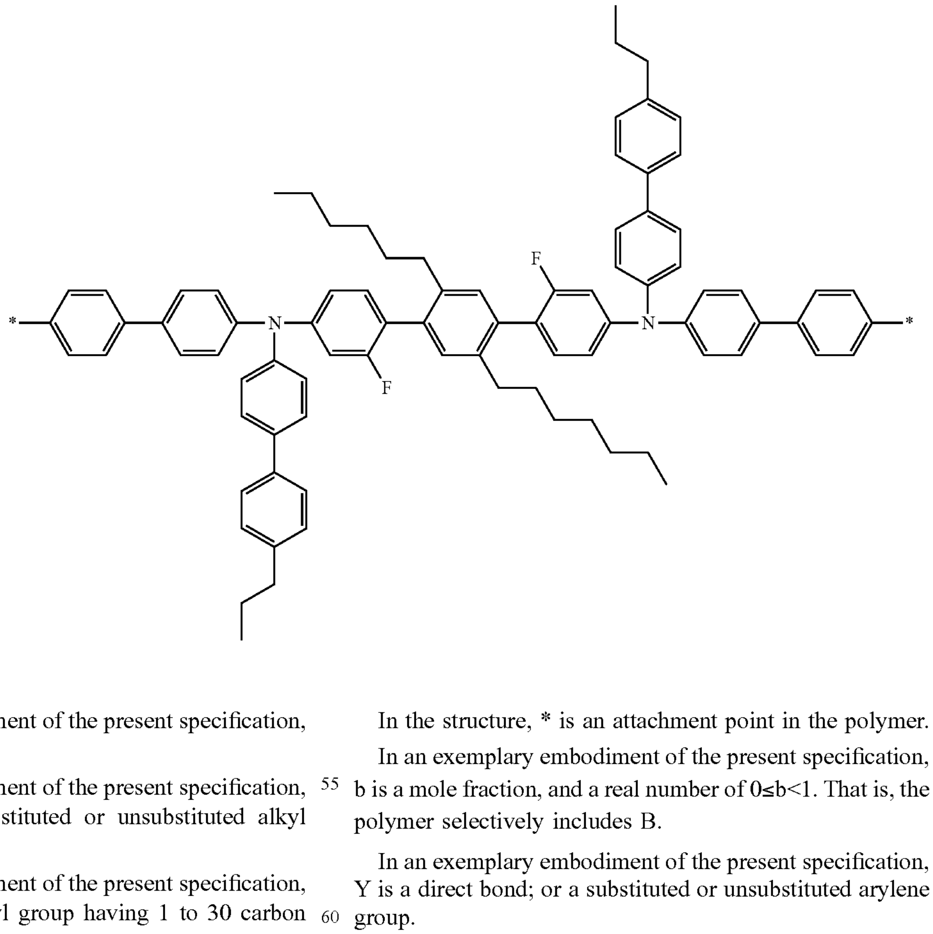

In an exemplary embodiment of the present specification, R1 and R2 are fluorine.

In an exemplary embodiment of the present specification, R3 is hydrogen; or a substituted or unsubstituted alkyl group.

In an exemplary embodiment of the present specification, R3 is hydrogen; or an alkyl group having 1 to 30 carbon atoms.

In an exemplary embodiment of the present specification, R3 is hydrogen; or an alkyl group having 1 to 10 carbon atoms.

In an exemplary embodiment of the present specification, R3 is hydrogen; or a hexyl group.

In the structure, * is an attachment point in the polymer.

In an exemplary embodiment of the present specification, b is a mole fraction, and a real number of 0≤b<1. That is, the polymer selectively includes B.

In an exemplary embodiment of the present specification, Y is a direct bond; or a substituted or unsubstituted arylene group.

In an exemplary embodiment of the present specification, Y is a direct bond; or a substituted or unsubstituted phenylene group.

In an exemplary embodiment of the present specification, Chemical Formula 3 is represented by any one of the following Chemical Formulae 3-1 to 3-4.

[Chemical Formula 3-1]

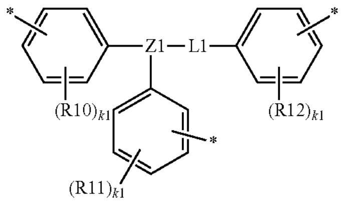

[Chemical Formula 3-2]

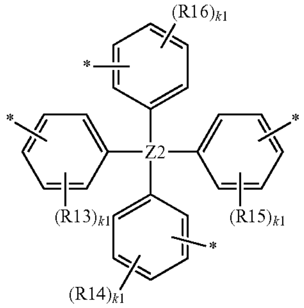

[Chemical Formula 3-3]

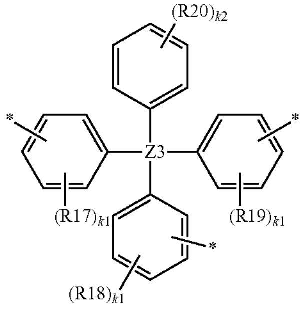

[Chemical Formula 3-4]

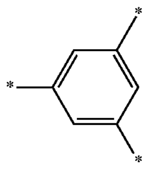

In Chemical Formulae 3-1 to 3-4,

Z1 is CRa; SiRa; N; or a substituted or unsubstituted trivalent aryl group,

Z2 and Z3 are the same as or different from each other, and are each independently C; Si; or a substituted or unsubstituted tetravalent aryl group, L1 is a direct bond; or a substituted or unsubstituted arylene group, Ra is hydrogen; a substituted or unsubstituted alkyl group; or a substituted or unsubstituted aryl group, R10 to R20 are the same as or different from each other, and are each independently hydrogen; deuterium; a halogen group; a cyano group; an alkoxy group; an aryloxy group; a fluoroalkoxy group; a siloxane group; a substituted or unsubstituted amine group; a substituted or unsubstituted alkyl group; a substituted or unsubstituted aryl group; a substituted or unsubstituted heterocyclic group; or cross-linkable group, and adjacent groups may be bonded to each other to form a ring, k1 is an integer from 1 to 4, k2 is an integer from 1 to 5, when k1 is 2 or higher, each occurrence of R10 to R19 is the same as or different from each other, respectively, when k2 is 2 or higher, each occurrence of R20 is the same as or different from each other, and

* is an attachment point in the polymer.

In an exemplary embodiment of the present specification, Chemical Formula 3 is represented by Chemical Formula 3-1.

In an exemplary embodiment of the present specification, Z1 is CH; SiH; N; or a substituted or unsubstituted trivalent aryl group.

In an exemplary embodiment of the present specification, Z1 is CH; SiH; N; or a substituted or unsubstituted trivalent phenyl group.

In an exemplary embodiment of the present specification, Z1 is N; or a trivalent phenyl group.

In an exemplary embodiment of the present specification, L1 is a direct bond; or a substituted or unsubstituted arylene group having 6 to 30 carbon atoms.

In an exemplary embodiment of the present specification, L1 is a direct bond; or an arylene group having 6 to 30 carbon atoms.

In an exemplary embodiment of the present specification, L1 is a direct bond; or a phenylene group.

In an exemplary embodiment of the present specification, L1 is a direct bond.

In an exemplary embodiment of the present specification, Chemical Formula 3 is represented by Chemical Formula 3-2.

In an exemplary embodiment of the present specification, Z2 is C; or Si.

In an exemplary embodiment of the present specification, B is represented by Chemical Formula 3-3.

In an exemplary embodiment of the present specification, Z3 is C; or Si.

In an exemplary embodiment of the present specification, Chemical Formula 3 is represented by Chemical Formula 3-4.

In an exemplary embodiment of the present specification, Chemical Formula 3 is represented by any one of the following structures.

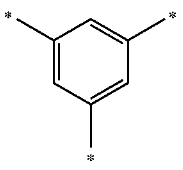

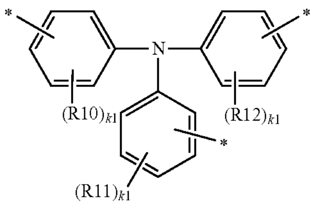

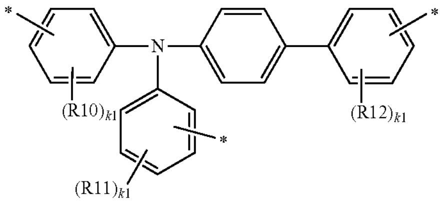

-continued

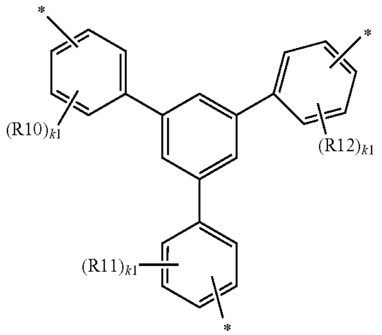

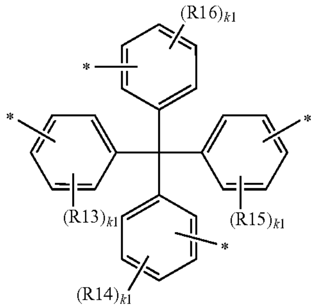

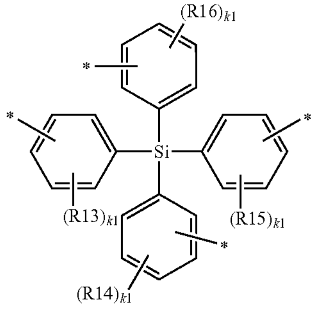

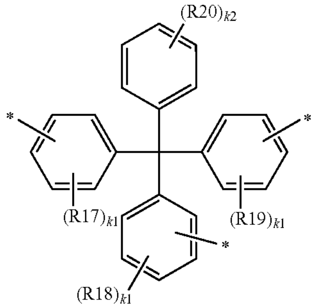

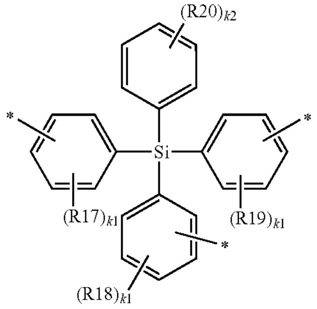

In the structures,

R10 to R20 are the same as or different from each other, and are each independently hydrogen; deuterium; a halogen group; a cyano group; an alkoxy group; an aryloxy group; a fluoroalkoxy group; a siloxane group; a substituted or unsubstituted amine group; a substituted or unsubstituted alkyl group; a substituted or unsubstituted aryl group; a substituted or unsubstituted heterocyclic group; or cross-linkable group, and adjacent groups may be bonded to each other to form a ring, k1 is an integer from 1 to 4, k2 is an integer from 1 to 5, when k1 is 2 or higher, each occurrence of R10 to R19 is the same as or different from each other, respectively, when k2 is 2 or higher, each occurrence of R20 is the same as or different from each other, and

* is an attachment point in the polymer.

In an exemplary embodiment of the present specification, R10 to R20 are each hydrogen.

Specifically, Chemical Formula 3 is represented by any one of the following structures.

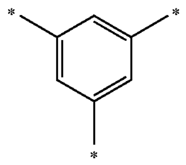

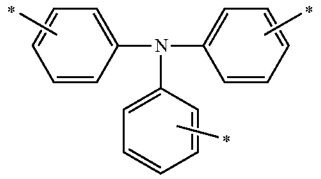

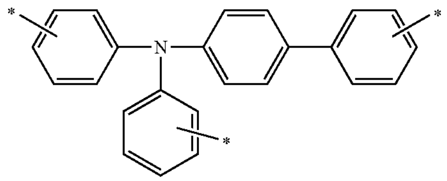

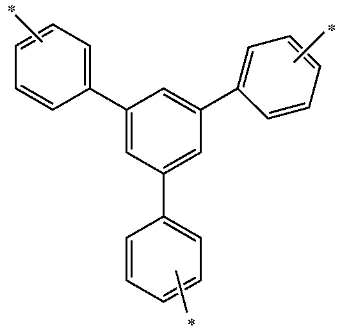

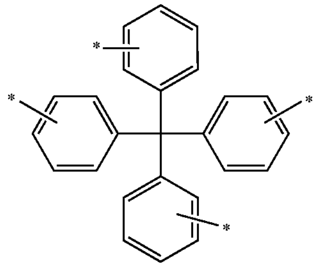

-continued
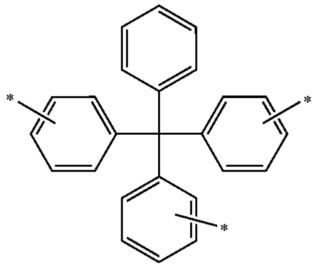
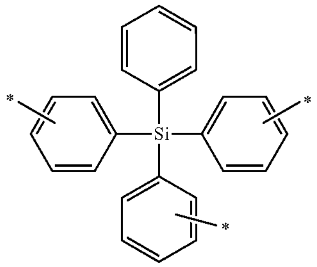
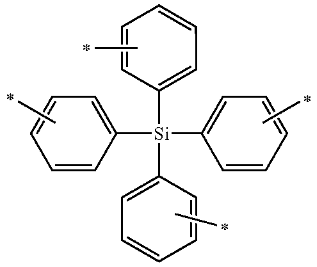
In the structure, * is an attachment point in the polymer.
More specifically, Chemical Formula 3 is represented by any one of the following structures.
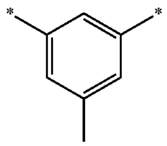
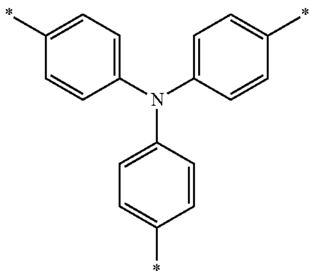
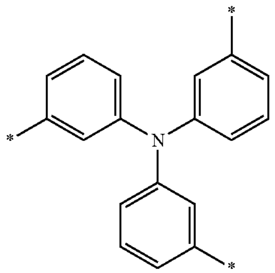
-continued
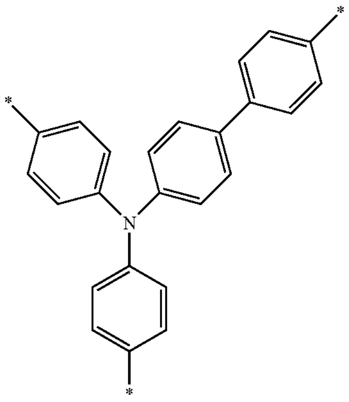
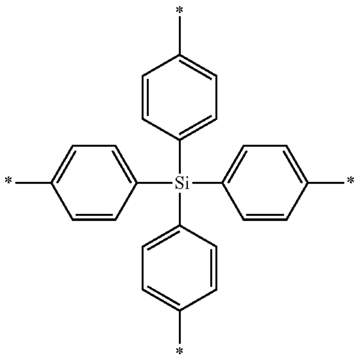
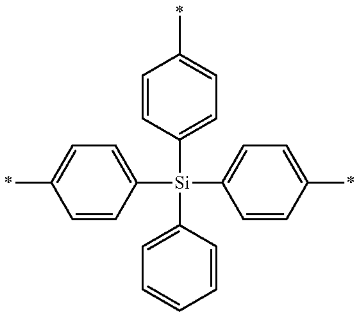
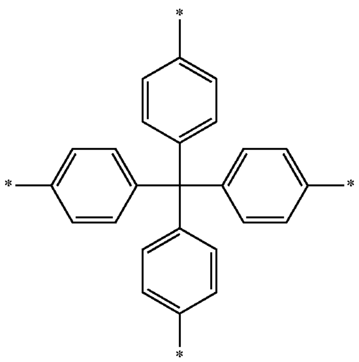

-continued

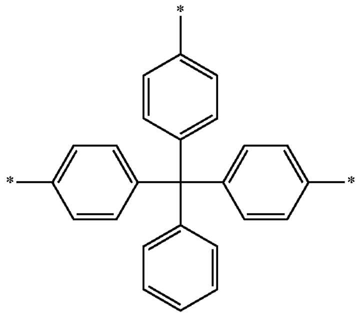

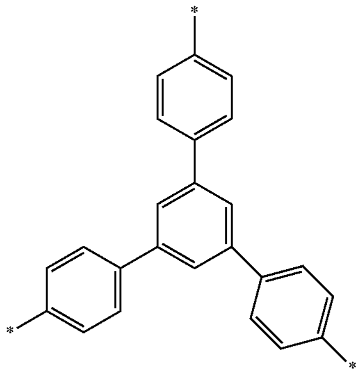

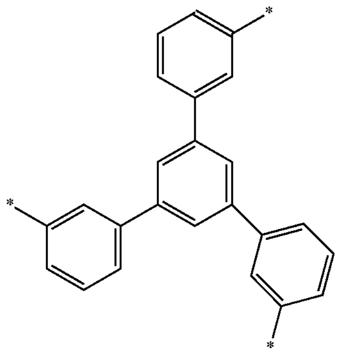

In the structure, * is an attachment point in the polymer.

More specifically, Chemical Formula 3 is represented by any one of the following structures.

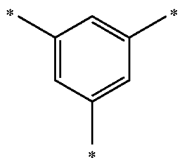

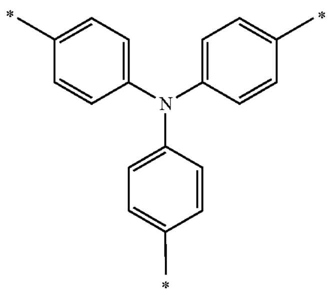

-continued

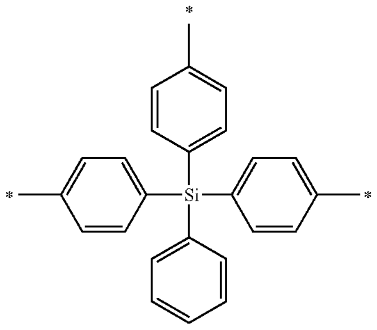

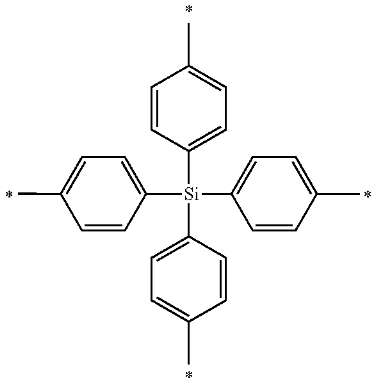

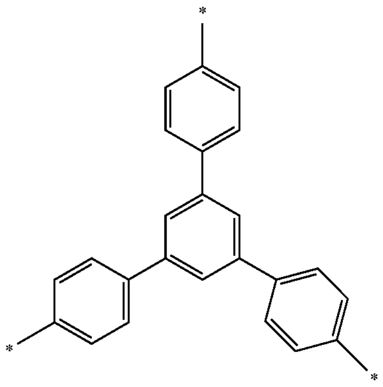

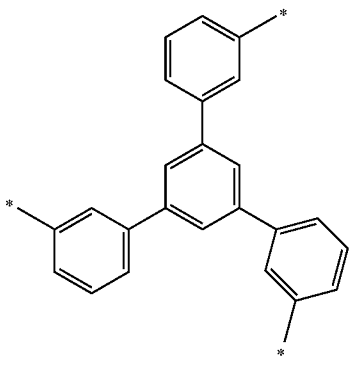

In the structure, * is an attachment point in the polymer.

In an exemplary embodiment of the present specification, c is a mole fraction, and a real number of 0≤c<1. That is, the polymer selectively includes C.

In an exemplary embodiment of the present specification, C is a unit having two attachment points.

In an exemplary embodiment of the present specification, C is a substituted or unsubstituted arylene group; or a substituted or unsubstituted divalent heterocyclic group.

In an exemplary embodiment of the present specification, C is a arylene group which is unsubstituted or substituted with deuterium or a cross-linkable group; or a divalent heterocyclic group which is unsubstituted or substituted with deuterium or a cross-linkable group.

In an exemplary embodiment of the present specification, C is any one of the following structures.

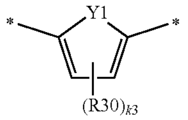
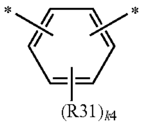
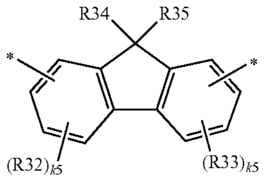
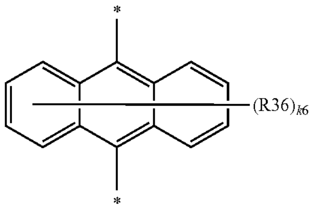
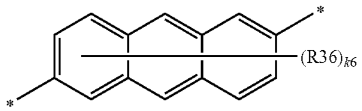
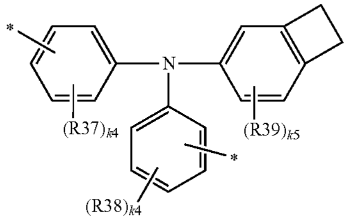
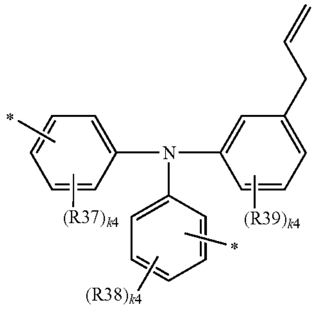

In the structures,

Y1 is S, O, or NR100,

R30 to R39 and R100 are the same as or different from each other, and are each independently hydrogen; deuterium; a substituted or unsubstituted alkyl group; a substituted or unsubstituted aryl group; or a cross-linkable group, k3 is an integer of 1 or 2, k4 is an integer from 1 to 4, k5 is an integer from 1 to 3, k6 is an integer from 1 to 8, when k3 to k6 are each 2 or higher, substituents in the parenthesis are the same as or different from each other, and

* is an attachment point in the polymer.

Specifically, C is any one of the following structures.

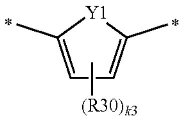
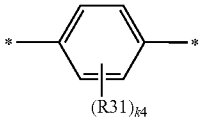
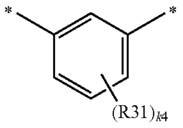
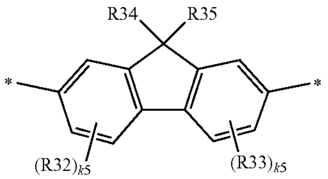
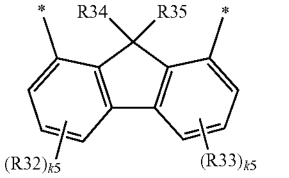
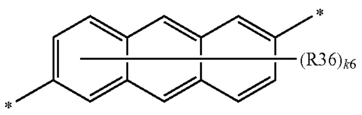
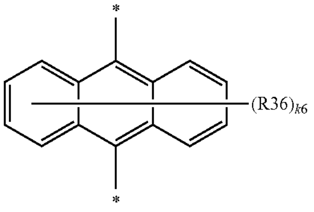
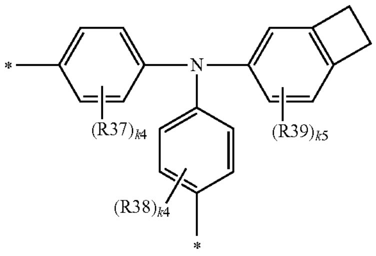

-continued

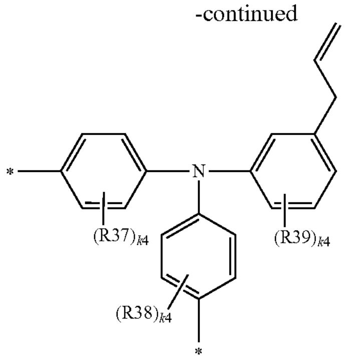

In the structures,

Y1 is S, O, or NR100,

R30 to R39 and R100 are the same as or different from each other, and are each independently hydrogen; deuterium; a substituted or unsubstituted alkyl group; a substituted or unsubstituted aryl group; or a cross-linkable group, k3 is an integer of 1 or 2, k4 is an integer from 1 to 4, k5 is an integer from 1 to 3, k6 is an integer from 1 to 8, when k3 to k6 are each 2 or higher, substituents in the parenthesis are the same as or different from each other, and

* is an attachment point in the polymer.

More specifically, C is any one of the following structures.

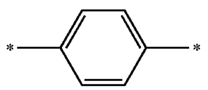

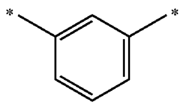

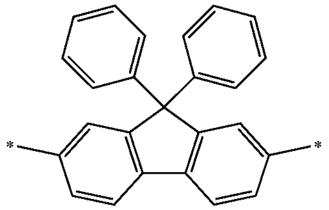

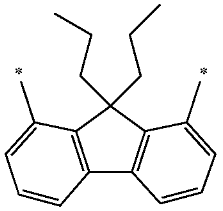

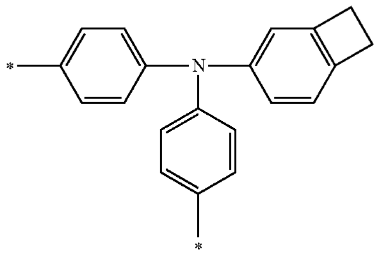

-continued

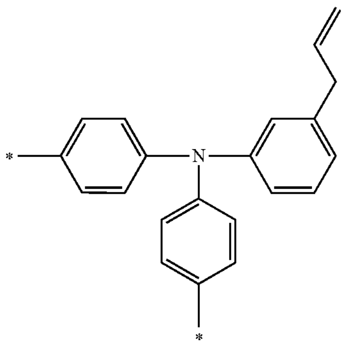

In the structure, * is an attachment point in the polymer.

In an exemplary embodiment of the present specification, E1 and E2 are end-capping units of the polymer.

In an exemplary embodiment of the present specification, E1 and E2 are units having only one attachment point.

In an exemplary embodiment of the present specification, E1 and E2 are the same as or different from each other, and are each independently a substituted or unsubstituted alkyl group; a substituted or unsubstituted aryl group; a cross-linkable group; or a combination thereof.

In an exemplary embodiment of the present specification, E1 and E2 are the same as or different from each other, and are each independently a substituted or unsubstituted alkyl group having 1 to 30 carbon atoms; a substituted or unsubstituted aryl group having 6 to 30 carbon atoms; a cross-linkable group; or a combination thereof.

In an exemplary embodiment of the present specification, E1 and E2 are the same as or different from each other, and are each independently a substituted or unsubstituted alkyl group having 1 to 10 carbon atoms; a substituted or unsubstituted phenyl group; a substituted or unsubstituted biphenyl group; a cross-linkable group; or a combination thereof.

In an exemplary embodiment of the present specification, E1 and E2 are each any one of the following structures.

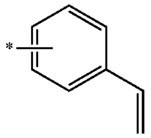

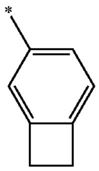

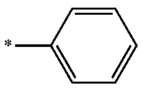

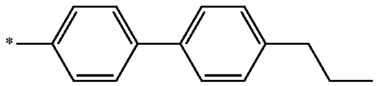

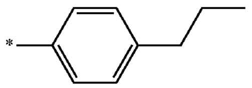

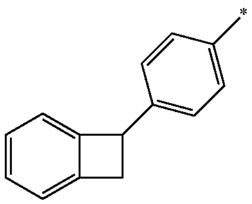

-continued

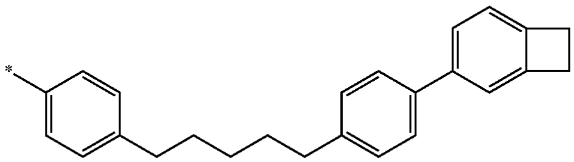

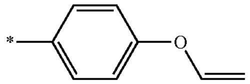

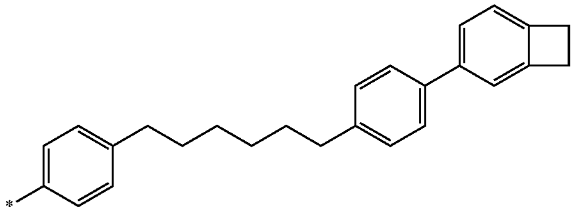

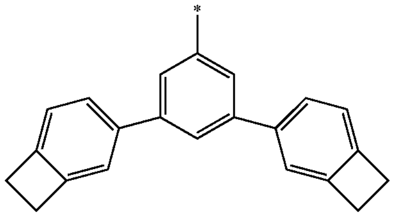

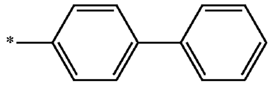

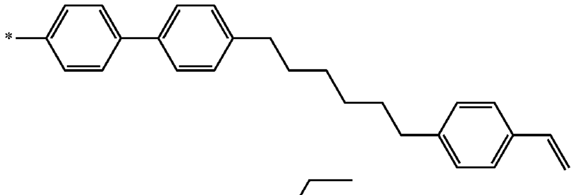

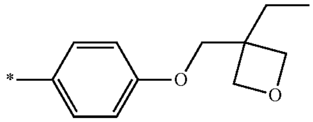

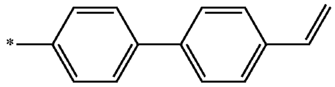

In the structure, * is an attachment point in the polymer.

More specifically, E1 and E2 are each any one of the following structures.

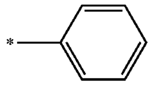

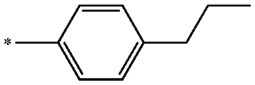

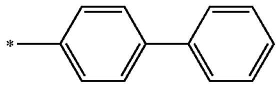

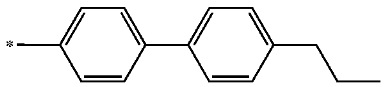

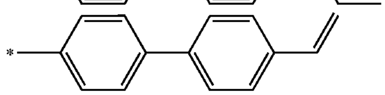

In the structure, * is an attachment point in the polymer.

In an exemplary embodiment of the present specification, a, b, and c are determined by the equivalent ratio of the monomers used in the preparation of the polymer.

In an exemplary embodiment of the present specification, a is a real number of 0.4 or higher.

In an exemplary embodiment of the present specification, a is a real number from 0.4 to 1.

In an exemplary embodiment of the present specification, a is a real number from 0.5 to 1.

In an exemplary embodiment of the present specification, a is a real number from 0.5 to 0.9.

In an exemplary embodiment of the present specification, a is a real number from 0.5 to 0.8.

In an exemplary embodiment of the present specification, b is a real number of 0 or higher.

In an exemplary embodiment of the present specification, b is a real number from 0 to 0.5.

In an exemplary embodiment of the present specification, b is a real number from 0.1 to 0.4.

In an exemplary embodiment of the present specification, b is a real number from 0.1 to 0.3.

In an exemplary embodiment of the present specification, c is a real number from 0 to 0.2.

In an exemplary embodiment of the present specification, c is a real number from 0 to 0.1.

In an exemplary embodiment of the present specification, c is 0.

In an exemplary embodiment of the present specification, a is a real number from 0.4 to 1, b is a real number from 0 to 0.4, and c is a real number from 0 to 0.2.

In an exemplary embodiment of the present specification, a is a real number from 0.4 to 0.9, b is a real number from 0.1 to 0.4, and c is a real number from 0 to 0.2.

In an exemplary embodiment of the present specification, the molar ratio of (A+B):(E1+E2) is 40:60 to 98:2.

An exemplary embodiment of the present specification provides a polymer including a unit represented by the following Chemical Formula 2 and an end group represented by the following Chemical Formula 5.

[Chemical Formula 2]

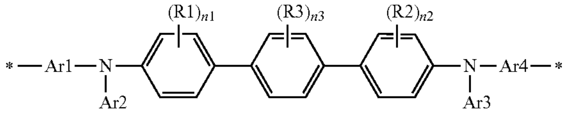

[Chemical Formula 5]

*——[E]

In Chemical Formulae 2 and 5,

Ar2 and Ar3 are the same as or different from each other, and are each independently a substituted or unsubstituted aryl group, Ar1 and Ar4 are the same as or different from each other, and are each independently a substituted or unsubstituted arylene group, R1 and R2 are the same as or different from each other, and are each independently a halogen group, R3 is hydrogen; deuterium; a substituted or unsubstituted alkyl group; a substituted or unsubstituted silyl group; a substituted or unsubstituted aryl group; a substituted or unsubstituted arylamine group; or a substituted or unsubstituted siloxane group, n1 to n3 are each an integer from 1 to 4, when n1 to n3 are each 2 or higher, each occurrence of R1, R2 and R3 is the same as or different from each other, respectively E is hydrogen; deuterium; a substituted or unsubstituted alkyl group; a substituted or unsubstituted silyl group; a substituted or unsubstituted aryl group; a substituted or unsubstituted arylamine group; a substituted or unsubstituted siloxane group; a cross-linkable group; or a combination thereof, and

* is an attachment point in the polymer.

In an exemplary embodiment of the present specification, the polymer represented by Chemical Formula 1 may be represented by a polymer including the unit represented by Chemical Formula 2 and the end group represented by Chemical Formula 5. Specifically, when b and c of Chemical Formula 1 are 0, the polymer represented by Chemical Formula 1 may be represented by a polymer including the unit represented by Chemical Formula 2 and the end group represented by Chemical Formula 5.

In an exemplary embodiment of the present specification, the polymer including the unit represented by Chemical Formula 2 and the end group represented by Chemical Formula 5 further includes a unit represented by the following Chemical Formula 3.

[Chemical Formula 3]

$$Z\!-\!\!\left[Y-*\right]_m$$

In Chemical Formula 3, m is an integer of 3 or 4, when m is 3, Z is CRa; SiRa; N; or a substituted or unsubstituted trivalent aryl group, when m is 4, Z is C; Si; or a substituted or unsubstituted tetravalent aryl group, Ra is hydrogen; a substituted or unsubstituted alkyl group; or a substituted or unsubstituted aryl group, Y is a direct bond; a substituted or unsubstituted alkylene group; or a substituted or unsubstituted arylene group, when Y is a direct bond; or a substituted or unsubstituted alkylene group, Z is a substituted or unsubstituted trivalent or tetravalent aryl group, and

* is an attachment point in the polymer.

That is, an exemplary embodiment of the present specification provides a polymer including the unit represented by Chemical Formula 2, the unit represented by Chemical Formula 3, and the end group represented by Chemical Formula 5.

In this case, the polymer represented by Chemical Formula 1 may be represented by a polymer including the unit represented by Chemical Formula 2, the unit represented by Chemical Formula 3, and the end group represented by Chemical Formula 5.

Specifically, when b and c of Chemical Formula 1 are a real number of more than 0 and less than 1 and 0, respectively, the polymer represented by Chemical Formula 1 may be represented by a polymer including the unit represented by Chemical Formula 2, the unit represented by Chemical Formula 3, and the end group represented by Chemical Formula 5.

In an exemplary embodiment of the present specification, the polymer including the unit represented by Chemical Formula 2 and the end group represented by Chemical Formula 5 further includes a unit represented by the following Chemical Formula 4.

$$*-[C]-*$$ [Chemical Formula 4]

In Chemical Formula 4,

C is a substituted or unsubstituted arylene group; or a substituted or unsubstituted divalent heterocyclic group, and

* is an attachment point in the polymer.

That is, an exemplary embodiment of the present specification provides a polymer including the unit represented by Chemical Formula 2, the unit represented by Chemical Formula 4, and the end group represented by Chemical Formula 5.

In this case, the polymer represented by Chemical Formula 1 may be represented by a polymer including the unit represented by Chemical Formula 2, the unit represented by Chemical Formula 4, and the end group represented by Chemical Formula 5.

Specifically, when b of Chemical Formula 1 are 0 and c of Chemical Formula 1 are a real number of more than 0 and less than 1, the polymer represented by Chemical Formula 1 may be represented by a polymer including the unit represented by Chemical Formula 2, the unit represented by Chemical Formula 4, and the end group represented by Chemical Formula 5.

Further, an exemplary embodiment of the present specification provides a polymer including the unit represented by Chemical Formula 2, the unit represented by Chemical Formula 3, the unit represented by Chemical Formula 4, and the end group represented by Chemical Formula 5.

In this case, the polymer represented by Chemical Formula 1 may be represented by a polymer including the unit represented by Chemical Formula 2, the unit represented by Chemical Formula 3, the unit represented by Chemical Formula 4, and the end group represented by Chemical Formula 5.

Specifically, when b and c of Chemical Formula 1 are each a real number of more than 0 and less than 1, the polymer represented by Chemical Formula 1 may be represented by a polymer including the unit represented by Chemical Formula 2, the unit represented by Chemical Formula 3, the unit represented by Chemical Formula 4, and the end group represented by Chemical Formula 5.

In an exemplary embodiment of the present specification, the above-described description on Chemical Formula 2 in Chemical Formula 1 is equally applied to the description on Chemical Formula 2 of the polymer including the unit represented by Chemical Formula 2 and the end group represented by Chemical Formula 5. For example, in the polymer including the unit represented by Chemical Formula 2 and the end group represented by Chemical Formula 5, Chemical Formula 2 may be represented by Chemical Formula 2-1.

In an exemplary embodiment of the present specification, when the polymer including the unit represented by Chemical Formula 2 and the end group represented by Chemical Formula 5 further includes a unit represented by Chemical Formula 3, the above-described description on Chemical Formula 3 in Chemical Formula 1 is equally applied to the description on Chemical Formula 3. For example, in the polymer including the unit represented by Chemical Formula 2, the unit represented by Chemical Formula 3, and the end group represented by Chemical Formula 5, Chemical Formula 3 may be represented by Chemical Formula 3-1.

The description on Chemical Formulae 2 and 3 is equally applied even to a polymer including the unit represented by Chemical Formula 2, the unit represented by Chemical Formula 3, the unit represented by Chemical Formula 4, and the end group represented by Chemical Formula 5.

In an exemplary embodiment of the present specification, when the polymer including the unit represented by Chemical Formula 2 and the end group represented by Chemical Formula 5 further includes Chemical Formula 4, the definition of C defined in Chemical Formula 1 is equally applied to the description on C of Chemical Formula 4. For example, in the polymer including the unit represented by Chemical Formula 2, the unit represented by Chemical Formula 4, and the end group represented by Chemical Formula 5, C of Chemical Formula 4 is any one of the following structures.

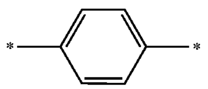
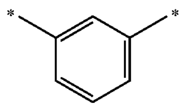
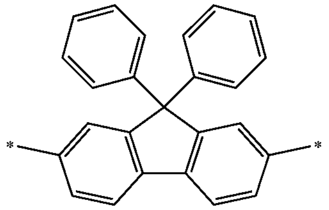
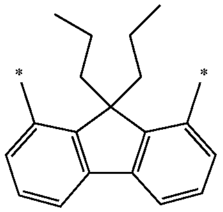
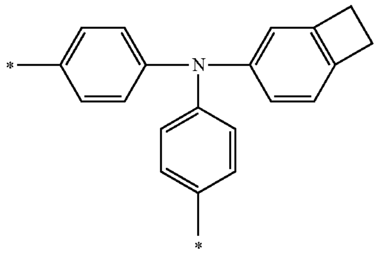
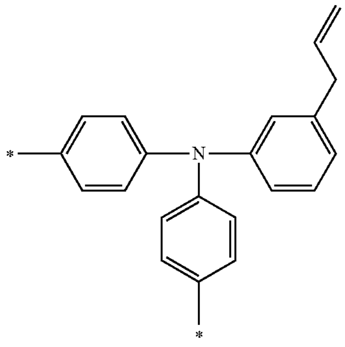

The description on C is equally applied even to a polymer including the unit represented by Chemical Formula 2, the unit represented by Chemical Formula 3, the unit represented by Chemical Formula 4, and the end group represented by Chemical Formula 5.

In an exemplary embodiment of the present specification, in the polymer including the unit represented by Chemical Formula 2 and the end group represented by Chemical Formula 5, the description on E1 of Chemical Formula 1 is equally applied to E of Chemical Formula 5. For example, in the polymer including the unit represented by Chemical Formula 2 and the end group represented by Chemical Formula 5, E is an end-capping unit of the polymer, and may be represented by any one of the following structures.

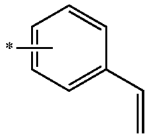
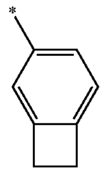
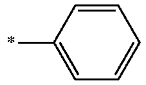
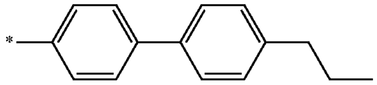
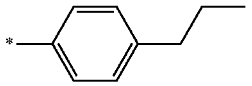
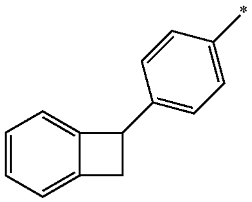
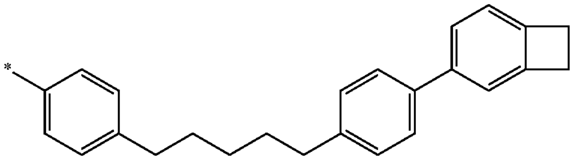
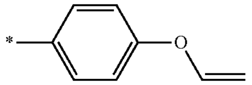
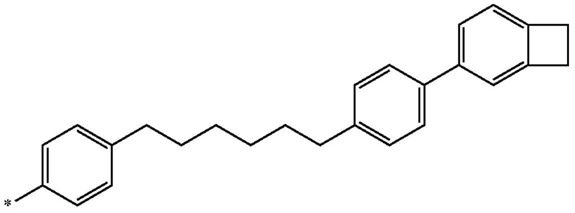
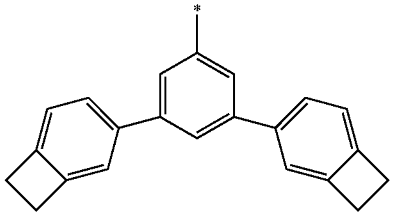
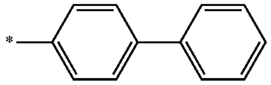
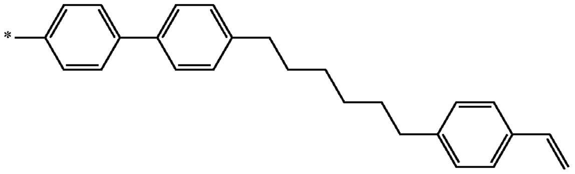
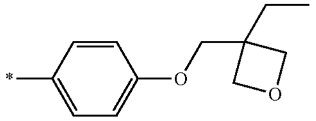
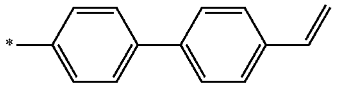

The description on E is equally applied even to a polymer including the unit represented by Chemical Formula 2, the unit represented by Chemical Formula 3, and the end group represented by Chemical Formula 5. Further, the description on E is equally applied even to a polymer including the unit represented by Chemical Formula 2, the unit represented by Chemical Formula 3, the unit represented by Chemical Formula 4, and the end group represented by Chemical Formula 5.

In an exemplary embodiment of the present specification, the polymer is an alternating polymer, a block polymer, or a random polymer.

In an exemplary embodiment of the present specification, the polymer has a weight average molecular weight (Mw) of 70,000 g/mol to 2,000,000 g/mol. Specifically, the weight average molecular weight (Mw) is 70,000 g/mol to 1,000,000 g/mol. More specifically, the weight average molecular weight (Mw) is 70,000 g/mol to 500,000 g/mol.

When the weight average molecular weight of the polymer satisfies the above range, the polymer can be applied to a device by a solution process, and exhibits the effect of maintaining the organic layer after being applied to the device.

In an exemplary embodiment of the present specification, the unit represented by Chemical Formula 2, the unit represented by Chemical Formula 3, the unit represented by Chemical Formula 4, and the end group represented by Chemical Formula 5 may be distributed so as to optimize the characteristics of the polymer.

In an exemplary embodiment of the present specification, when the mole fraction of the unit represented by Chemical Formula 2, the mole fraction of the unit represented by Chemical Formula 3, the mole fraction of the unit represented by Chemical Formula 4, and the mole fraction of the unit represented by Chemical Formula 5 in the polymer are defined as a1, b1, c1, and e1, respectively, a1, b1, c1, and e1 are each a real number, $0<a1<1$, $0\leq b1<1$, $0\leq c1<1$. $0<e1<1$, and $a1+b1+c1+e1=1$.

In an exemplary embodiment of the present specification, a1 is a real number of 0.4 or higher.

In an exemplary embodiment of the present specification, a1 is a real number of 0.4 or higher and less than 1.

In an exemplary embodiment of the present specification, a1 is a real number of 0.5 or higher and less than 1.

In an exemplary embodiment of the present specification, a1 is a real number from 0.5 to 0.9.

In an exemplary embodiment of the present specification, a1 is a real number from 0.5 to 0.8.

In an exemplary embodiment of the present specification, b1 is a real number of 0 or higher.

In an exemplary embodiment of the present specification, b1 is a real number from 0 to 0.5.

In an exemplary embodiment of the present specification, b1 is a real number from 0.1 to 0.4.

In an exemplary embodiment of the present specification, b1 is a real number from 0.1 to 0.3.

In an exemplary embodiment of the present specification, c1 is a real number from 0 to 0.2.

In an exemplary embodiment of the present specification, c1 is a real number from 0 to 0.1.

In an exemplary embodiment of the present specification, c1 is 0.

In an exemplary embodiment of the present specification, e1 is a real number from 0.1 to 0.5.

In an exemplary embodiment of the present specification, e1 is a real number from 0.1 to 0.4.

In an exemplary embodiment of the present specification, e1 is a real number from 0.1 to 0.35.

In an exemplary embodiment of the present specification, a1 is a real number of 0.4 or higher and less than 1, b1 is a real number from 0 to 0.5, c1 is a real number from 0 to 0.2, e1 is a real number from 0.1 to 0.5, and $a1+b1+c1+e1=1$.

In an exemplary embodiment of the present specification, a1 is a real number from 0.4 to 0.9, b1 is a real number from 0.1 to 0.4, c1 is a real number from 0 to 0.2, e1 is a real number from 0.1 to 0.5, and $a1+b1+c1+e1=1$.

In an exemplary embodiment of the present specification, a1 is a real number from 0.4 to 0.7, b1 is a real number from 0.1 to 0.3, c1 is a real number from 0 to 0.1, e1 is a real number from 0.2 to 0.4, and $a1+b1+c1+e1=1$.

In an exemplary embodiment of the present specification, the polymer is represented by any one of the following structures.

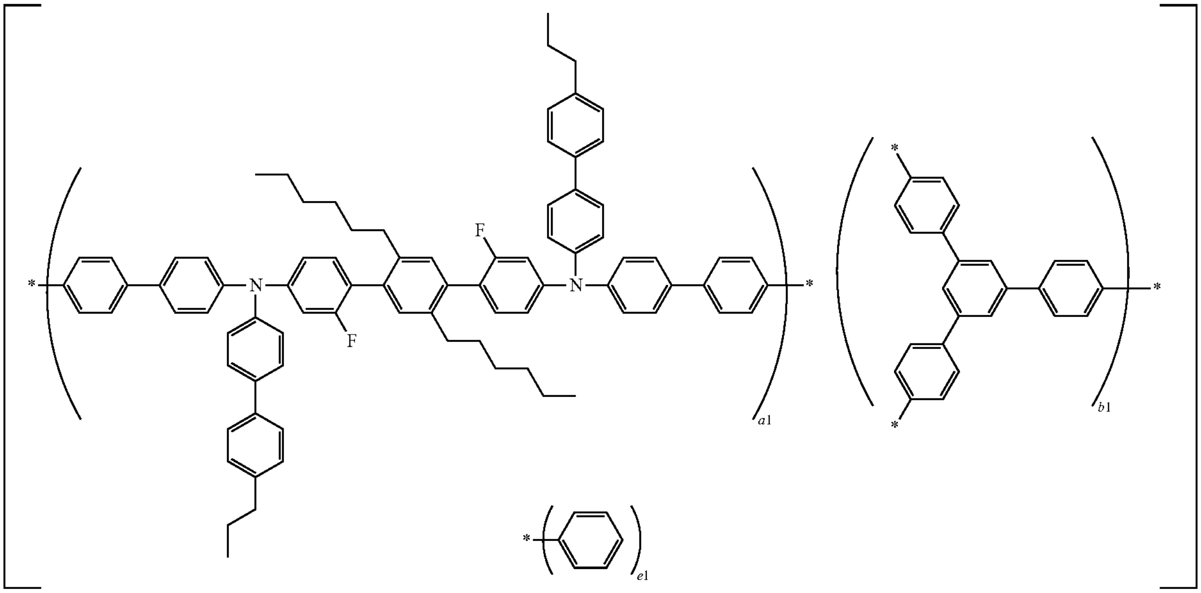

-continued
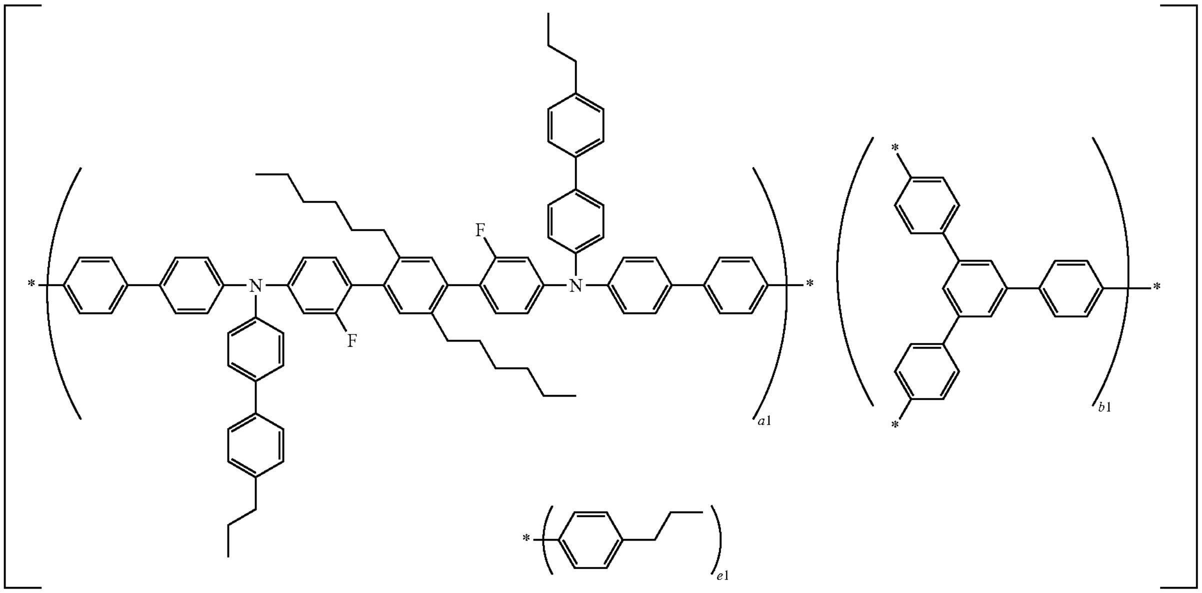
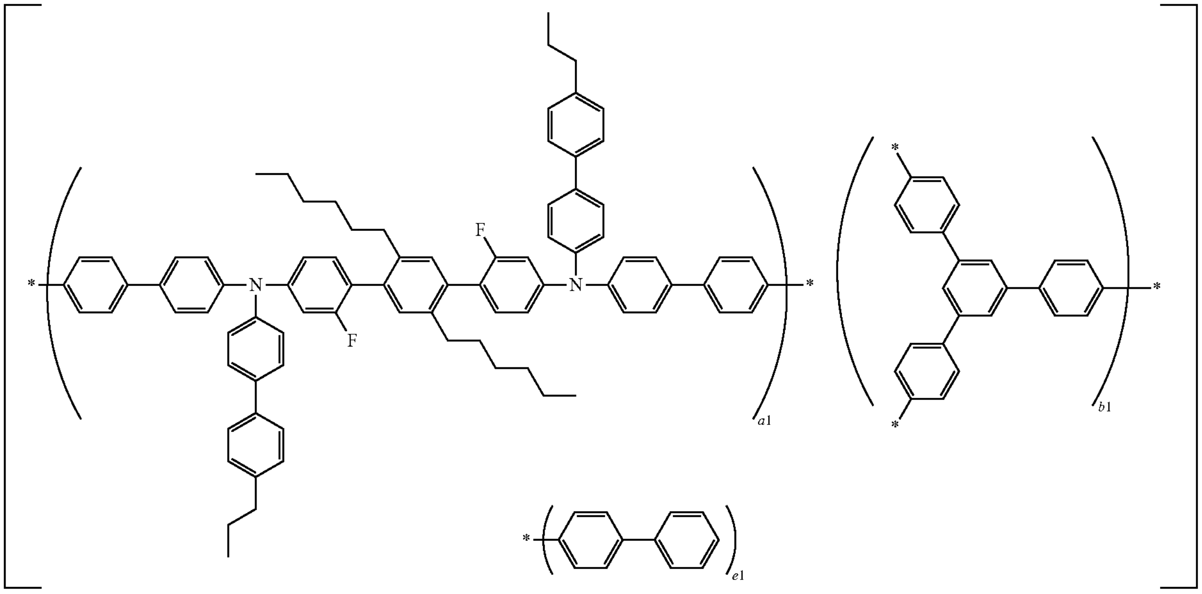

-continued
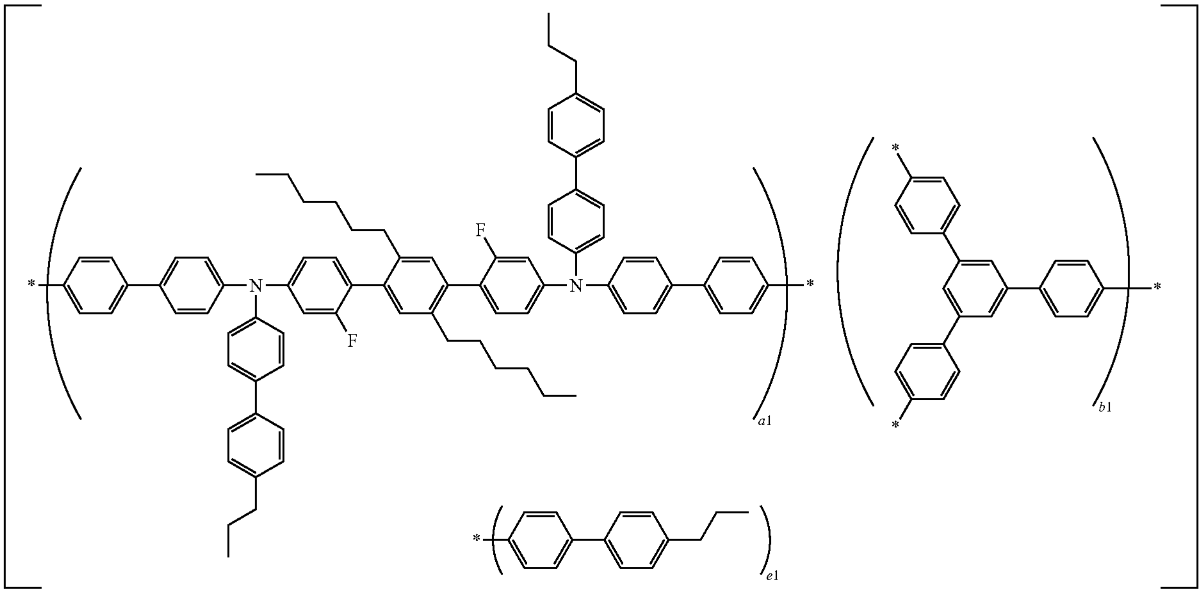
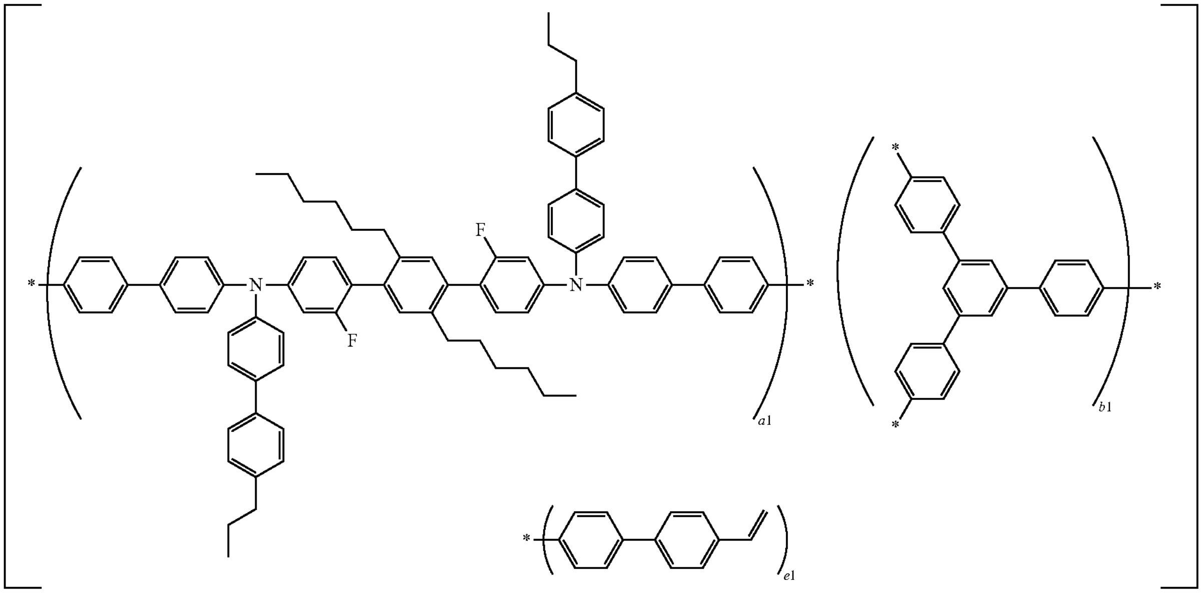

-continued
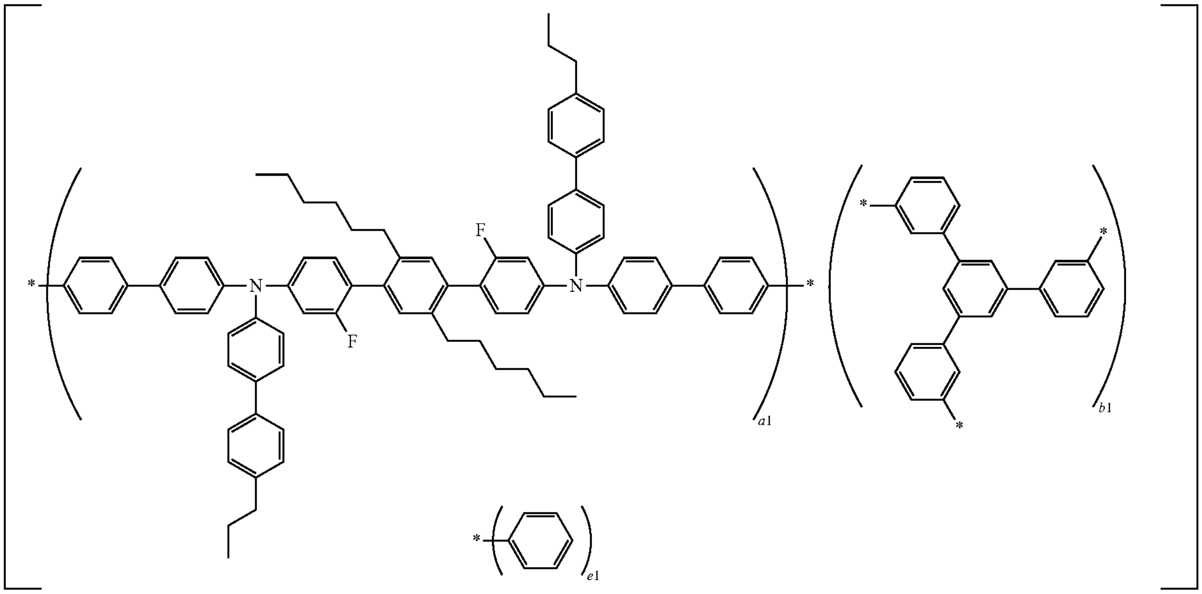
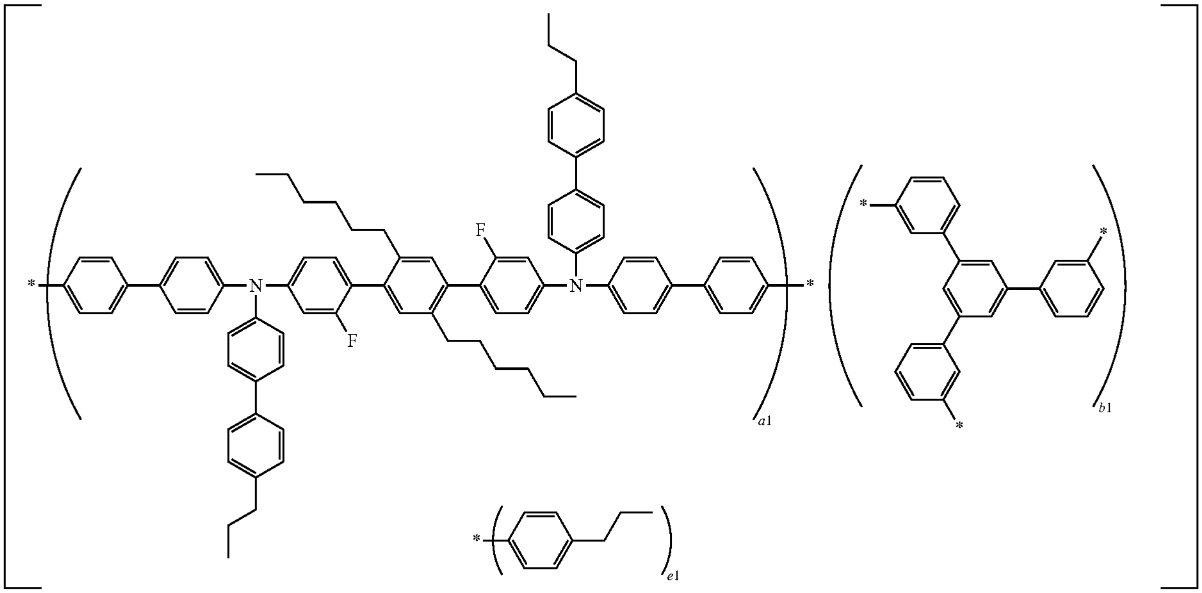

-continued
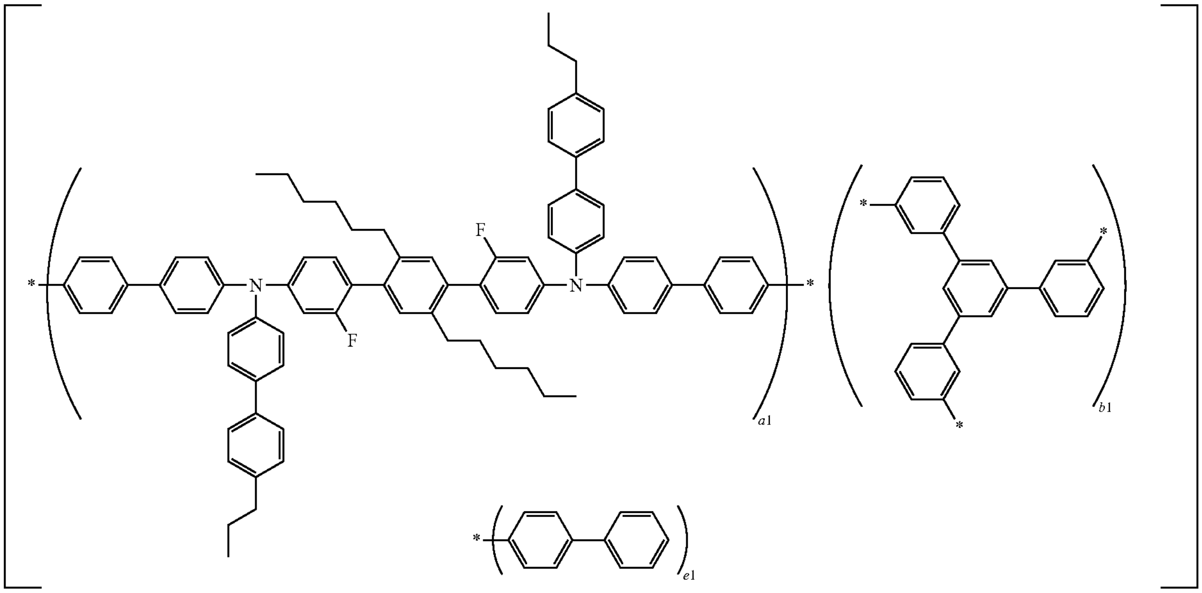
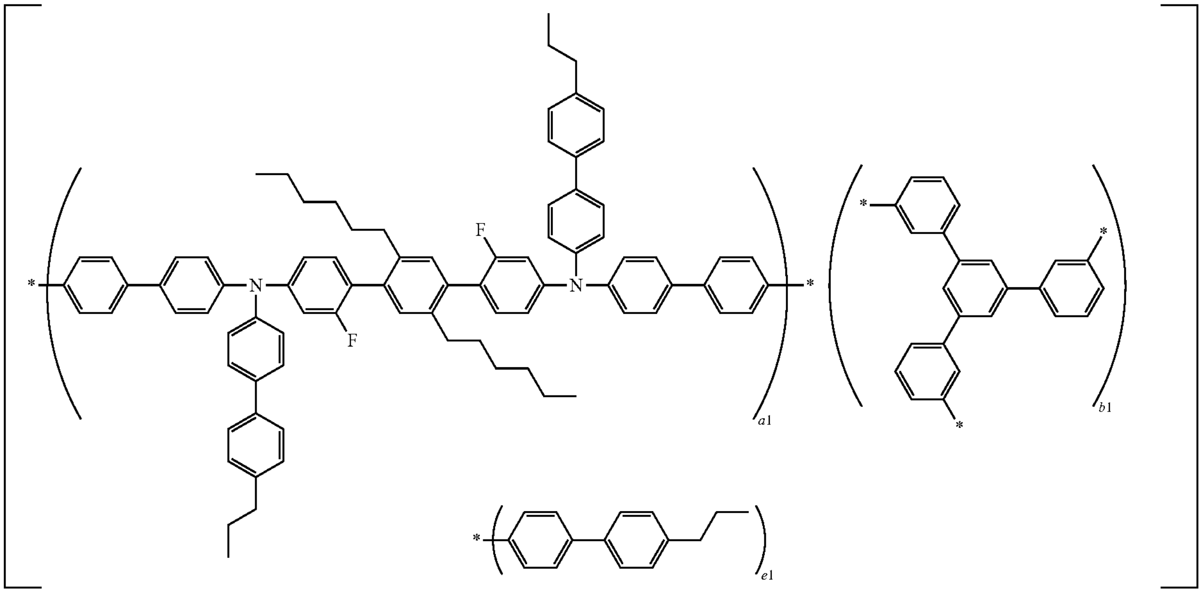

-continued
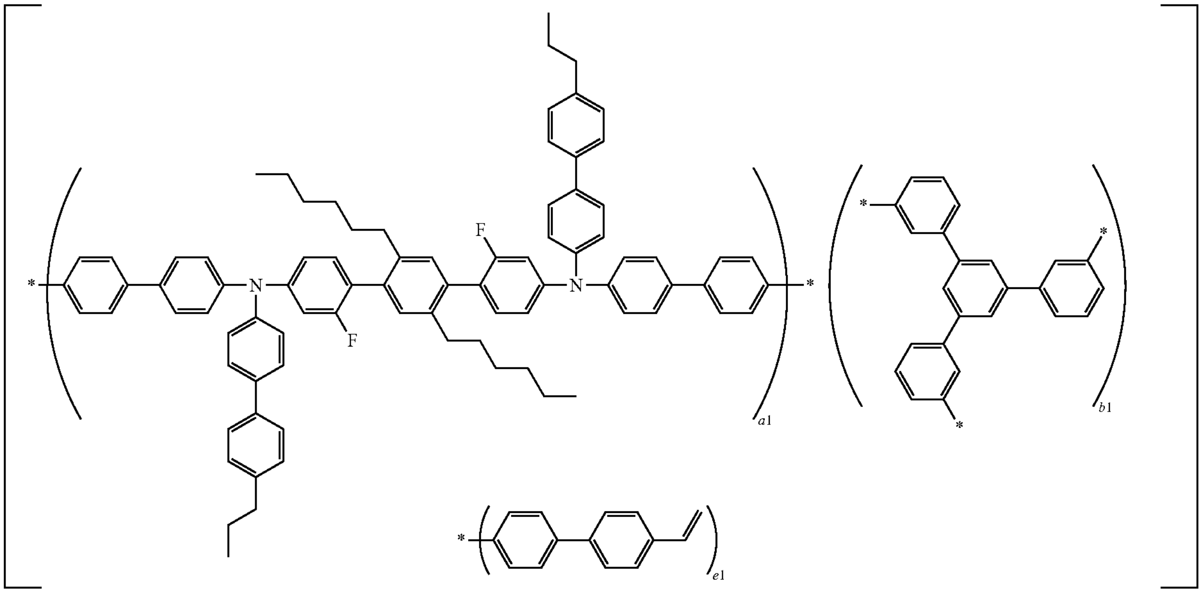
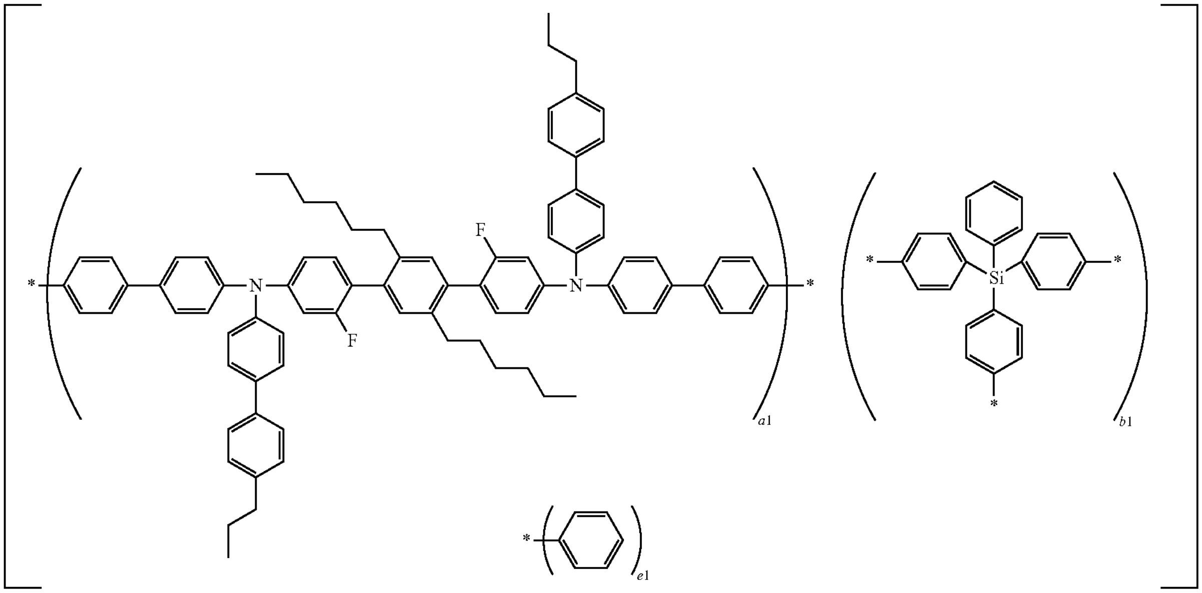

-continued
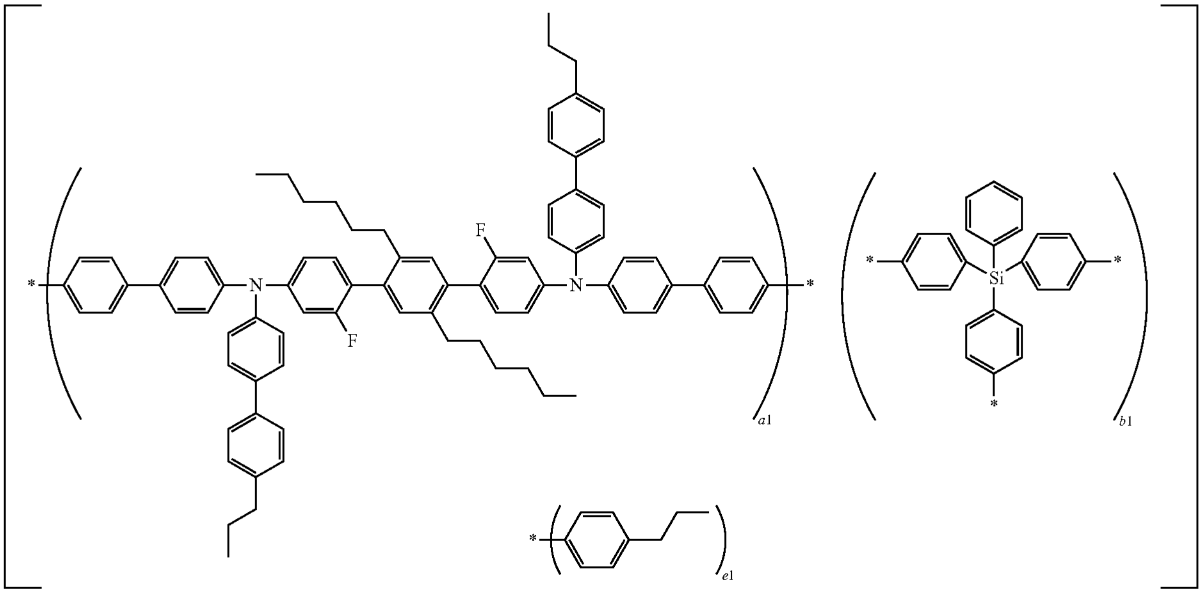
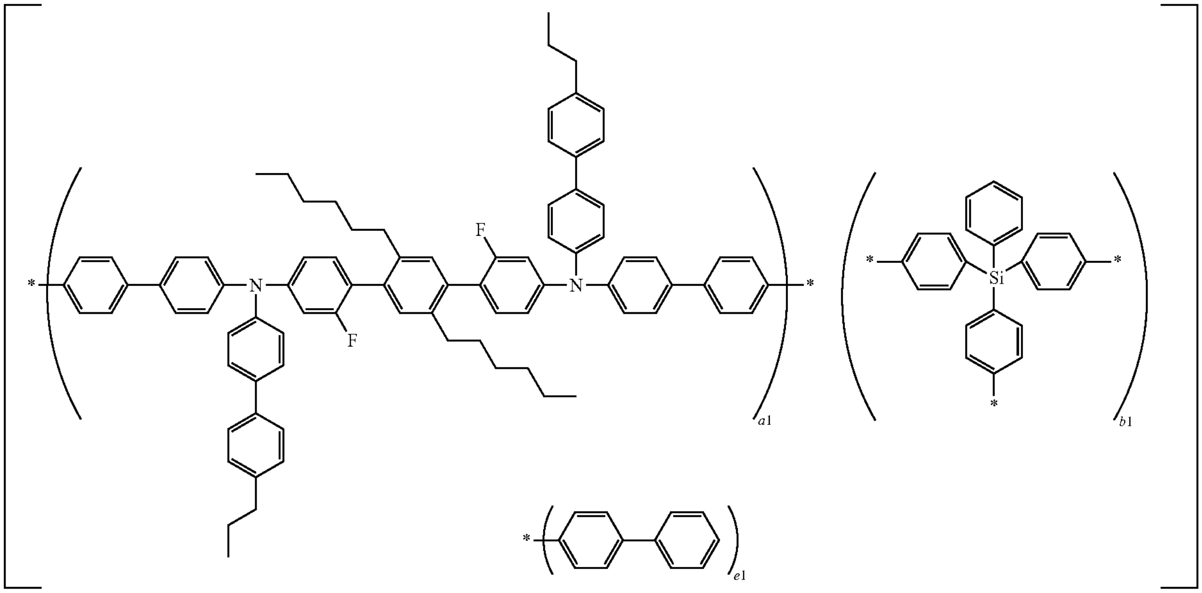

-continued
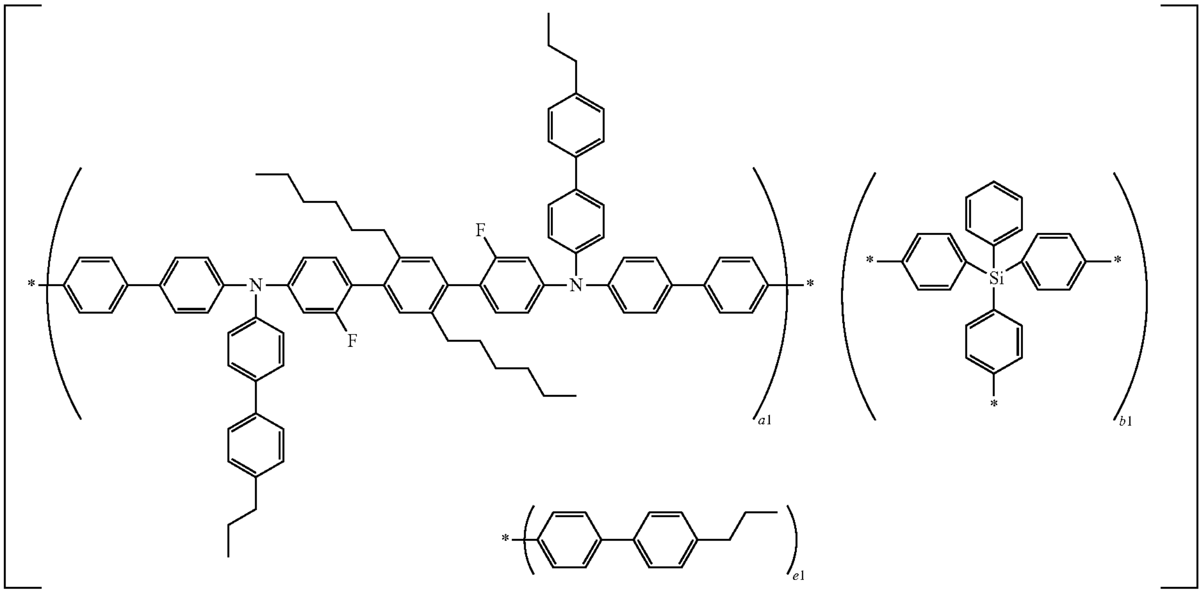
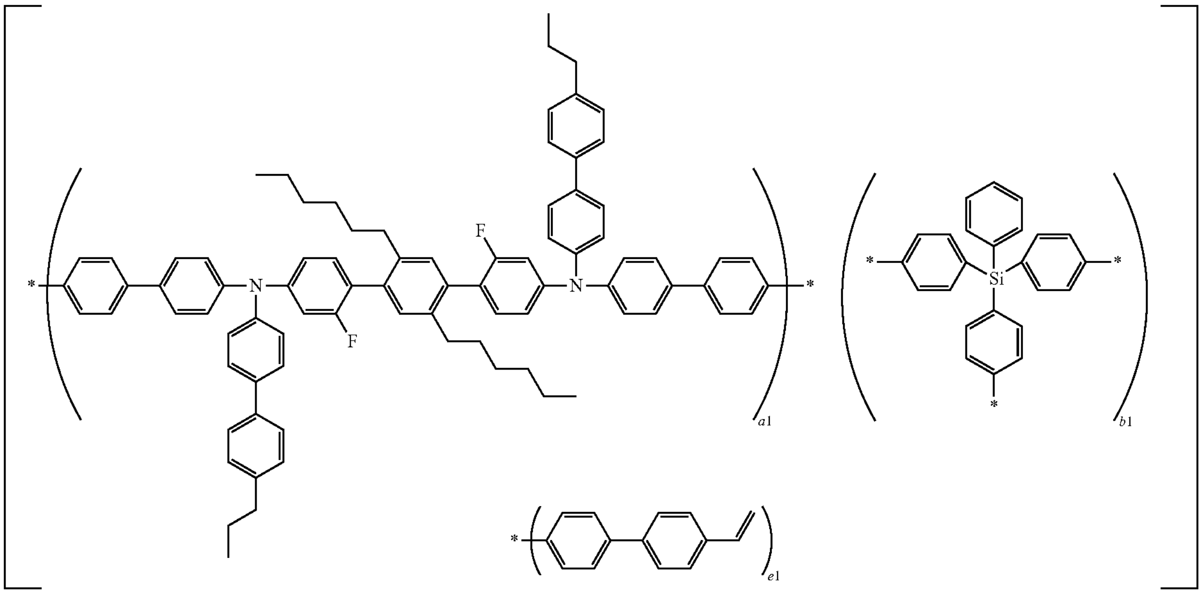

-continued
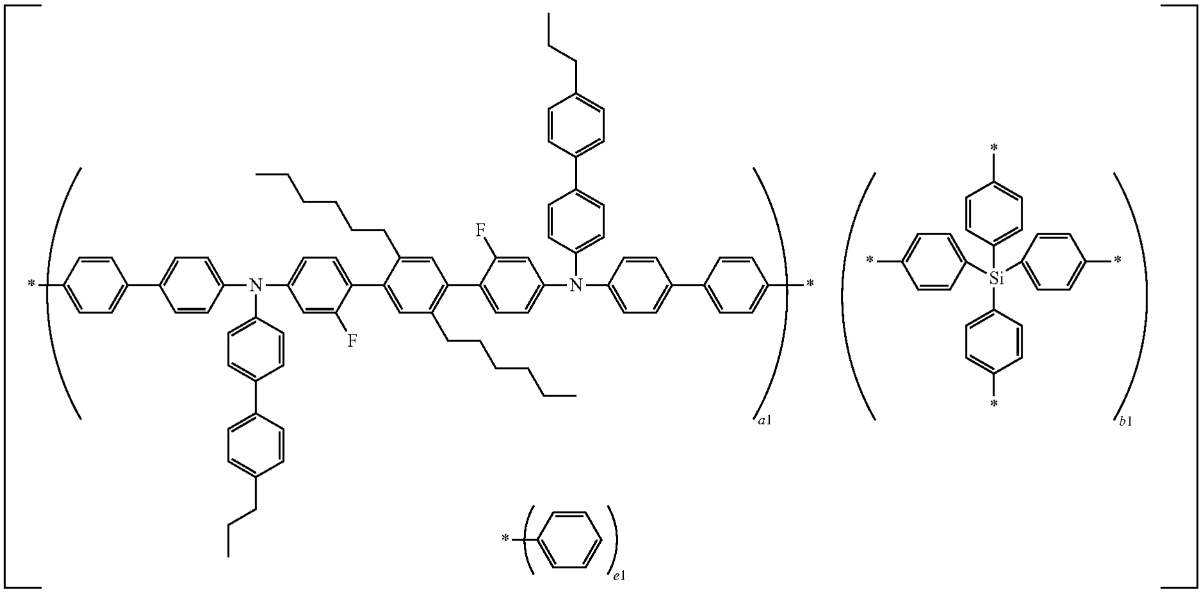
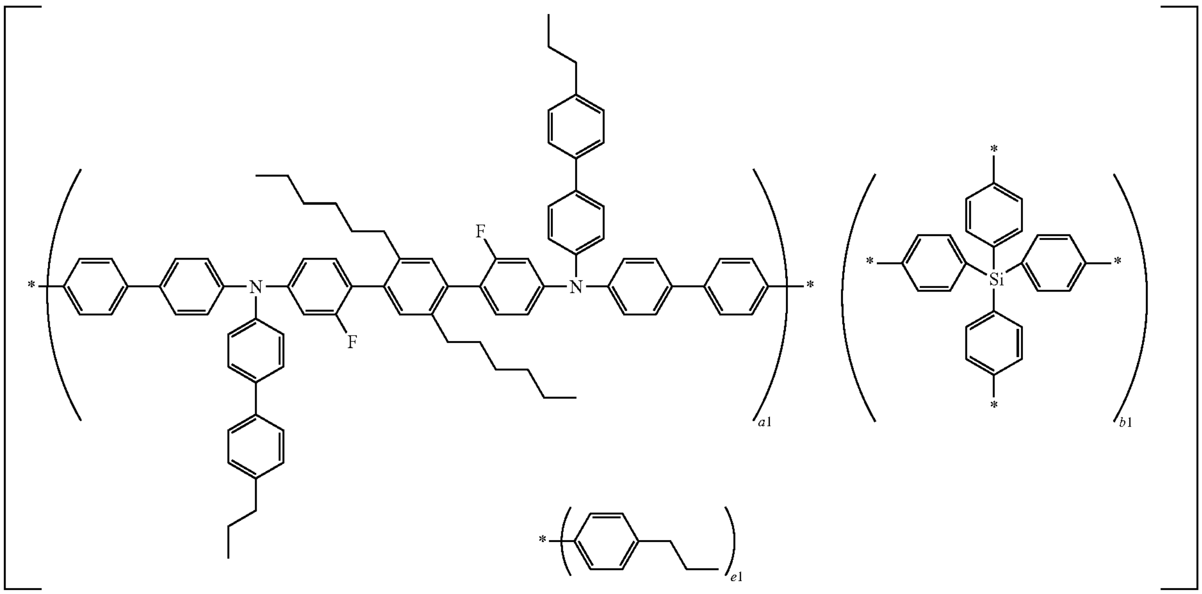

-continued
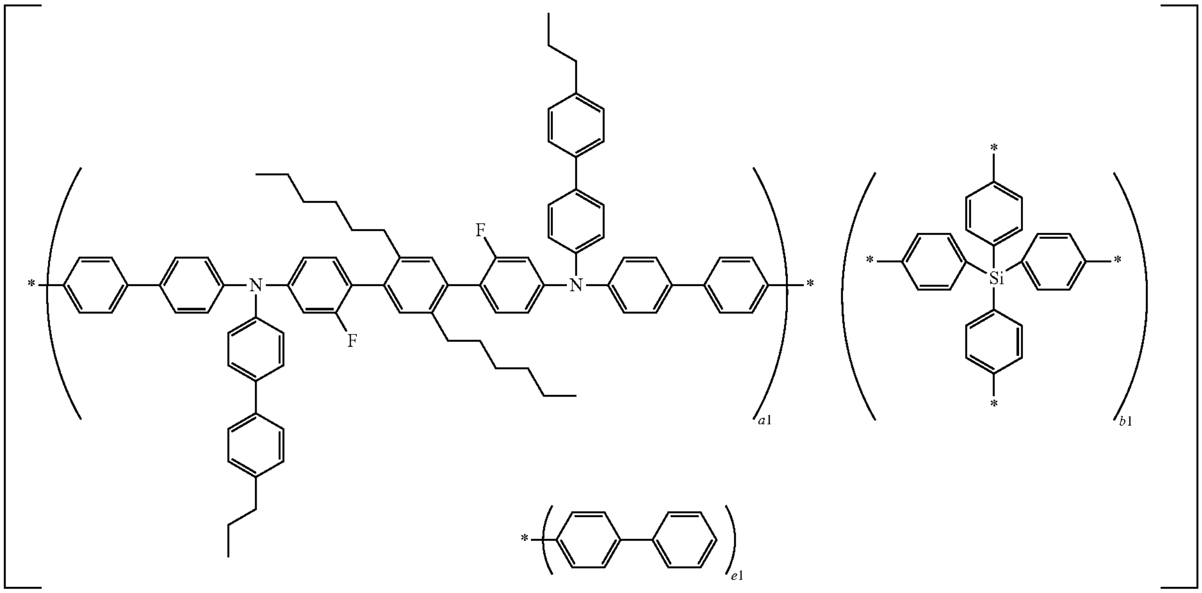
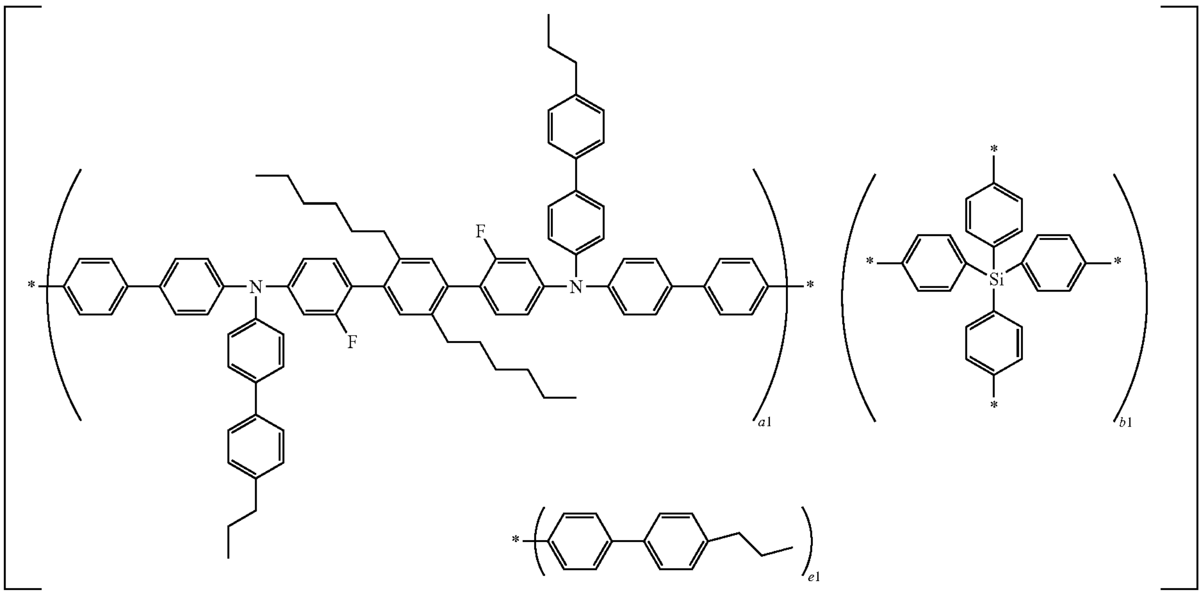

-continued
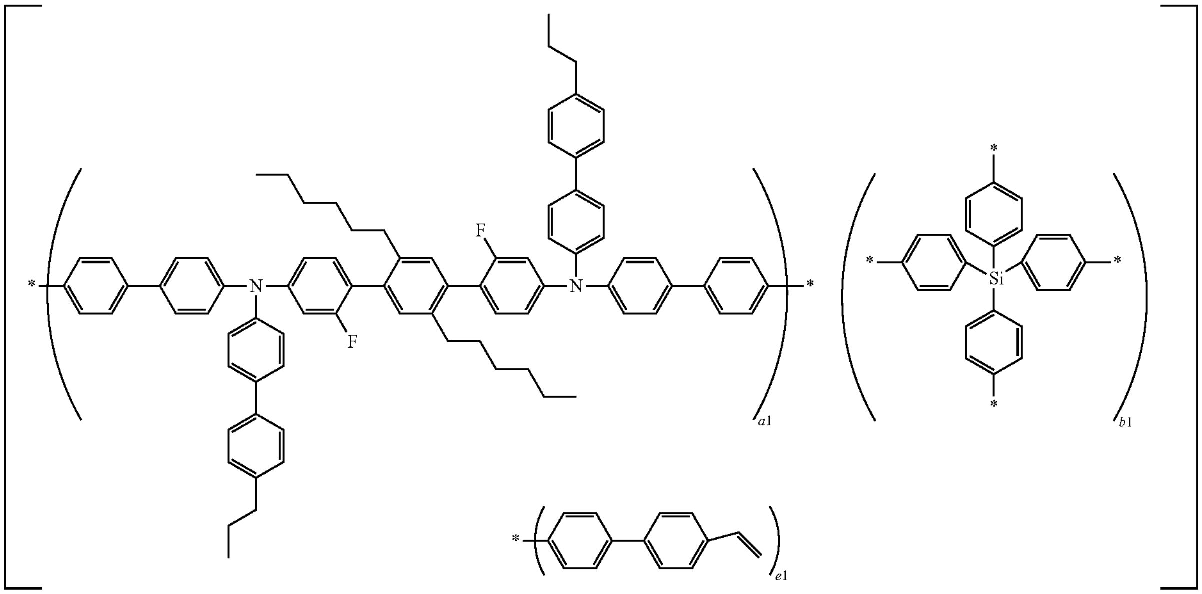
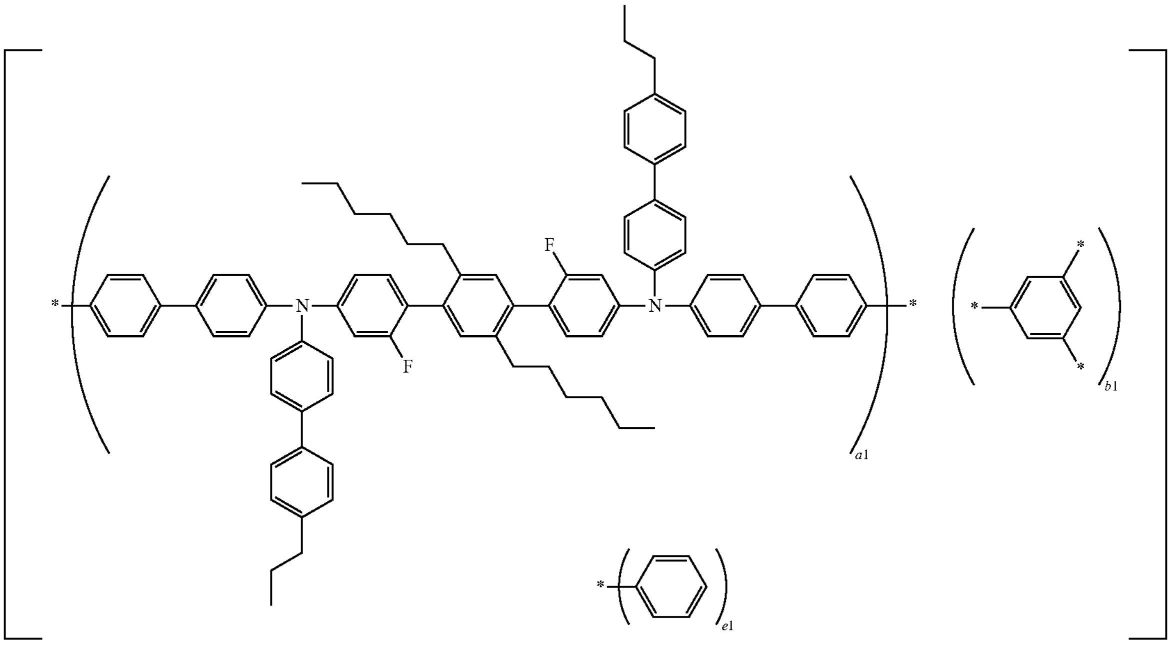

-continued
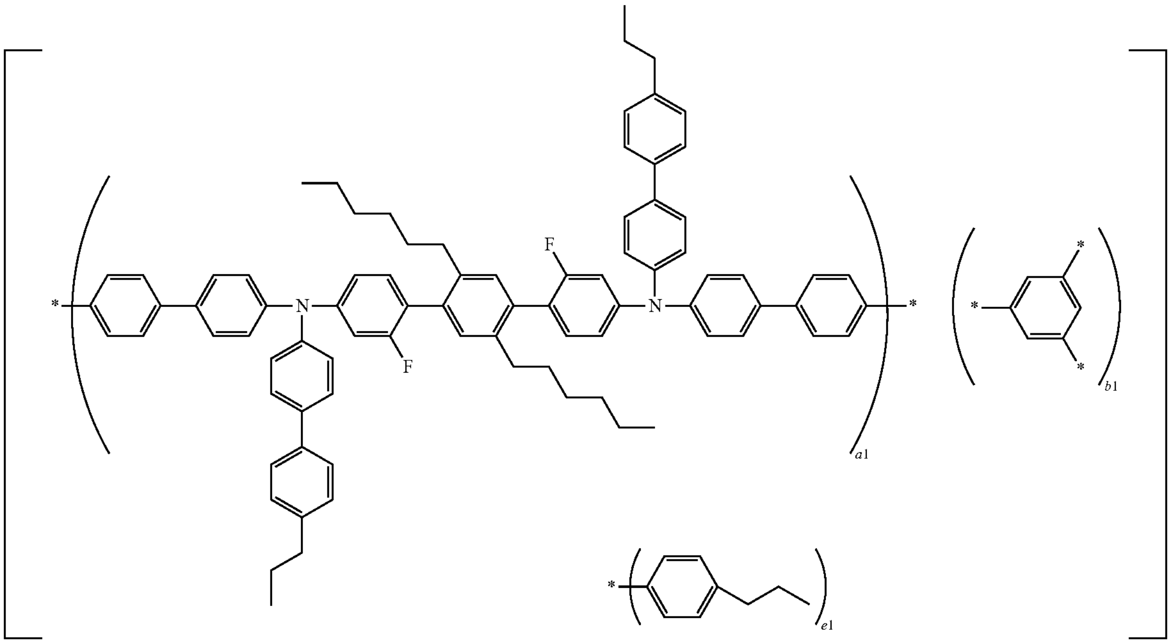
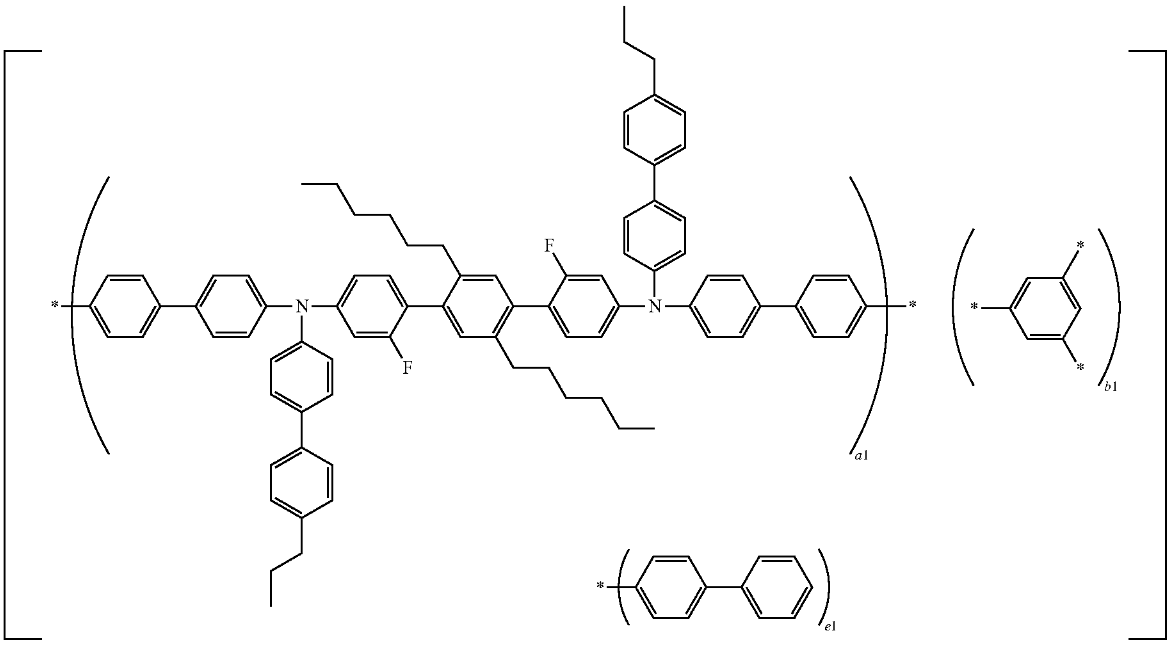

-continued
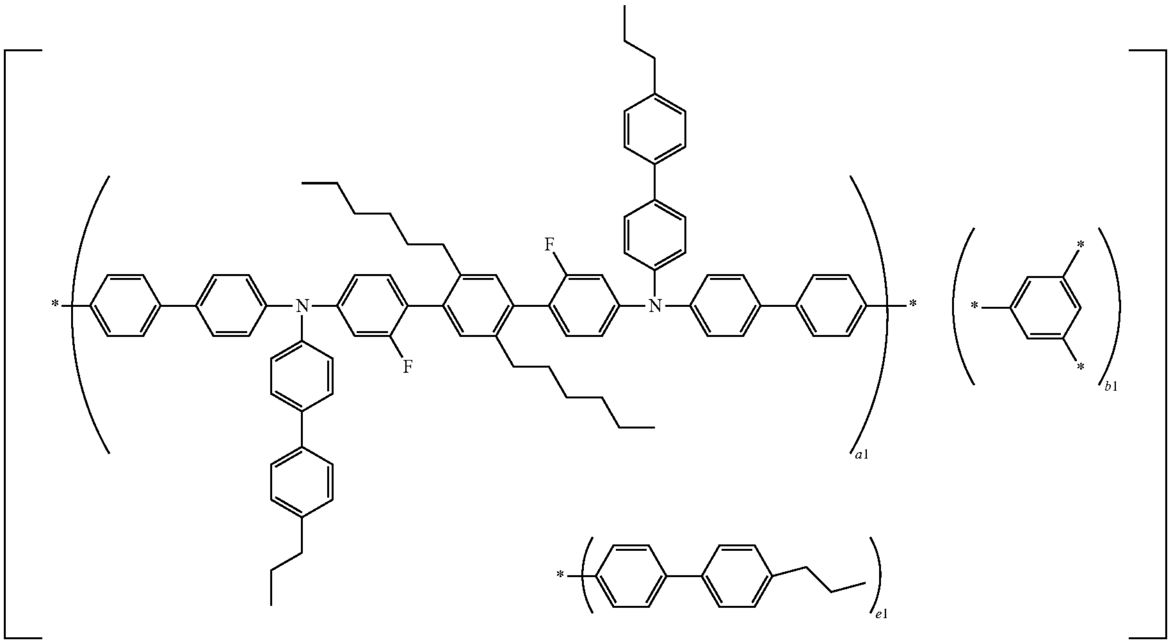
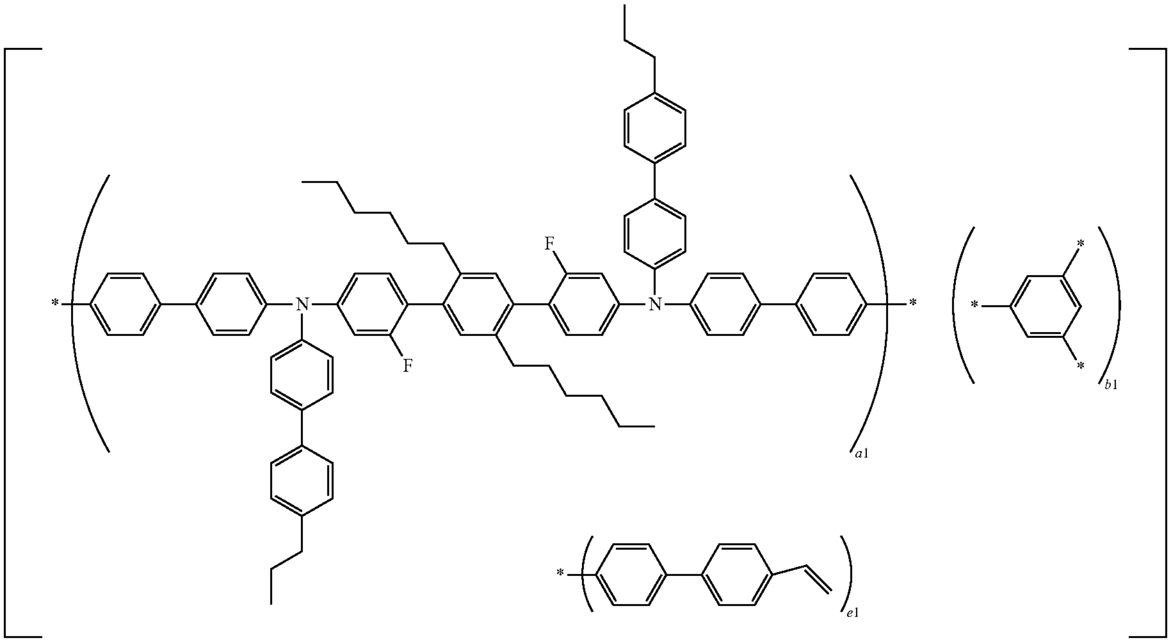

-continued
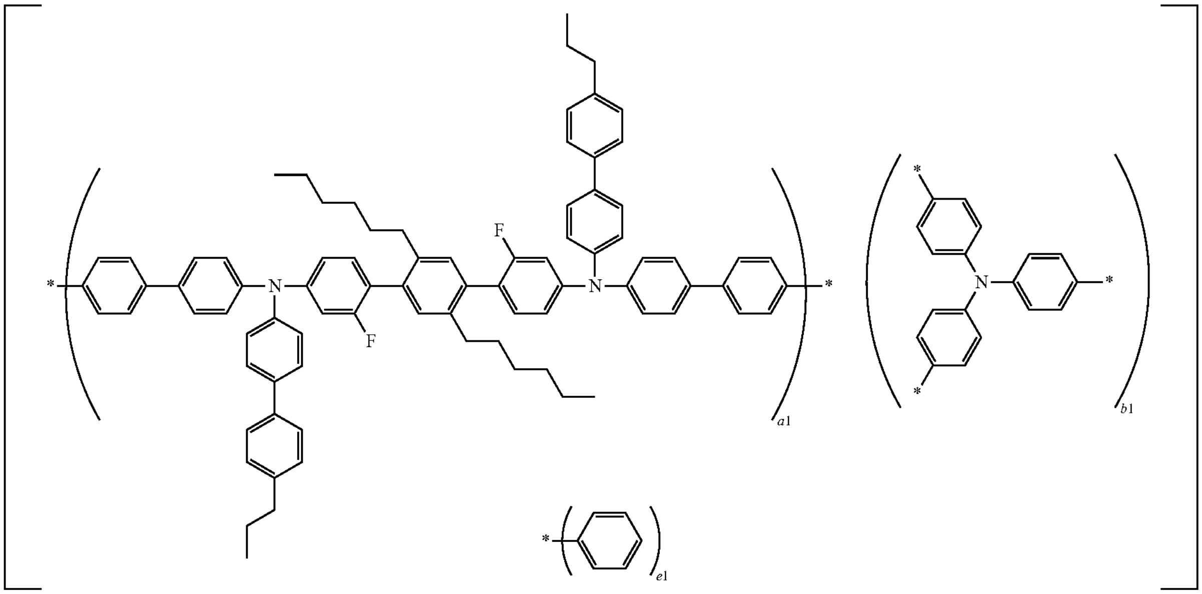
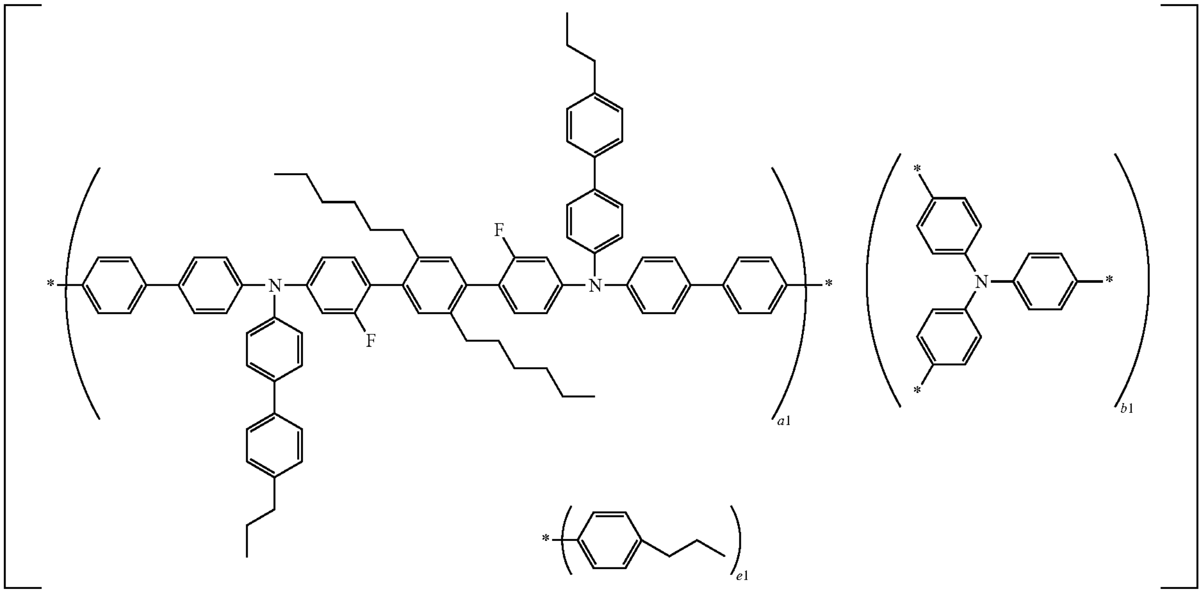

-continued
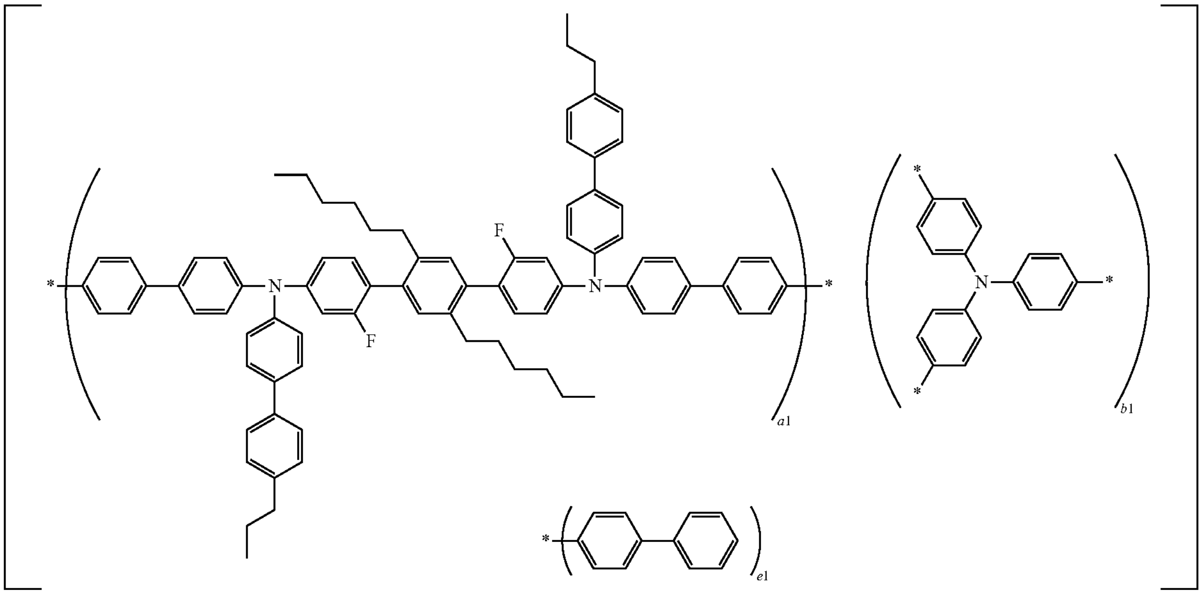
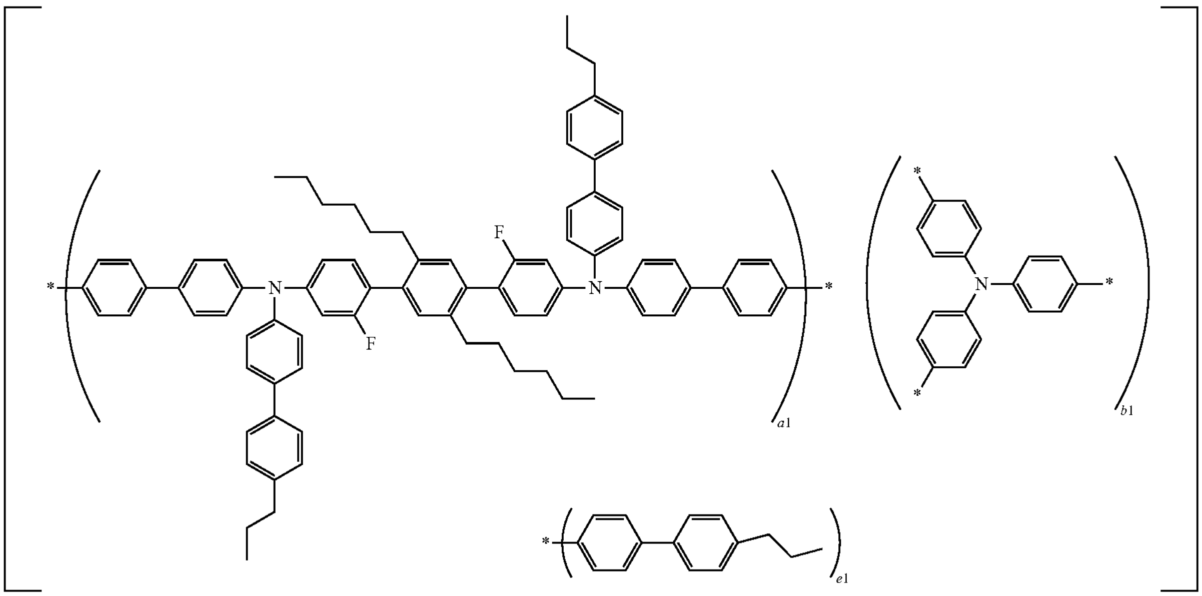

-continued

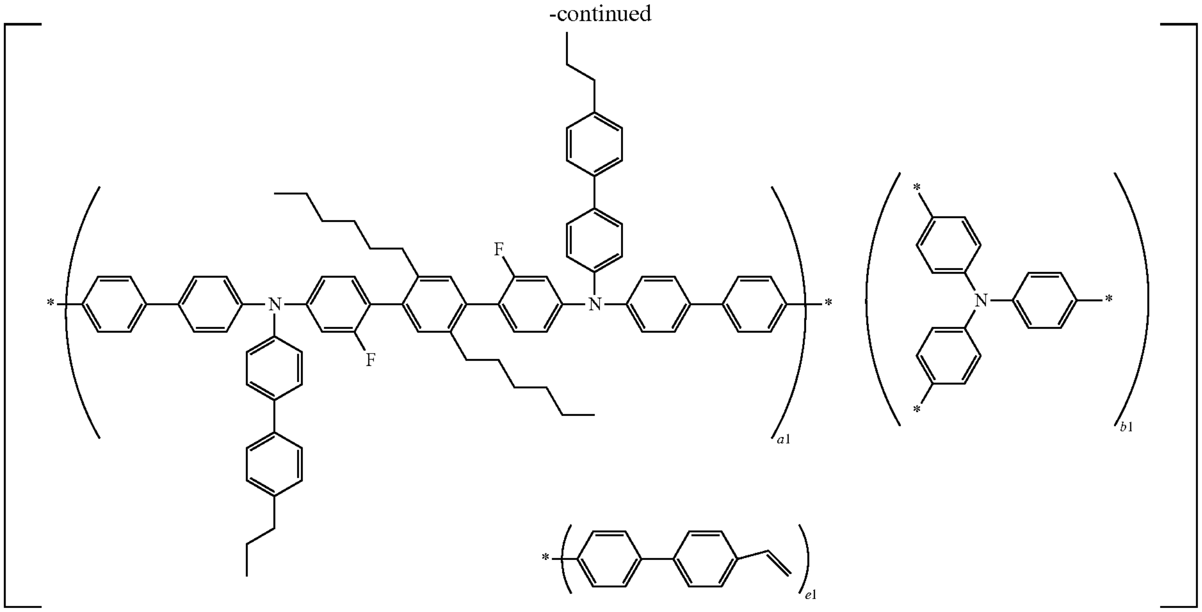

In the structures, a1 is a real number of 0<a1<1, b1 is a real number of 0≤b1<1, e1 is a real number of 0<e1<1, and a1+b1+e1=1.

Specifically, in the structures, a1 is a real number from 0.4 to 0.9, b1 is a real number from 0.1 to 0.4, e1 is a real number from 0.1 to 0.5, and a1+b1+e1=1.

More specifically, in the structures, a1 is a real number from 0.4 to 0.8, b1 is a real number from 0.1 to 0.4, e1 is a real number from 0.1 to 0.5, and a1+b1+e1=1.

In the structures, a1, b1, and e1 are determined by the equivalent weight of the monomers added during the preparation of the polymer.

In an exemplary embodiment of the present specification, the polymer may be prepared by using a publicly-known polymerization technique. For example, preparation methods such as Suzuki, Yamamoto, Stille, a C—N coupling reaction using a metal catalyst, and an arylation reaction using a metal catalyst may be applied.

In an exemplary embodiment of the present specification, the polymer may be substituted with deuterium. In this case, deuterium may be substituted by applying a method using a precursor material. For example, deuterium may be substituted by treating a non-deuterated monomer and/or polymer with a deuterated solvent in the presence of a Lewis acid H/D exchange catalyst.

In an exemplary embodiment of the present specification, the molecular weight of the polymer may be controlled by adjusting the ratio of the used monomers. In addition, in some exemplary embodiment, the molecular weight of the polymer may be controlled by using a quenching reaction.

In an exemplary embodiment of the present specification, the polymer may be used as a hole transport material. For example, the polymer may be a 'polymer for transporting holes'.

In an exemplary embodiment of the present specification, the polymer may be formed into a layer by a solution process. The term 'layer' is used interchangeably with the term 'membrane' or 'film', and refers to a coating which covers a desired region. This term is not limited by size. The region may be as large as the entire device, as small as a specific functional area such as an actual visual display, or as small as a single sub-pixel. Layers and films may be formed by any typical deposition technique including deposition, liquid deposition (continuous and discontinuous techniques), and thermal transfer. The continuous deposition technique includes spin coating, gravure coating, curtain coating, dip coating, slot-die coating, spray coating, and continuous nozzle coating, but is not limited thereto. The discontinuous deposition technique includes inkjet printing, gravure printing, and screen printing, but is not limited thereto.

In an exemplary embodiment of the present specification, the polymer has an intrinsic viscosity of less than 60 mL/g. This is especially useful for inkjet printing applications, and the lower viscosity may allow the inkjet printing to spray a concentrated liquid. Specifically, the polymer has an intrinsic viscosity of less than 50 mL/g, more specifically less than 40 mL/g, and more specifically less than 30 mL/g.

In an exemplary embodiment of the present specification, the polymer has an intrinsic viscosity of 20 mL/g or more and less than 60 mL/g, specifically 20 mL/g to 50 mL/g, and more specifically 20 mL/g to 40 mL/g.

An exemplary embodiment of the present specification provides a coating composition including the above-described polymer.

In an exemplary embodiment of the present specification, the coating composition further includes a solvent. In an exemplary embodiment of the present specification, the coating composition includes the polymer and the solvent.

In an exemplary embodiment of the present specification, the coating composition may be in a liquid phase. The "liquid phase" means that the composition is in a liquid state at room temperature under atmospheric pressure.

In an exemplary embodiment of the present specification, it is preferred that the solvent does not dissolve a material applied to a lower layer.

In an exemplary embodiment of the present specification, when the coating composition is applied to an organic material layer of an organic light emitting device, a solvent that does not dissolve a material in a lower layer is used. For example, when the coating composition is applied to a hole transport layer, a solvent that does not dissolve the material in the lower layer (first electrode, hole injection layer, and the like) is used. Accordingly, there is an advantage in that the hole transport layer can be introduced by the solution process.

In an exemplary embodiment of the present specification, since the coating composition has a large molecular weight, the resistance to solvent, during the heat treatment after coating, is improved.

For example, even though a coating composition is prepared by using a solvent that dissolves the polymer and a layer is manufactured by a solution process, the layer may have resistance to the same solvent after the heat treatment.

Therefore, when an organic material layer is formed by using the polymer and then subjected to a heat treatment process, a solution process can be performed when another organic material layer is applied.

In an exemplary embodiment of the present specification, examples of the solvent included in the coating composition include: a chlorine-based solvent such as chloroform, methylene chloride, 1,2-dichloroethane, 1,1,2-trichloroethane, chlorobenzene, and o-dichlorobenzene; an ether-based solvent such as tetrahydrofuran and dioxane; an aromatic hydrocarbon-based solvent such as toluene, xylene, trimethylbenzene, and mesitylene; a ketone-based solvent such as acetone, methyl ethyl ketone, and cyclohexanone; an ester-based solvent such as ethyl acetate, butyl acetate, and ethyl cellosolve acetate; a polyhydric alcohol such as ethylene glycol, ethylene glycol monobutyl ether, ethylene glycol monoethyl ether, ethylene glycol monomethyl ether, dimethoxy ethane, propylene glycol, diethoxymethane, triethylene glycol monoethyl ether, glycerin, and 1,2-hexanediol and a derivative thereof; an alcohol-based solvent such as methanol, ethanol, propanol, isopropanol, and cyclohexanol; a sulfoxide-based solvent such as dimethyl sulfoxide; an amide-based solvent such as N-methyl-2-pyrrolidone and N,N-dimethylformamide; a benzoate-based solvent such as methyl benzoate, butyl benzoate, and 3-phenoxybenzoate; and a solvent such as tetralin, but the solvent can be used as long as the solvent can dissolve or disperse the polymer according to an exemplary embodiment of the present specification, and is not limited thereto.

In an exemplary embodiment of the present specification, the solvents may be used either alone or in a mixture of two or more solvents.

In an exemplary embodiment of the present specification, a boiling point of the solvent is preferably 40° C. to 350° C., and more preferably 80° C. to 330° C., but is not limited thereto.

In an exemplary embodiment of the present specification, a concentration of the polymer in the coating composition is preferably 0.1 wt/v % to 20 wt/v %, and more preferably 0.5 wt/v % to 10 wt/v %, but is not limited thereto.

An exemplary embodiment of the present specification provides an organic light emitting device including: a first electrode;

a second electrode provided to face the first electrode; and an organic material layer having one or more layers, which includes a light emitting layer provided between the first electrode and the second electrode, in which one or more layers of the organic material layer include the polymer.

In an exemplary embodiment of the present specification, the first electrode is a positive electrode, and the second electrode is a negative electrode. In another exemplary embodiment, the first electrode is a negative electrode, and the second electrode is a positive electrode.

In another exemplary embodiment, the organic light emitting device may be a normal type organic light emitting device in which a positive electrode, an organic material layer having one or more layers, and a negative electrode are sequentially stacked on a substrate.

In another exemplary embodiment, the organic light emitting device may be an inverted type organic light emitting device in which a negative electrode, an organic material layer having one or more layers, and a positive electrode are sequentially stacked on a substrate.

The organic material layer of the organic light emitting device of the present specification may also be composed of a single-layered structure, but may be composed of a multi-layered structure in which an organic material layer having two or more layers is stacked. For example, the organic light emitting device of the present invention may have a structure including a hole injection layer, a hole transport layer, a light emitting layer, an electron transport layer, an electron injection layer, and the like as organic material layers. However, the structure of the organic light emitting device is not limited thereto, and may include a fewer number of organic layers.

For example, the structure of the organic light emitting device according to an exemplary embodiment of the present specification is exemplified in FIG. 1.

FIG. 1 exemplifies the structure of an organic light emitting device in which a substrate 1, a positive electrode 2, a light emitting layer 3, and a negative electrode 4 are sequentially stacked.

FIG. 2 exemplifies the structure of an organic light emitting device in which a substrate 1, a positive electrode 2, a hole injection layer 5, a hole transport layer 6, a light emitting layer 3, an electron injection and transport layer 7, and a negative electrode 4 are sequentially stacked.

FIGS. 1 and 2 exemplify an organic light emitting device, and the structure of the organic light emitting device of the present invention is not limited thereto. When the organic light emitting device includes a plurality of organic material layers, the organic material layers may be formed of the same material or different materials.

The organic light emitting device of the present specification may be manufactured by the materials and methods known in the art, except that one or more layers of the organic material layer are manufactured so as to include the polymer. Specifically, for the organic light emitting device, one or more layers of the organic material layer may be formed by using a coating composition including the polymer.

For example, the organic light emitting device of the present specification may be manufactured by sequentially stacking a positive electrode, an organic material layer, and a negative electrode on a substrate. In this case, the organic light emitting device may be manufactured by depositing a metal or a metal oxide having conductivity, or an alloy thereof on a substrate to form a positive electrode, forming an organic material layer including a hole injection layer, a hole transport layer, a light emitting layer, and an electron transport layer thereon, and then depositing a material, which may be used as a negative electrode, thereon, by using a physical vapor deposition (PVD) method such as sputtering or e-beam evaporation. In addition to the method described above, an organic light emitting device may be made by sequentially depositing a negative electrode material, an organic material layer, and a positive electrode material on a substrate.

The present specification also provides a method for manufacturing an organic light emitting device formed by using the coating composition.

Specifically, in an exemplary embodiment of the present specification, the method includes: preparing a substrate; forming a first electrode on the substrate; forming an organic material layer having one or more layers on the first electrode; and forming a second electrode on the organic material layer, and one or more layers of the organic material layer are formed by using the coating composition.

In an exemplary embodiment of the present specification, the organic material layer formed by using the coating composition is formed by using spin coating.

In another exemplary embodiment, the organic material layer formed by using the coating composition is formed by a printing method.

In an exemplary embodiment of the present specification, examples of the printing method include inkjet printing, nozzle printing, offset printing, transfer printing or screen printing, and the like, but are not limited thereto.

The coating composition according to an exemplary embodiment of the present specification is suitable for a solution process due to the structural characteristic thereof, so that the organic material layer may be formed by a printing method, and as a result, there is an economic effect in terms of time and costs when a device is manufactured.

In an exemplary embodiment of the present specification, the forming of the organic material layer formed by using the coating composition includes: coating the first electrode with the coating composition; and heat-treating or light-treating the coated coating composition.

In another exemplary embodiment, a heat treatment time in the heat-treating of the coating composition may be within 1 hour. The heat treatment time may be specifically within 30 minutes.

In an exemplary embodiment of the present specification, the atmosphere for heat-treating the organic material layer formed by using the coating composition is preferably an inert gas atmosphere such as argon or nitrogen.

When the organic material layer formed by using the coating composition is formed by a method including the heat-treating or light-treating of the coated coating composition, resistance to a solvent is increased, so that a plurality of layers may be formed by repeatedly performing solution deposition and cross-linking methods, and stability is increased, so that the service life characteristic of the device may be increased.

In an exemplary embodiment of the present specification, the organic material layer including the polymer is a hole injection layer, a hole transport layer, or a layer which injects and transports holes simultaneously.

In an exemplary embodiment of the present specification, the first electrode is a positive electrode, and the second electrode is a negative electrode.

According to another exemplary embodiment, the first electrode is a negative electrode, and the second electrode is a positive electrode.

The organic light emitting device of the present invention may be stacked as a structure in the following examples.

(1) Positive electrode/Hole transport layer/Light emitting layer/Negative electrode (2) Positive electrode/Hole injection layer/Hole transport layer/Light emitting layer/Negative electrode (3) Positive electrode/Hole injection layer/Hole buffer layer/Hole transport layer/Light emitting layer/Negative electrode (4) Positive electrode/Hole transport layer/Light emitting layer/Electron transport layer/Negative electrode (5) Positive electrode/Hole transport layer/Light emitting layer/Electron transport layer/Electron injection layer/Negative electrode (6) Positive electrode/Hole injection layer/Hole transport layer/Light emitting layer/Electron transport layer/Negative electrode (7) Positive electrode/Hole injection layer/Hole transport layer/Light emitting layer/Electron transport layer/Electron injection layer/Negative electrode (8) Positive electrode/Hole injection layer/Hole buffer layer/Hole transport layer/Light emitting layer/Electron transport layer/Negative electrode (9) Positive electrode/Hole injection layer/Hole buffer layer/Hole transport layer/Light emitting layer/Electron transport layer/Electron injection layer/Negative electrode

(10) Positive electrode/Hole transport layer/Electron blocking layer/Light emitting layer/Electron transport layer/Negative electrode

(11) Positive electrode/Hole transport layer/Electron blocking layer/Light emitting layer/Electron transport layer/Electron injection layer/Negative electrode

(12) Positive electrode/Hole injection layer/Hole transport layer/Electron blocking layer/Light emitting layer/Electron transport layer/Negative electrode

(13) Positive electrode/Hole injection layer/Hole transport layer/Electron blocking layer/Light emitting layer/Electron transport layer/Electron injection layer/Negative electrode

(14) Positive electrode/Hole transport layer/Light emitting layer/Hole blocking layer/Electron transport layer/Negative electrode

(15) Positive electrode/Hole transport layer/Light emitting layer/Hole blocking layer/Electron transport layer/Electron injection layer/Negative electrode

(16) Positive electrode/Hole injection layer/Hole transport layer/Light emitting layer/Hole blocking layer/Electron transport layer/Negative electrode

(17) Positive electrode/Hole injection layer/Hole transport layer/Light emitting layer/Hole blocking layer/Electron transport layer/Electron injection layer/Negative electrode

(18) Positive electrode/Hole injection layer/Hole transport layer/Electron blocking layer/Light emitting layer/Hole blocking layer/Electron injection and transport layer/Negative electrode In the structures, the "Electron transport layer/Electron injection layer" may be replaced with "Electron injection and transport layer".

In an exemplary embodiment of the present specification, as the positive electrode material, materials having a high work function are usually preferred so as to facilitate the injection of holes into an organic material layer. Specific examples of the positive electrode material which may be used in the present invention include: a metal such as vanadium, chromium, copper, zinc, and gold, or an alloy thereof; a metal oxide such as zinc oxide, indium oxide, indium tin oxide (ITO), and indium zinc oxide (IZO); a combination of a metal and an oxide, such as ZnO:Al or $SnO_2$:Sb; a conductive polymer such as poly(3-methylthiophene), poly[3,4-(ethylene-1,2-dioxy)thiophene] (PEDOT), polypyrrole, and polyaniline; and the like, but are not limited thereto.

In an exemplary embodiment of the present specification, as a negative electrode material, materials having a low work function are usually preferred so as to facilitate the injection of electrons into an organic material layer. Specific examples of a negative electrode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al, and the like, but are not limited thereto.

In an exemplary embodiment of the present specification, the hole injection layer is a layer which injects holes from an electrode, and a hole injection material is preferably a compound which has a capability of transporting holes and thus has an effect of injecting holes at a positive electrode and an excellent effect of injecting holes into a light emitting layer or a light emitting material, prevents excitons produced from the light emitting layer from moving to an electron injection layer or an electron injection material, and is also excellent in the ability to form a thin film. In addition, the highest occupied molecular orbital (HOMO) of the hole injection material is preferably a value between the work function of the positive electrode material and the HOMO of the neighboring organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based electrically conductive polymers, and the like, but are not limited thereto.

In an exemplary embodiment of the present specification, the hole transport layer is a layer which accepts holes from a hole injection layer and transports the holes to a light emitting layer, and a hole transport material is suitably a material having high hole mobility which may accept holes from a positive electrode or a hole injection layer and transfer the holes to a light emitting layer. In an exemplary embodiment of the present specification, the hole transport layer includes the polymer.

In an exemplary embodiment of the present specification, the light emitting layer includes an organic compound. The organic compound is a material which may receive holes and electrons from a hole transport layer and an electron transport layer, respectively, and combine the holes and the electrons to emit light in a visible ray region, and is preferably a material having good quantum efficiency to fluorescence or phosphorescence. Specific examples thereof include: 8-hydroxy-quinoline aluminum complexes ($Alq_3$); carbazole-based compounds; dimerized styryl compounds; BAlq; 10-hydroxybenzoquinoline-metal compounds; benzoxazole-based, benzothiazole-based and benzimidazole-based compounds; poly(p-phenylenevinylene) (PPV)-based polymers; spiro compounds; polyfluorene, rubrene, and the like, but are not limited thereto.

In an exemplary embodiment of the present specification, the light emitting layer may include a host material and a dopant material. Examples of the host material include fused aromatic ring derivatives, or hetero ring-containing compounds, and the like. For example, examples of the fused aromatic ring derivatives include anthracene derivatives, pyrene derivatives, naphthalene derivatives, pentacene derivatives, phenanthrene compounds, fluoranthene compounds, and the like, and examples of the hetero ring-containing compounds include carbazole derivatives, dibenzofuran derivatives, ladder-type furan compounds, pyrimidine derivatives, and the like, but the examples thereof are not limited thereto. Examples of the dopant material include aromatic amine derivatives, styrylamine compounds, boron complexes, fluoranthene compounds, metal complexes, and the like. Specifically, the aromatic amine derivative is a fused aromatic ring derivative substituted with a substituted or unsubstituted arylamino group, and examples thereof include fluorene substituted with an arylamino group, benzofluorene, pyrene, anthracene, chrysene, periflanthene, and the like, and the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamino group is or are substituted or unsubstituted. Specifically, examples of the styrylamine compound include styrylamine, styryldiamine, styryltriamine, styryltetramine, and the like, but are not limited thereto. Further, examples of the metal complex include iridium complexes, platinum complexes, and the like, but are not limited thereto.

In an exemplary embodiment of the present specification, the host material is an anthracene derivative, and the dopant material is a benzofluorene-based compound substituted with an arylamine group. Specifically, the host material is a deuterated anthracene derivative, and the dopant material is a bis(diarylamino)benzofluorene-based compound.

In an exemplary embodiment of the present specification, the light emitting layer includes a quantum dot. For example, the light emitting layer may include a matrix resin and a quantum dot, and as the types and contents of quantum dots, those known in the art may be used.

The case where the light emitting layer includes a quantum dot exhibits a lower HOMO energy level than the case where the light emitting layer includes an organic compound, so that a common layer also needs to show a low HOMO energy level. Since the polymer according to an exemplary embodiment of the present specification exhibits a low HOMO energy level by including a halogen group, it is possible to introduce a quantum dot into the light emitting layer.

In an exemplary embodiment of the present specification, the common layer is a hole injection layer, a hole transport layer, a layer which simultaneously injects and transport holes, an electron injection layer, an electron transport layer, or a layer which simultaneously injects and transports electrons.

In an exemplary embodiment of the present specification, the electron transport layer is a layer which accepts electrons from an electron injection layer and transports the electrons to a light emitting layer, and an electron transport material is suitably a material having high electron mobility which may proficiently accept electrons from a negative electrode and transfer the electrons to a light emitting layer. Specific examples thereof include: Al complexes of 8-hydroxyquinoline; complexes including $Alq_3$; organic radical compounds; hydroxyflavone-metal complexes, and the like, but are not limited thereto. An electron transport layer may be used with any desired negative electrode material, as used according to the related art. In particular, examples of an appropriate negative electrode material include a typical material which has a low work function, followed by an aluminum layer or a silver layer. Specific examples thereof include cesium, barium, calcium, ytterbium, and samarium, in each case followed by an aluminum layer or a silver layer.

In an exemplary embodiment of the present specification, the electron injection layer is a layer which injects electrons from an electrode, and an electron injection material is preferably a compound which has a capability of transporting electrons, has an effect of injecting electrons from a negative electrode and an excellent effect of injecting electrons into a light emitting layer or a light emitting material, prevents excitons produced from the light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, bathocuproine (BCP), and the like, and derivatives thereof, metal complex compounds, nitrogen-containing 5-membered ring derivatives, and the like, but are not limited thereto.

In an exemplary embodiment of the present specification, examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo[h] quinolinato) beryllium, bis(10-hydroxybenzo[h] quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

In an exemplary embodiment of the present specification, the hole blocking layer is a layer which blocks holes from reaching a negative electrode, and may be generally formed under the same conditions as those of the hole injection layer. Specific examples thereof include oxadiazole derivatives or triazole derivatives, phenanthroline derivatives, BCP, aluminum complexes, and the like, but are not limited thereto.

In an exemplary embodiment of the present specification, a layer adjacent to an organic material layer including the polymer represented by Chemical Formula 1; or the polymer including the unit represented by Chemical Formula 2 and the end group represented by Chemical Formula 5, for example, a bank layer includes a compound having fluorine as a substituent.

For example, when the polymer represented by Chemical Formula 1 is included in a hole transport layer, one or more of a bank layer adjacent to a hole transport layer, a hole injection layer, and a light emitting layer include fluorine.

When a layer adjacent to an organic material layer including the polymer represented by Chemical Formula 1; or the polymer including the unit represented by Chemical Formula 2 and the end group represented by Chemical Formula 5 includes fluorine, there is an effect capable of forming a uniform layer because the dipole moment is changed depending on the fluorine.

The organic light emitting device according to the present specification may be a top emission type, a bottom emission type, or a dual emission type according to the materials to be used.

MODE FOR INVENTION

Hereinafter, the present specification will be described in detail with reference to Examples for specifically describing the present specification. However, the Examples according to the present specification may be modified in various forms, and it is not interpreted that the scope of the present application is limited to the Examples described in detail below. The Examples of the present application are provided to explain the present specification more completely to a person with ordinary skill in the art.

Synthesis Example 1. Preparation of Monomer A-1

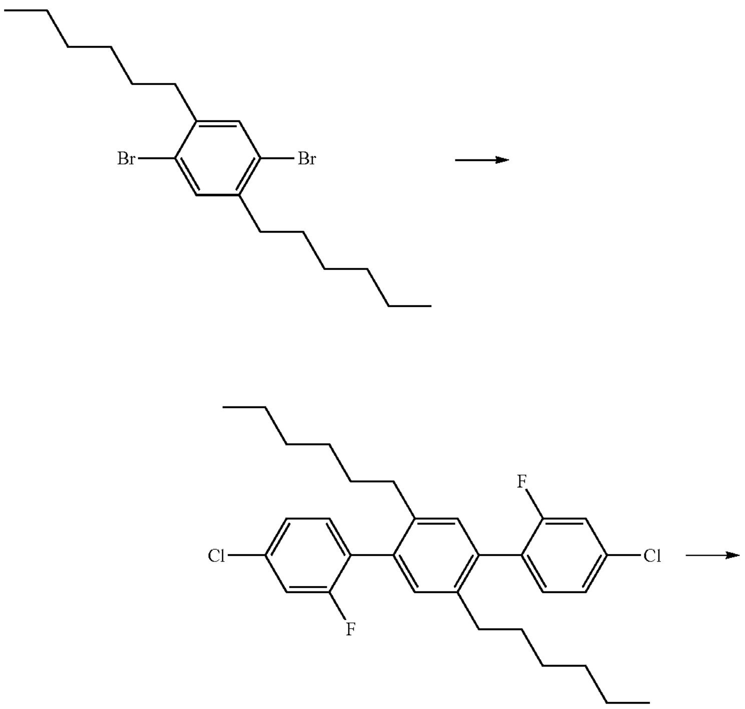

a-1

-continued
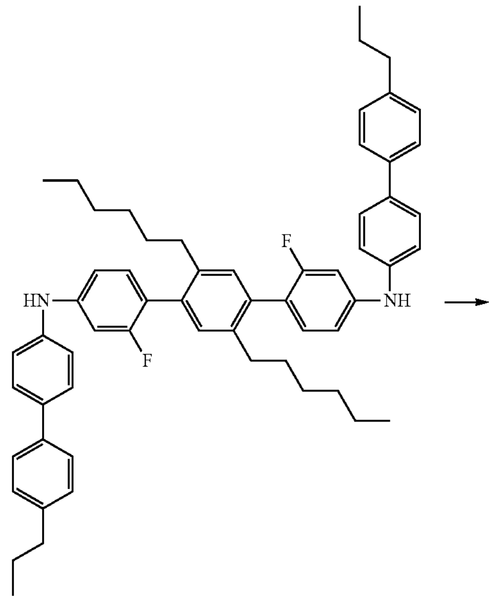
a-2
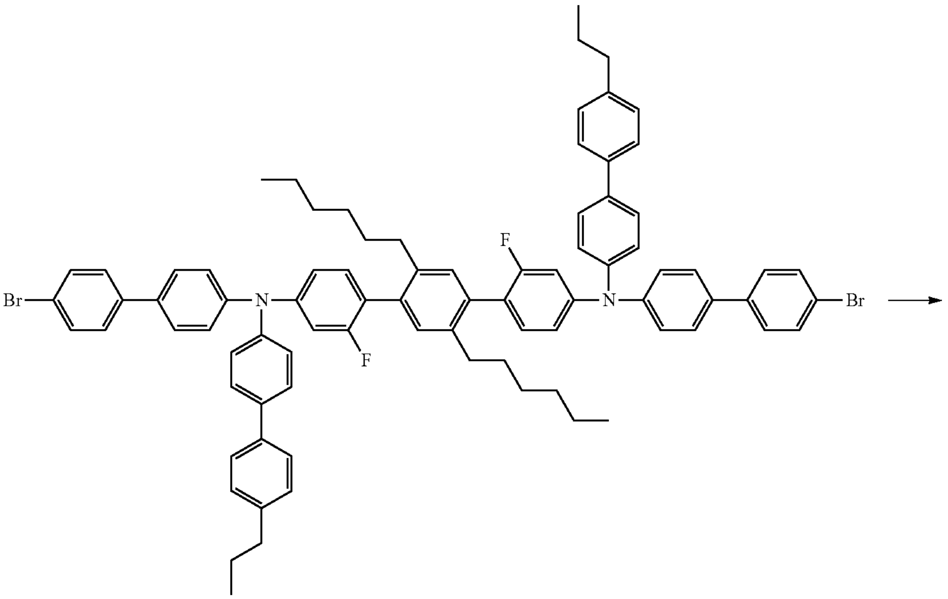
A

-continued

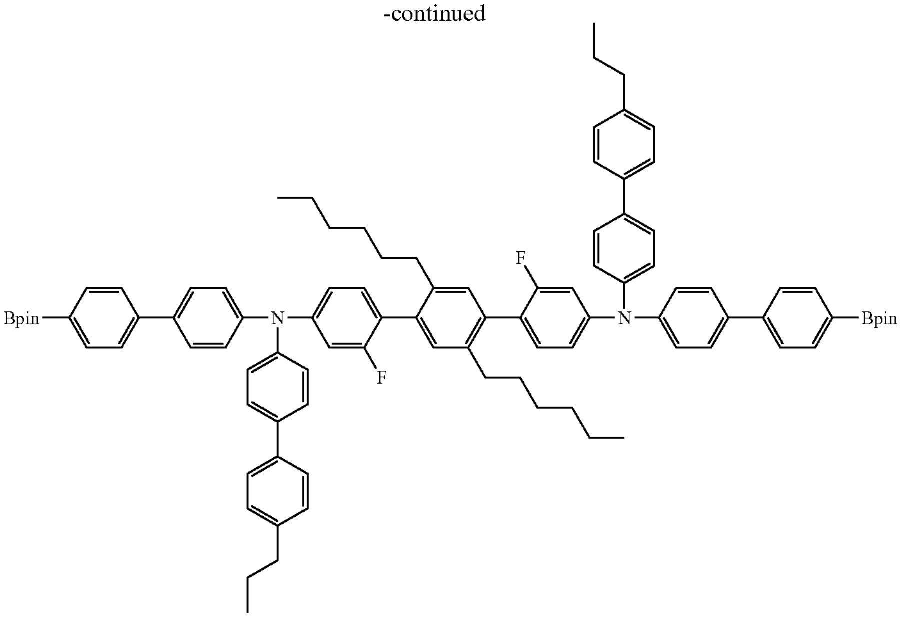

A-1

(1) Preparation of Compound a-1

10 g (1.00 eq) of 1,4-dibromo-2,5-dihexylbenzene and 10.5 g (2.05 eq) of 2-(4-chloro-2-fluorophenyl)-4,4,5,5-tetramethyl-1,3,2-dioxaborolane were dissolved in 200 mL of toluene in a round-bottom flask equipped with a condenser. When the solution was completely dissolved, 100 mL of a 2 M aqueous sodium carbonate solution, 0.08 g (0.005 eq) of bis(di-tert-butyl(4-dimethylaminophenyl) phosphine)dichloropalladium (II), and three drops of a phase transition catalyst Aliquit336 were introduced thereinto, and the resulting mixture was refluxed at 90° C. for 12 hours. After the reaction was terminated with DI water, 10.86 g of Compound a-1 in a solid state was obtained by extracting an organic solvent.

FIG. 3 illustrates NMR measurement results of Compound a-1.

(2) Preparation of Compound a-2

10 g (1.00 eq) of Compound a-1 and 9.23 g (2.20 eq) of 4'-propyl-[1,1'-biphenyl]-4-amine were dissolved in 200 mL of xylene in a round bottom flask equipped with a condenser. When the solution was completely dissolved, 4.77 g (2.50 eq) of sodium tert-butoxide and 0.50 g (0.05 eq) of bis(tri-tert-butylphosphine)palladium(0) were introduced thereinto, and then the resulting mixture was refluxed at 120° C. for 3 hours. After the reaction was terminated with DI water, a white solid Compound a-2 was obtained by extracting an organic solvent with ethyl acetate and distilled water and precipitating the residue with toluene and hexane.

FIG. 4 illustrates NMR measurement results of Compound a-2.

(3) Preparation of Monomer A 8.00 g (1.00 eq) of Compound a-2, 9.77 g (3.00 eq) of 4-bromo-4'-iodo-1,1'-biphenyl, and 2.60 g (3.00 eq) of sodium tert-butoxide were dissolved in 200 mL of toluene in a round bottom flask equipped with a condenser. When the solution was completely dissolved, 0.16 g (0.02 eq) of tris(dibenzylideneacetone)dipalladium(0) and 0.20 g (0.04 eq) of 1,1'-bis(diphenylphosphino)ferrocene were introduced thereinto, and then the resulting mixture was refluxed at 90° C. for 8 hours. After the reaction was terminated with DI water, an organic solvent was extracted with ethyl acetate and distilled water, and 99.1% pure Monomer A was obtained by column chromatography.

FIG. 5 illustrates NMR measurement results of Monomer A.

FIG. 6 illustrates HPLC measurement results of Monomer A.

(4) Preparation of Monomer A-1

10.00 g (1.00 eq) of Monomer A, 14 g (2.00 eq) of bis(pinacolato)diboron), and 1.60 g (3.00 eq) of potassium tert-butoxide were dissolved in 200 mL of toluene in a round bottom flask equipped with a condenser. When the solution was completely dissolved, 0.20 g (0.04 eq) of [1,1'-bis (diphenylphosphino)ferrocene]dichloropalladium(II) (Pd (dppf)) was introduced thereinto, and then the resulting mixture was refluxed at 90° C. for 8 hours. After the reaction was terminated with DI water, an organic solvent was extracted with ethyl acetate and distilled water, and 99.3% pure Monomer A-1 was obtained by column chromatography.

Synthesis Example 2. Preparation of Polymer 1
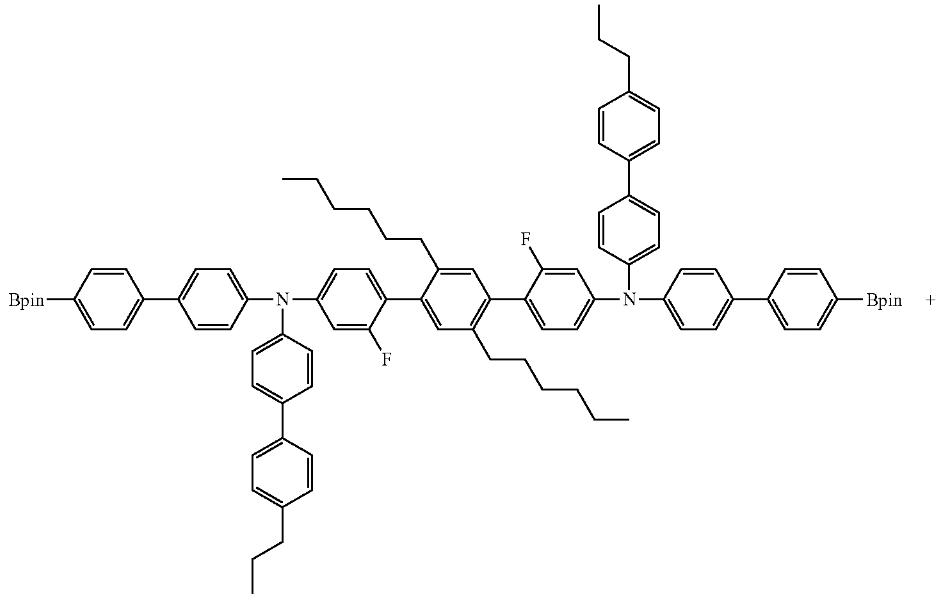
A-1
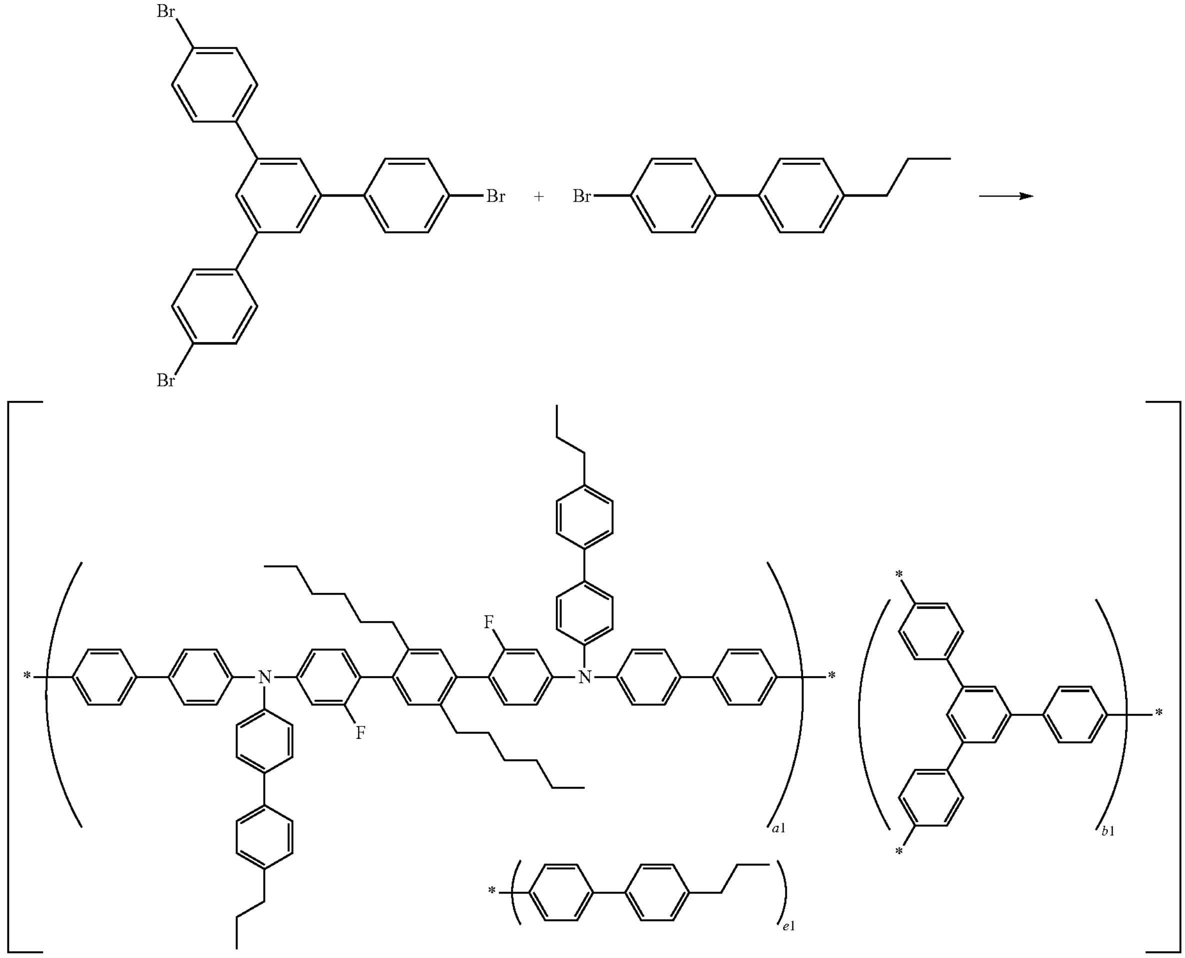
1

After Monomer A-1 (0.765 mmol), 4,4"-dibromo-5'-(4-bromophenyl)-1,1':3',1"-terphenyl (0.158 mmol), and 4-bromo-4'-propyl-1,1'-biphenyl (0.369 mmol) were put into a round bottom flask and dissolved in toluene (11 mL), tetrakis (triphenylphosphine) palladium (0) ($Pd(PPh_3)_4$) (0.05 mmol), 5 mL of a 2 M potassium carbonate ($K_2CO_3$) solution, and 0.1 mL of a phase transition catalyst Aliquit336 were injected thereinto, and then the resulting mixture was refluxed at 100° C. for 12 hours. The reaction was terminated by slowly adding the reactant dropwise to methanol, and then the mixture was stirred for 45 minutes, and the resulting solid was filtered. The dried solid was dissolved in toluene (1% wt/v) and purified by being allowed to pass through a column containing silica gel and basic aluminum oxide (6 g each). Polymer 1 (5.2 g) was prepared by triturating the obtained toluene solution with acetone.

Synthesis Example 3. Preparation of Polymer 2

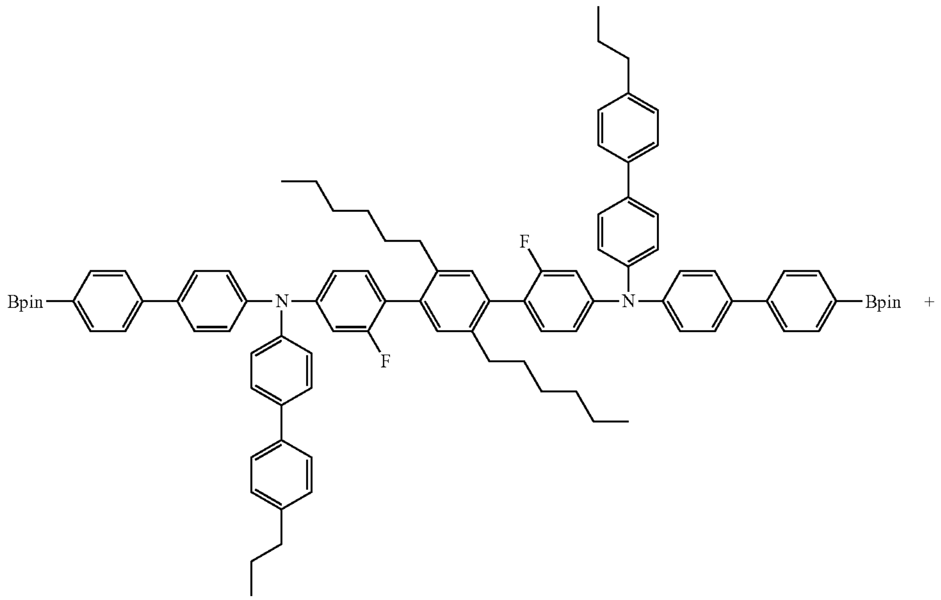

A-1

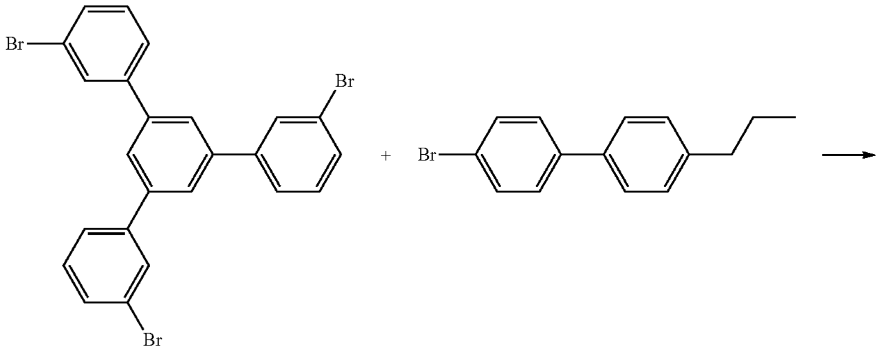

-continued
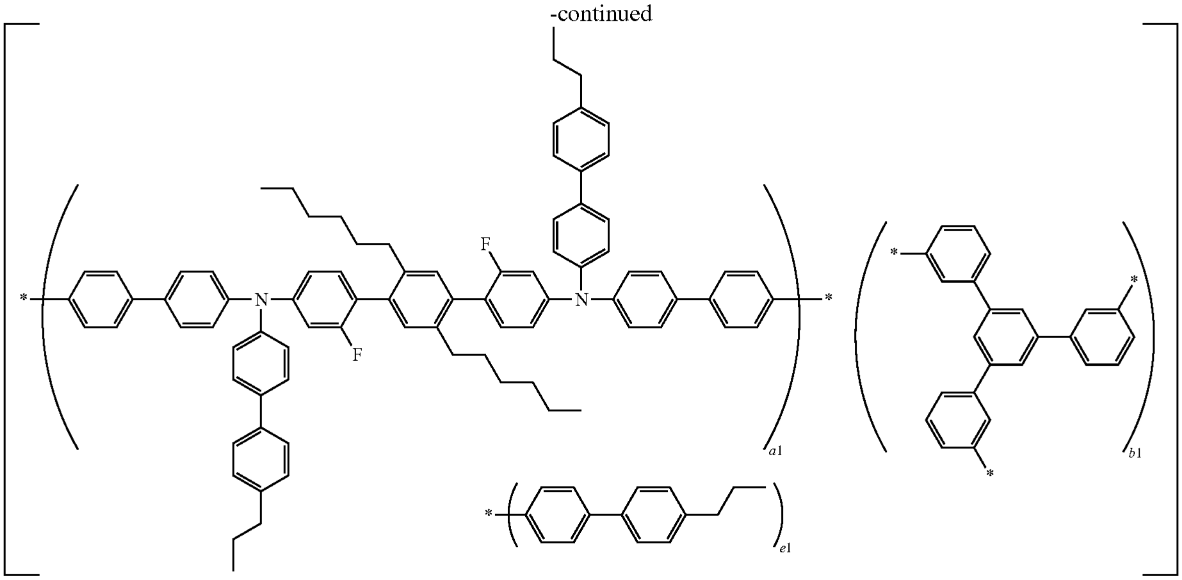
2
Polymer 2 was prepared in the same manner as in Synthesis Example 2, except that 3,3"-dibromo-5'-(3-bromophenyl)-1,1':3',1"-terphenyl was used instead of 4,4"-dibromo-5'-(4-bromophenyl)-1,1':3',1"-terphenyl in Synthesis Example 2.
Synthesis Example 4. Preparation of Polymer 3
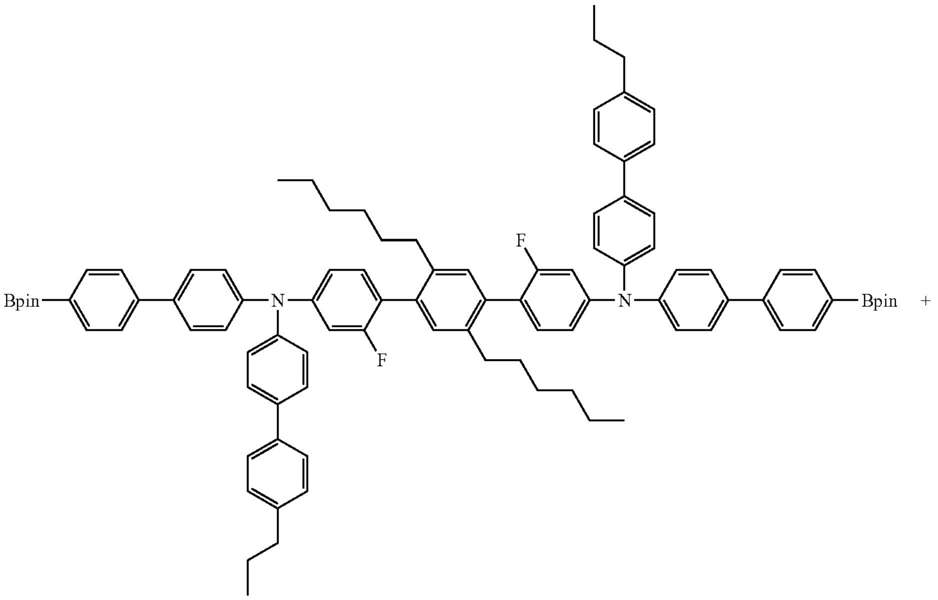
A-1

-continued
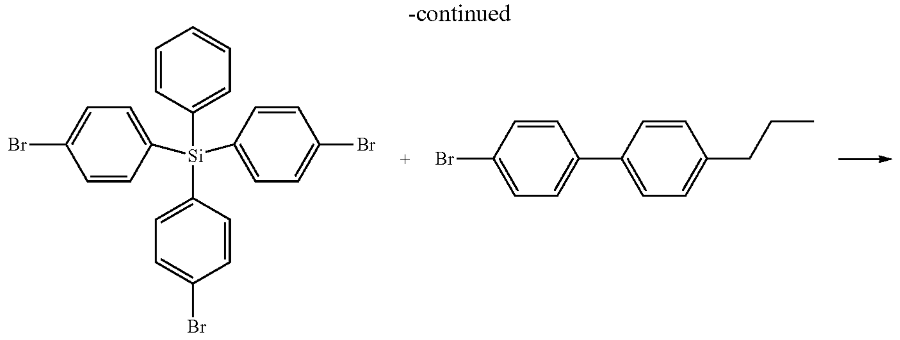
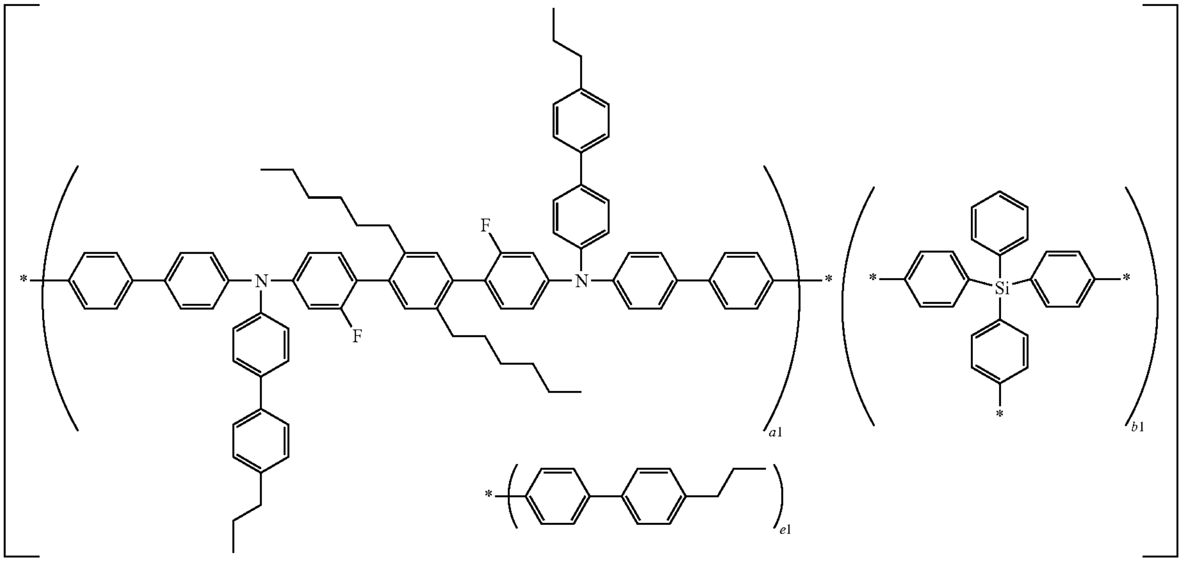
3
Polymer 3 was prepared in the same manner as in Synthesis Example 2, except that tris(4-bromophenyl) (phenyl) silane was used instead of 4,4"-dibromo-5'-(4-bromophenyl)-1,1':3',1"-terphenyl in Synthesis Example 2.

Synthesis Example 5. Preparation of Polymer 4
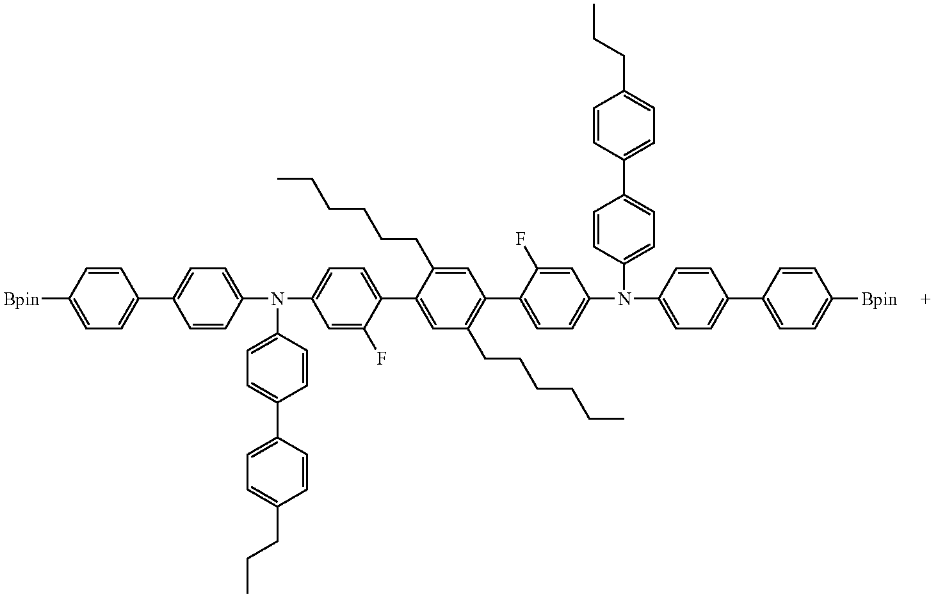
A-1
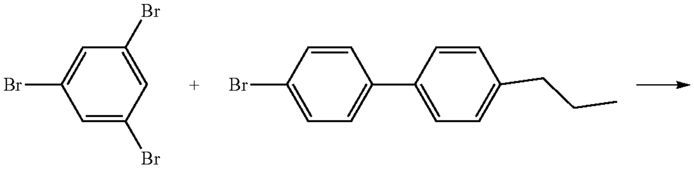
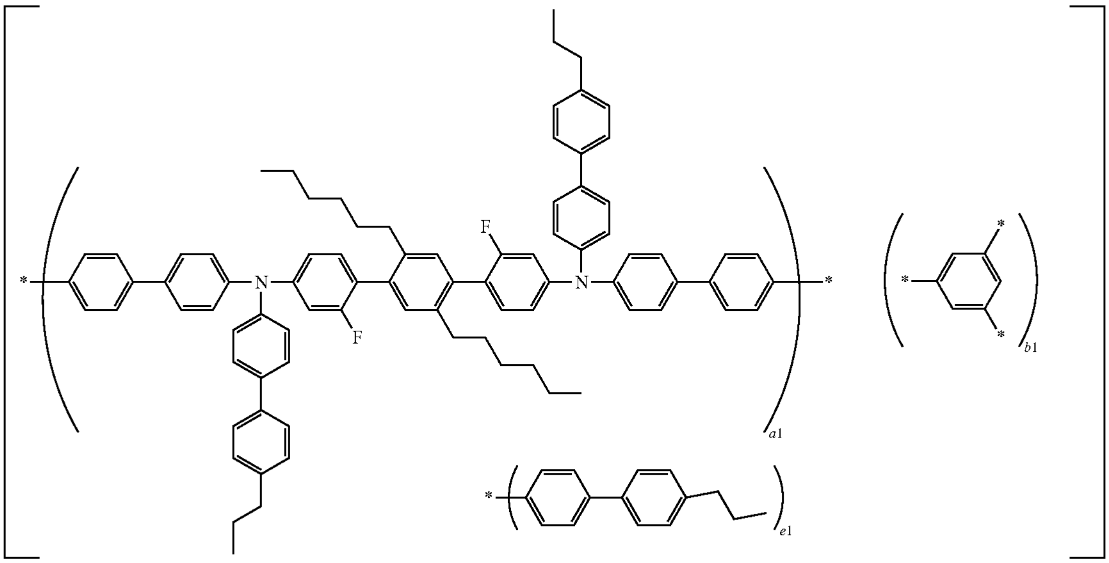
4
Polymer 4 was prepared in the same manner as in Synthesis Example 2, except that 1,3,5-tribromobenzene was used instead of 4,4"-dibromo-5'-(4-bromophenyl)-1,1':3',1"-terphenyl in Synthesis Example 2.

Synthesis Example 6. Preparation of Polymer 5
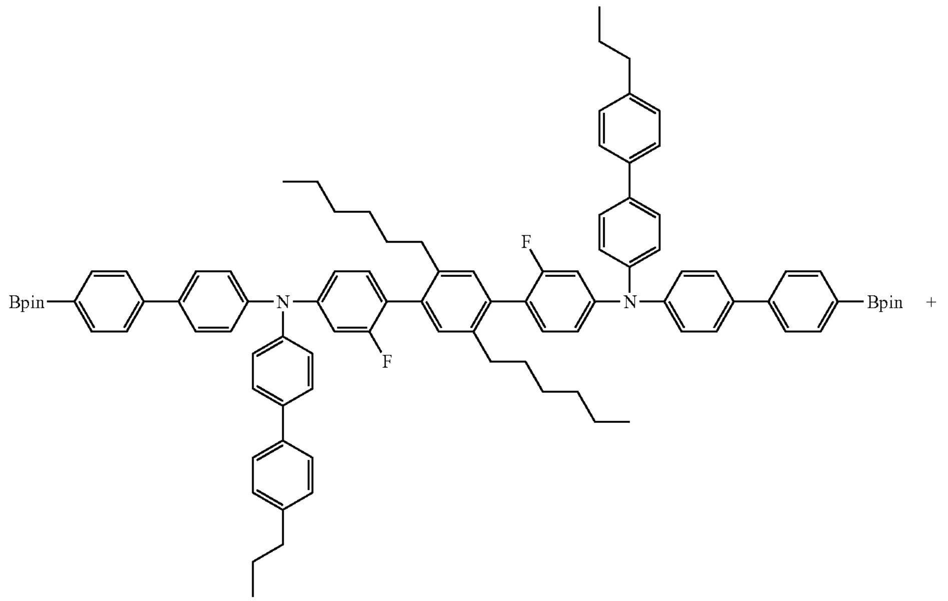
A-1
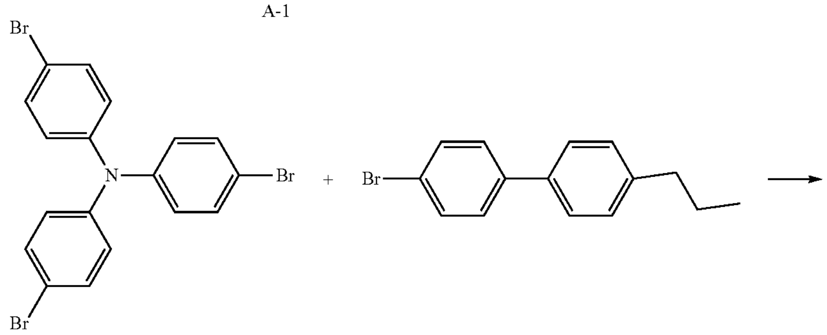
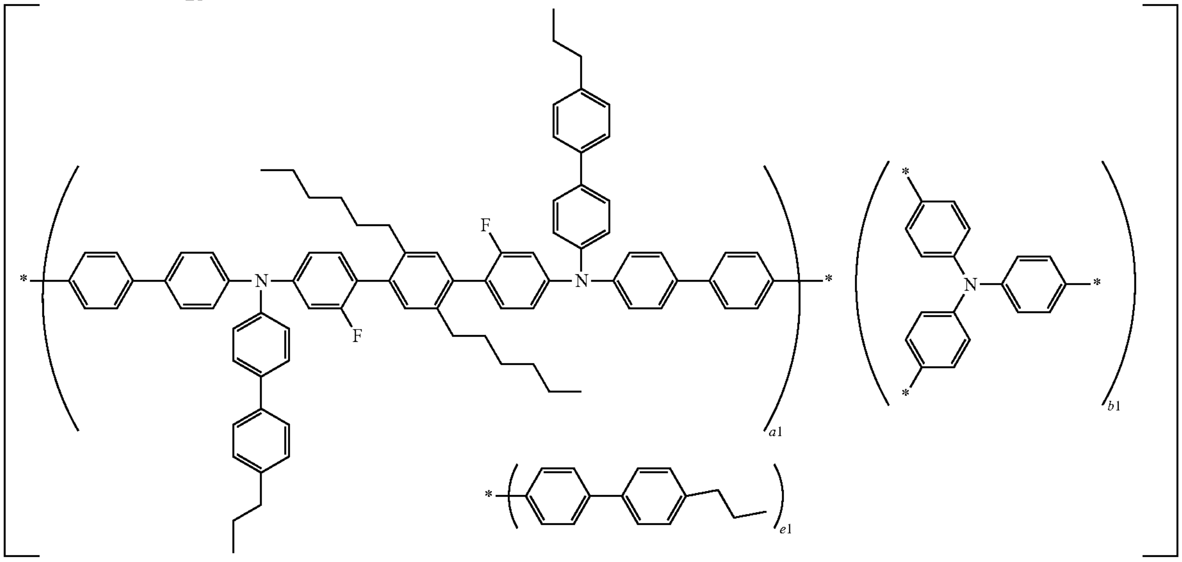
5
Polymer 5 was prepared in the same manner as in Synthesis Example 2, except that tris(4-bromophenyl)amine was used instead of 4,4"-dibromo-5'-(4-bromophenyl)-1,1':3',1"-terphenyl in Synthesis Example 2.

Comparative Synthesis Example 1. Preparation of Comparative Polymer C1
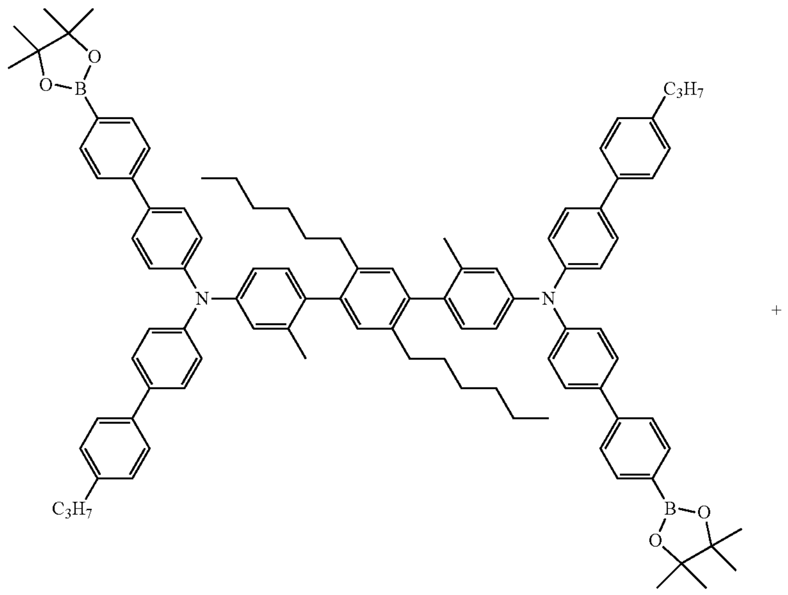
B
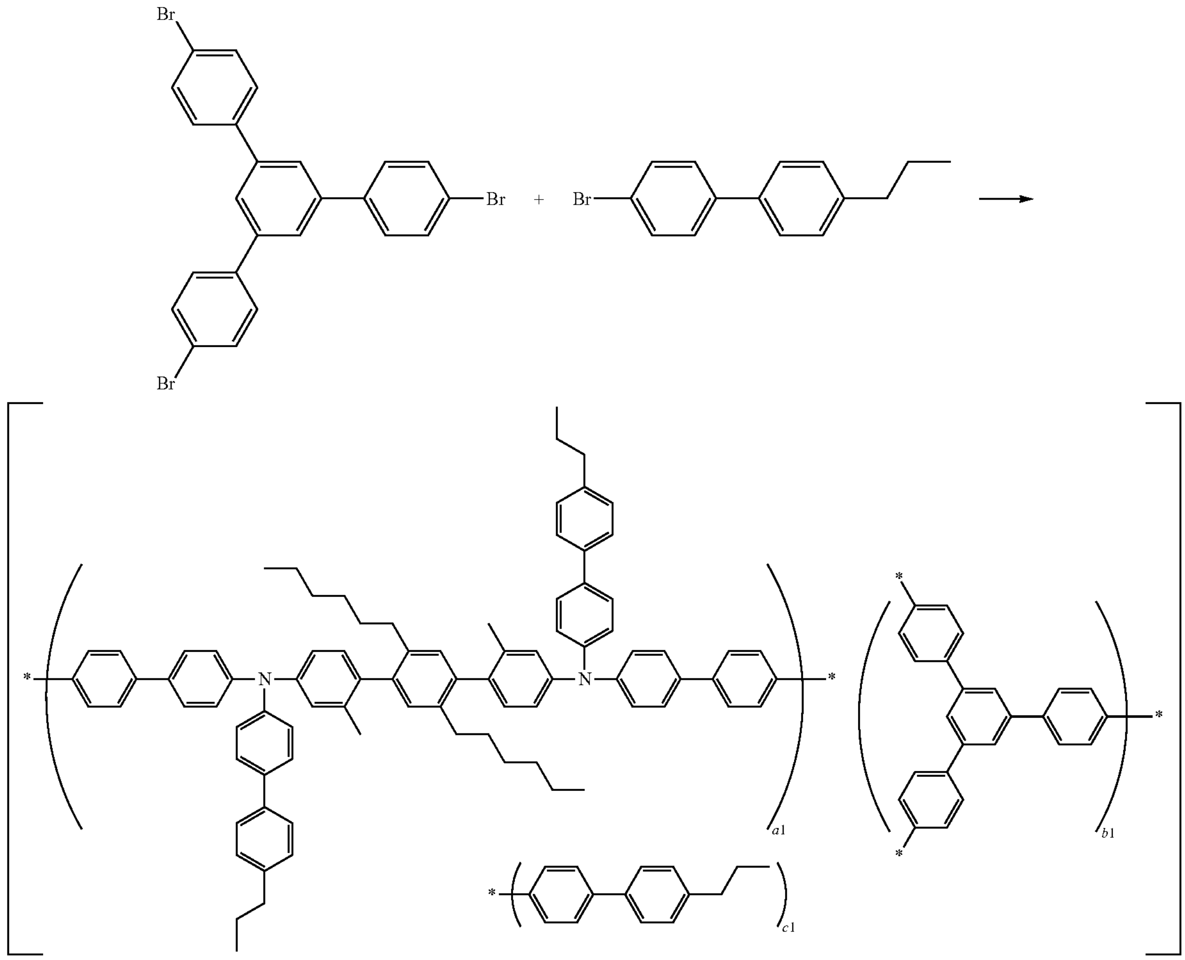
C1

Comparative Compound C1 was prepared in the same manner as in Synthesis Example 2, except that Monomer B was used instead of Monomer A-1 in Synthesis Example 2.

The number average molecular weight (Mn), weight average molecular weight (Mw), and molecular weight distribution (PDI) of Polymers 1 to 5 prepared in Synthesis Examples 2 to 6 were measured, and are shown in the following Table 1.

The number average molecular weight, weight average molecular weight, and molecular weight distribution were measured by using GPC, and measured by using a solution in which the synthesized polymer was dissolved in 1 wt % of THF.

TABLE 1

| Polymer | a1:b1:e1 (molar ratio) | Mn | Mw | PDI |
|---|---|---|---|---|
| 1 | 58:12:30 | 36,000 | 116,000 | 3.18 |
| 2 | 56:19:25 | 35,000 | 106,000 | 2.97 |
| 3 | 57:18:25 | 35,000 | 104,000 | 2.93 |
| 4 | 56:18:26 | 39,000 | 129,000 | 3.23 |
| 5 | 58:15:27 | 38,000 | 110,000 | 2.89 |

Experimental Example 1. Measurement of Thin Film Retention Rate

Coating Composition 1 was prepared by dissolving Polymer 5 (weight average molecular weight: 110,000 g/mol) prepared in Synthesis Example 6 in toluene at a concentration of 2 wt %.

Further, a polymer was prepared in the same manner as in Synthesis Example 5, but the synthesis was stopped when the weight average molecular weight was 10,000 g/mol, and Coating Composition 2 was prepared by dissolving the polymer having a weight average molecular weight of 10,000 g/mol in toluene at a concentration of 2 wt %.

A thin film was formed by spin-coating Coating Compositions 1 and 2, respectively on glass. The thin film was heat-treated at 220° C. for 30 minutes, and UV absorbance was measured. The thin film was dipped again in toluene for 10 minutes and then dried, and UV absorbance was measured. From the comparison of sizes of the maximum peaks of UV absorbance before and after the dipping, the thin film retention rates could be confirmed.

FIG. 7 is a view illustrating the film retention experimental results of a thin film formed of Coating Composition 1.

FIG. 8 is a view illustrating the film retention experimental results of a thin film formed of Coating Composition 2.

In FIGS. 7 and 8, (a) is a UV measurement result immediately after the thin film is heat-treated (before being dipped in toluene for 10 minutes), and (b) is a UV measurement result after the heat-treated thin film is dipped in toluene for 10 minutes.

Through FIG. 7, it can be confirmed that the thin film retention rate is 100% in the case of the thin film formed of Coating Composition 1 including a polymer having a high weight average molecular weight. In contrast, through FIG. 8, it can be confirmed that 20% of the thin film is damaged in the case of the thin film formed of Coating Composition 2 including a polymer having a low weight average molecular weight.

Through this, it can be confirmed that the thin film retention rate varies depending on the molecular weight of the polymer. Further, by applying a polymer having a high weight average molecular weight to the organic material layer, it can be predicted that the stability will be improved without loss of the formed organic material layer even though an additional layer is applied by the solution process.

Experimental Example 2. Manufacture of Organic Light Emitting Device

Example 1

(1) Material

As a dopant, the bis(diarylamino)benzofluorene-based compound described in U.S. Pat. No. 8,465,848B2 was used.

As an HIL, the material described in U.S. Pat. No. 7,351,358B2 was used. Specifically, a hole injection material prepared from an aqueous dispersion of an electrically conductive polymer and a polymerizable fluorinated sulfonic acid was used.

As a host, the deuterated anthracene compound described in WO2011-028216A1 was used.

(2) Manufacture of Device

A glass substrate thinly coated with indium tin oxide (ITO) to have a thickness of 1,500 Å was put into distilled water in which a detergent was dissolved, and ultrasonically washed. In this case, a product manufactured by the Fischer Co., was used as the detergent, and distilled water twice filtered using a filter manufactured by Millipore Co., was used as the distilled water. After the ITO was washed for 30 minutes, ultrasonic washing was conducted twice repeatedly using distilled water for 10 minutes. After the washing with distilled water was completed, the substrate was ultrasonically washed with isopropyl alcohol and acetone solvents, and dried, and then the substrate was cleaned for 5 minutes, and then dried.

Immediately before the device was manufactured, the washed and patterned ITO was treated with UV ozone for 10 minutes. After ozone treatment, an aqueous dispersion of HIL was spin-coated on the ITO surface and the solvent was removed through heat treatment, thereby forming a hole injection layer having a thickness of about 40 nm. A toluene solution in which 1.5 wt % of Polymer 1 prepared in Synthesis Example 2 was dissolved was spin-coated on the hole injection layer formed above and the solvent was removed through heat treatment, thereby forming a hole transport layer having a thickness of about 100 nm. A methylbenzoate solution in which a host and a dopant (host:dopant=93:7(wt %)) were dissolved at a concentration of 2.0 wt % was spin-coated on the hole transport layer, thereby forming a light emitting layer having a thickness of about 100 nm. Thereafter, that was transported to a vacuum deposition apparatus, and then BCP was vacuum-deposited on the light emitting layer to have a thickness of 35 nm, thereby forming an electron injection and transport layer. LiF and aluminum were sequentially deposited on the electron injection and transport layer to have a thickness of 1 nm and 100 nm, respectively, thereby forming a cathode.

The deposition rates of lithium fluoride and aluminum of the cathode were maintained at 0.3 Å/sec and 2 Å/sec, respectively, during the aforementioned procedure, and the degree of vacuum during the deposition was maintained at $2\times10^{-7}$ torr to $5\times10^{-6}$ torr.

Example 2

An organic light emitting device was manufactured in the same manner as in Example 1, except that Polymer 2 was used instead of Polymer 1 in Example 1.

Example 3

An organic light emitting device was manufactured in the same manner as in Example 1, except that Polymer 3 was used instead of Polymer 1 in Example 1.

Example 4

An organic light emitting device was manufactured in the same manner as in Example 1, except that Polymer 4 was used instead of Polymer 1 in Example 1.

Example 5

An organic light emitting device was manufactured in the same manner as in Example 1, except that Polymer 5 was used instead of Polymer 1 in Example 1.

Comparative Example 1

An organic light emitting device was manufactured in the same manner as in Example 1, except that Comparative Compound C1 prepared in Comparative Synthesis Example 1 was used instead of Polymer 1 in Example 1.

The results of measuring the performances of the organic light emitting devices manufactured in Examples 1 to 5 and Comparative Example 1 at a current density of 10 $mA/cm^2$ are shown in the following Table 2.

TABLE 2

| | Volt | J ($mA/cm^2$) | Cd/A | lm/W | QE (%) | $Cd/m^2$ | CIEx | CIEy | CE/CIEy |
|---|---|---|---|---|---|---|---|---|---|
| Comparative Example 1 | 7.81 | 10.0 | 1.21 | 0.49 | 1.41 | 121.05 | 0.150 | 0.107 | 11.3 |
| Example 1 | 5.05 | 10.0 | 2.88 | 1.79 | 3.74 | 287.57 | 0.146 | 0.091 | 31.7 |
| Example 2 | 5.20 | 10.0 | 2.89 | 1.74 | 3.80 | 288.78 | 0.146 | 0.089 | 32.45 |
| Example 3 | 5.16 | 10.0 | 2.79 | 1.70 | 3.59 | 279.13 | 0.146 | 0.092 | 30.40 |
| Example 4 | 5.16 | 10.0 | 2.86 | 1.74 | 3.81 | 285.80 | 0.146 | 0.088 | 32.64 |
| Example 5 | 5.13 | 10.0 | 2.85 | 1.75 | 3.85 | 285.34 | 0.146 | 0.086 | 33.11 |

In Table 2, unless otherwise stated, the measured values are those at 1000 nits, V is a driving voltage (in volt units) at 10 $mA/cm^2$, QE is an external quantum efficiency, cd/A (CE) is a current efficiency, lm/W is a light source efficiency, and CIEx and CIEy are the x and y coordinates according to the C.I.E chromaticity diagram (Commission Internation-alede L'Eclairage, 1931).

In Table 2, it can be confirmed that Examples 1 to 5 have lower driving voltage and improved efficiency compared to those of Comparative Example 1. Through this, it can be confirmed that the performance is improved when the compound in which F is introduced into the core is applied (Examples 1 to 5) compared to when the compound into which F is not introduced is applied (Comparative Example 1). This is because the introduction of F shows improved charge mobility compared to the comparative compound.

Example 6

An organic light emitting device was manufactured in the same manner as in Example 1, except that a light emitting layer was formed by using a quantum dot on the hole transport layer in Example 1. It was confirmed that the organic light emitting device was driven by driving the manufactured organic light emitting device at a current density of 10 $mA/cm^2$.

The invention claimed is:

1. A polymer represented by Chemical Formula 1:

$$E1\text{-}[A]_a\text{—}[B]_b\text{—}[C]_c\text{-}E2 \qquad \text{[Chemical Formula 1]}$$

in Chemical Formula 1,

A is represented by Chemical Formula 2-1,

B is represented by Chemical Formula 3,

C is a substituted or unsubstituted arylene group; a substituted or unsubstituted divalent heterocyclic group;

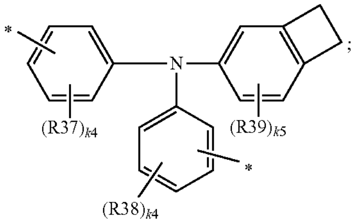

; or

-continued

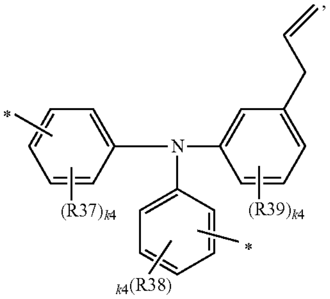

,

R37 to R39 are the same as or different from each other, and are each independently deuterium; a substituted or unsubstituted alkyl group; a substituted or unsubstituted aryl group; or a cross-linkable group, k4 is an integer from 0 to 4, k5 is an integer from 0 to 3, when k4 and k5 are each 2 or higher, each occurrence of R37 to R39 is the same as or different from each other, respectively, and

* is a part that bonds to at least one of E1, A, B, C, or E2,

E1 and E2 are the same as or different from each other, and are each independently hydrogen; deuterium; a substituted or unsubstituted alkyl group; a substituted or unsubstituted silyl group; a substituted or unsubstituted aryl group; a substituted or unsubstituted arylamine group; a substituted or unsubstituted siloxane group; a cross-linkable group; or a combination thereof, a, b, and c are each a mole fraction, a is a real number of $0<a\leq 1$, b is a real number of $0<b<1$, c is a real number of $0\leq c<1$, and $a+b+c=1$,

[Chemical Formula 2-1]

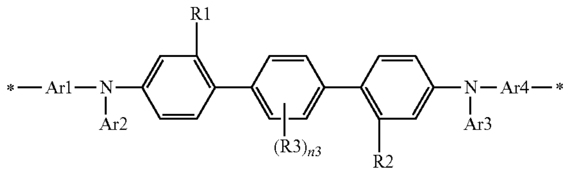

in Chemical Formula 2-1,

Ar2 and Ar3 are the same as or different from each other, and are each independently an aryl group unsubstituted or substituted with an alkyl group, Ar1 and Ar4 are the same as or different from each other, and are each independently an arylene group, R1 and R2 are each a F, R3 is a hexyl group, n3 is 2, and

* is a part that bonds to at least one of E1, A, B, C, or E2,

[Chemical Formula 3]

$$Z-[Y-*]_m$$

in Chemical Formula 3, m is an integer of 3 or 4, when m is 3, Z is CRa; SiRa; N; or a substituted or unsubstituted trivalent aryl group, when m is 4, Z is C; Si; or a substituted or unsubstituted tetravalent aryl group, Ra is hydrogen; a substituted or unsubstituted alkyl group; or a substituted or unsubstituted aryl group, Y is a direct bond; a substituted or unsubstituted alkylene group; or a substituted or unsubstituted arylene group, when Y is a direct bond; or a substituted or unsubstituted alkylene group, Z is a substituted or unsubstituted trivalent or tetravalent aryl group, and

* is a part that bonds to at least one of E1, A, B, C, or E2.

2. The polymer of claim 1, wherein E1 and E2 are the same as or different from each other, and are each independently a substituted or unsubstituted alkyl group; a substituted or unsubstituted aryl group; a cross-linkable group; or a combination thereof.

3. A polymer comprising a unit represented by Chemical Formula 2-1 and an end group represented by Chemical Formula 5:

[Chemical Formula 2-1]

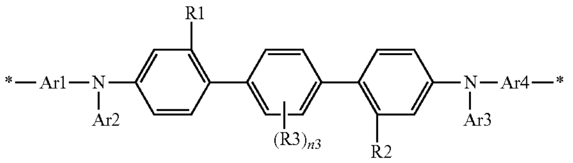

[Chemical Formula 5]

$$*-[E]$$

in Chemical Formulae 2-1 and 5,

Ar2 and Ar3 are the same as or different from each other, and are each independently an aryl group unsubstituted or substituted with an alkyl group, Ar1 and Ar4 are the same as or different from each other, and are each independently an arylene group, R1 and R2 are each a F, R3 is a hexyl group, n3 is 2, E is hydrogen; deuterium; a substituted or unsubstituted alkyl group; a substituted or unsubstituted silyl group; a substituted or unsubstituted aryl group; a substituted or unsubstituted arylamine group; a substituted or unsubstituted siloxane group; a cross-linkable group; or a combination thereof, and

* is an attachment point in the polymer.

4. The polymer of claim 3, further comprising a unit represented by Chemical Formula 3:

[Chemical Formula 3]

$$Z-[Y-*]_m$$

in Chemical Formula 3, m is an integer of 3 or 4, when m is 3, Z is CRa; SiRa; N; or a substituted or unsubstituted trivalent aryl group, when m is 4, Z is C; Si; or a substituted or unsubstituted tetravalent aryl group, Ra is hydrogen; a substituted or unsubstituted alkyl group; or a substituted or unsubstituted aryl group, Y is a direct bond; a substituted or unsubstituted alkylene group; or a substituted or unsubstituted arylene group, when Y is a direct bond; or a substituted or unsubstituted alkylene group, Z is a substituted or unsubstituted trivalent or tetravalent aryl group, and

* is an attachment point in the polymer.

5. The polymer of claim 3, further comprising a unit represented by Chemical Formula 4:

[Chemical Formula 4]

$$*-[C]-*$$

in Chemical Formula 4,

C is a substituted or unsubstituted arylene group; a substituted or unsubstituted divalent heterocyclic group;

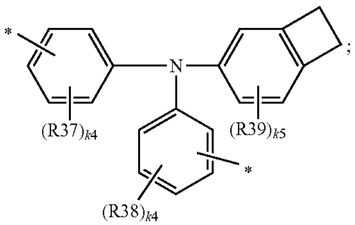

; or

-continued

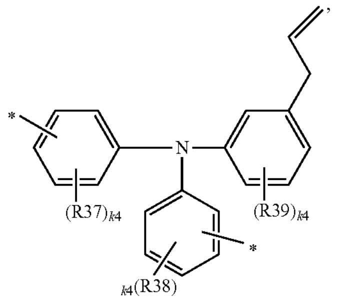

R37 to R39 are the same as or different from each other, and are each independently deuterium; a substituted or unsubstituted alkyl group; a substituted or unsubstituted aryl group; or a cross-linkable group, k4 is an integer from 0 to 4, k5 is an integer from 0 to 3, when k4 and k5 are each 2 or higher, each occurrence of R37 to R39 is the same as or different from each other, respectively, and

* is an attachment point in the polymer.

6. The polymer of claim 1, wherein Chemical Formula 3 is represented by any one of Chemical Formulae 3-1 to 3-4:

[Chemical Formula 3-1]

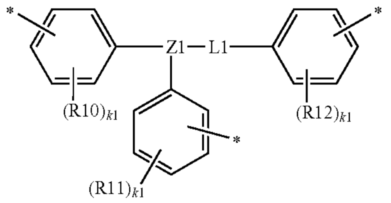

[Chemical Formula 3-2]

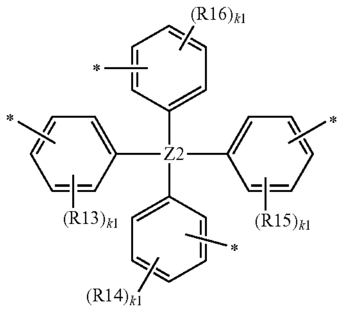

[Chemical Formula 3-3]

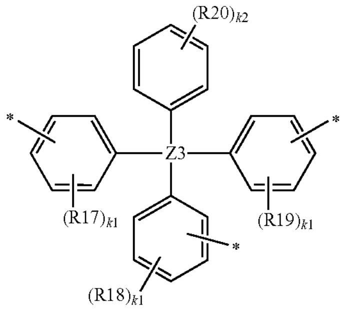

-continued

[Chemical Formula 3-4]

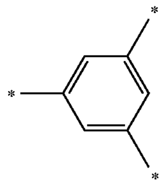

in Chemical Formulae 3-1 to 3-4,

Z1 is CRa; SiRa; N; or a substituted or unsubstituted trivalent aryl group,

Z2 and Z3 are the same as or different from each other, and are each independently C; Si; or a substituted or unsubstituted tetravalent aryl group, L1 is a direct bond; or a substituted or unsubstituted arylene group, Ra is hydrogen; a substituted or unsubstituted alkyl group; or a substituted or unsubstituted aryl group, R10 to R20 are the same as or different from each other, and are each independently hydrogen; deuterium; a halogen group; a cyano group; an alkoxy group; an aryloxy group; a fluoroalkoxy group; a siloxane group; a substituted or unsubstituted amine group; a substituted or unsubstituted alkyl group; a substituted or unsubstituted aryl group; a substituted or unsubstituted heterocyclic group; or a cross-linkable group, and adjacent groups may be bonded to each other to form a ring, k1 is an integer from 1 to 4, k2 is an integer from 1 to 5, when k1 is 2 or higher, each occurrence of R10 to R19 is the same as or different from each other, respectively, when k2 is 2 or higher, each occurrence of R20 is the same as or different from each other, and

* is a part that bonds to at least one of E1, A, B, C, or E2.

7. The polymer of claim 1, which has a weight average molecular weight of 70,000 g/mol to 2,000,000 g/mol.

8. The polymer of claim 1, wherein Chemical Formula 3 is represented by any one of the following structures:

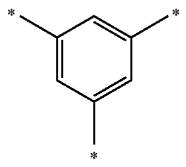

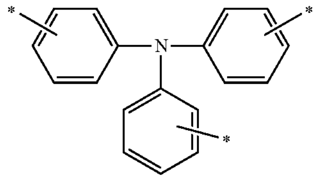

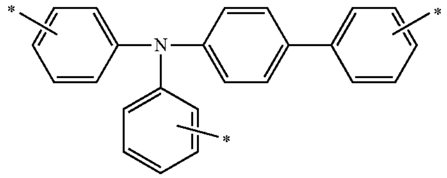

-continued

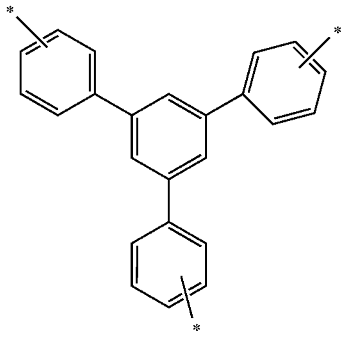

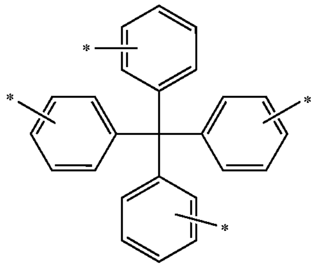

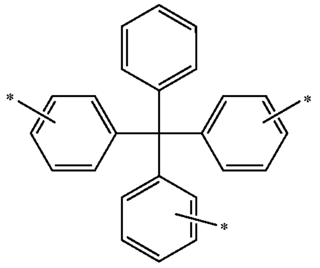

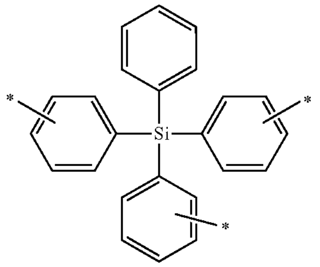

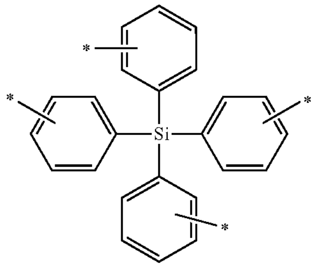

* is a part that bonds to at least one of E1, A, B, C, or E2.

9. The polymer of claim 1, wherein the C is represented by any one of the following structures:

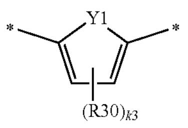

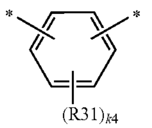

-continued

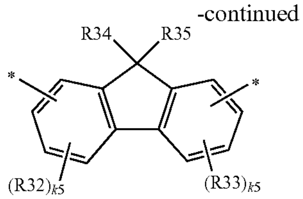

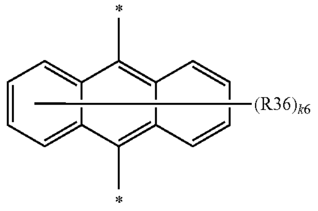

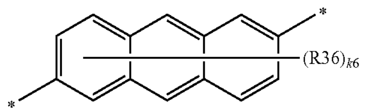

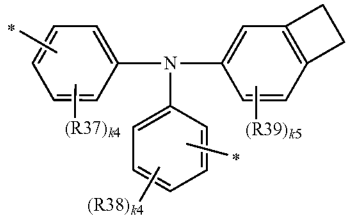

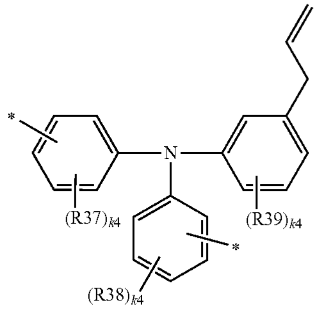

wherein:

Y1 is S, O, or NR100,

R30 to R33 and R36 to R39 are the same as or different from each other, and are each independently deuterium; a substituted or unsubstituted alkyl group; a substituted or unsubstituted aryl group; or a cross-linkable group, k3 is an integer of 0 to 2, k4 is an integer from 0 to 4, k5 is an integer from 0 to 3, k6 is an integer from 0 to 8, when k3 to k6 are each 2 or higher, each occurrence of R30 to R33 and R36 to R39 is the same as or different from each other, respectively, R34, R35 and R100 are the same as or different from each other, and are each independently hydrogen; deuterium; a substituted or unsubstituted alkyl group; a substituted or unsubstituted aryl group; or a cross-linkable group, and

* is a part that bonds to at least one of E1, A, B, C, or E2.

10. The polymer of claim 1, wherein E1 and E2 are each any one of the following structures:

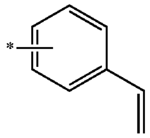
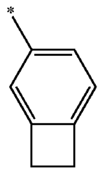
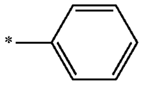
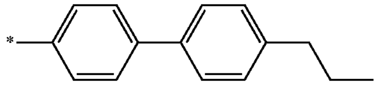
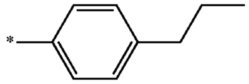
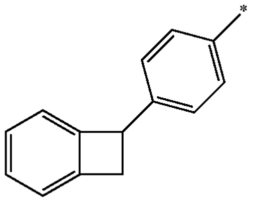
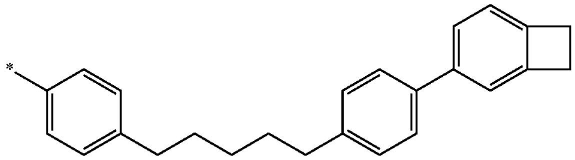
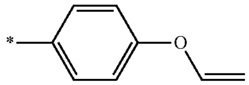
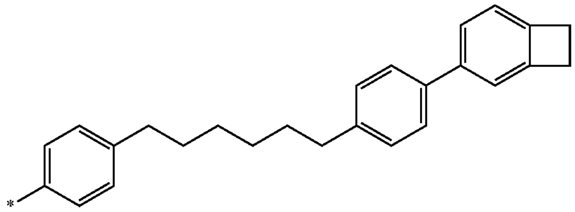
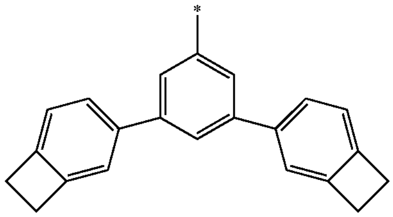

-continued

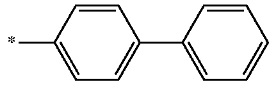
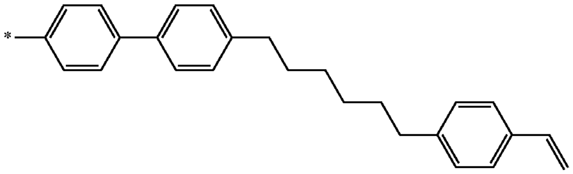
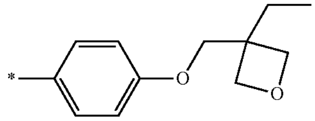
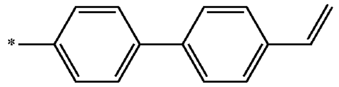

* is a part that bonds to A, B or C, respectively.

11. The polymer of claim 1, wherein a is a real number from 0.4 to 1, b is a real number from 0 to 0.4, and c is a real number from 0 to 0.2.

12. An organic light emitting device comprising:

a first electrode;

a second electrode provided to face the first electrode; and an organic material layer having one or more layers, which includes a light emitting layer provided between the first electrode and the second electrode, wherein one or more layers of the organic material layer comprise the polymer of claim 1.

13. The organic light emitting device of claim 12, wherein the organic material layer comprising the polymer is a hole injection layer, a hole transport layer, or a layer which simultaneously injects and transports holes.

14. The organic light emitting device of claim 12, wherein the light emitting layer comprises an organic compound.

15. The organic light emitting device of claim 12, wherein the light emitting layer comprises a quantum dot.

* * * * *